(12) United States Patent
Canty et al.

(10) Patent No.: US 12,249,618 B2
(45) Date of Patent: Mar. 11, 2025

(54) SHAPED METAL EDGE FOR GALVANIC OR CAPACITIVE ISOLATOR

(71) Applicant: Analog Devices International Unlimited Company, Limerick (IE)

(72) Inventors: Matthew Thomas Canty, Nenagh (IE); Sombel Diaham, Villeneuve les Bouloc (FR); Jan Kubik, Limerick (IE); Paul Martin Lambkin, Carrigaline (IE); Baoxing Chen, Westford, MA (US); Yi Yuan, Malden, MA (US); John G. Shanahan, Limerick (IE)

(73) Assignee: Analog Devices International Unlimited Company, Limerick (IE)

( * ) Notice: Subject to any disclaimer, the term of this patent is extended or adjusted under 35 U.S.C. 154(b) by 365 days.

(21) Appl. No.: 17/683,154

(22) Filed: Feb. 28, 2022

(65) Prior Publication Data
US 2023/0275118 A1  Aug. 31, 2023

(51) Int. Cl.
  *H01F 27/28* (2006.01)
  *H01F 27/34* (2006.01)
  *H01F 41/04* (2006.01)
  *H01L 49/02* (2006.01)

(52) U.S. Cl.
  CPC ......... *H01L 28/10* (2013.01); *H01F 27/2804* (2013.01); *H01F 27/34* (2013.01); *H01F 41/043* (2013.01); *H01F 2027/2809* (2013.01)

(58) Field of Classification Search
  CPC ..... H01L 28/10; H01F 27/2804; H01F 27/34; H01F 41/043
  See application file for complete search history.

(56) References Cited

U.S. PATENT DOCUMENTS

| 4,334,973 A | 6/1982 | Carlson et al. |
| 4,687,552 A | 8/1987 | Early et al. |
| 5,145,571 A | 9/1992 | Lane et al. |
| 5,459,001 A | 10/1995 | Estes et al. |
| 5,755,947 A | 5/1998 | McElhanon et al. |
| 5,789,306 A | 8/1998 | Roberts et al. |
| 6,207,553 B1 | 3/2001 | Buynoski et al. |
| 6,413,845 B1 | 7/2002 | Izumi et al. |
| 7,465,654 B2 | 12/2008 | Chou et al. |
| 8,410,575 B2 | 4/2013 | Kerber et al. |

(Continued)

FOREIGN PATENT DOCUMENTS

| CN | 103972118 | 8/2014 |
| DE | 10 2004 023897 A1 | 12/2005 |

(Continued)

OTHER PUBLICATIONS

Office Action dated Mar. 24, 2020 in European Patent Application No. 18204206.9; 5 pages.

(Continued)

*Primary Examiner* — Nathan W Ha
(74) *Attorney, Agent, or Firm* — KNOBBE, MARTENS, OLSON & BEAR, LP

(57) ABSTRACT

The disclosed technology generally relates to lithographically defined conductive lines for integrated circuit devices formed by plating, and more particularly to conductive lines shaped to reduce the magnitude of electric field in the electric field distributions around conductive lines of integrated and monolithic transformers and isolators.

18 Claims, 38 Drawing Sheets

(56) References Cited

U.S. PATENT DOCUMENTS

| | | | |
|---|---|---|---|
| 8,492,263 B2 | 7/2013 | Wang et al. | |
| 8,786,393 B1* | 7/2014 | Chen | H01F 27/2804 336/200 |
| 8,885,302 B1* | 11/2014 | David | G01R 33/0052 360/327 |
| 9,583,434 B2 | 2/2017 | Kao et al. | |
| 9,640,602 B2 | 5/2017 | Weyers et al. | |
| 9,754,886 B2 | 9/2017 | Boyanov et al. | |
| 9,780,161 B2 | 10/2017 | Menath et al. | |
| 10,330,741 B2* | 6/2019 | Isler | G01R 33/098 |
| 10,699,948 B2 | 6/2020 | Kubik et al. | |
| 10,714,410 B1 | 7/2020 | Wu et al. | |
| 10,726,989 B2 | 7/2020 | Furiya et al. | |
| 11,049,639 B2* | 6/2021 | Richardson | H01F 19/04 |
| 11,342,519 B2* | 5/2022 | Bu | H10K 59/124 |
| 2003/0092274 A1 | 5/2003 | Brintzinger | |
| 2003/0227096 A1 | 12/2003 | Takaike | |
| 2008/0003760 A1 | 1/2008 | Gardner et al. | |
| 2008/0179963 A1* | 7/2008 | Fouquet | H01F 19/08 336/200 |
| 2008/0258299 A1 | 10/2008 | Kang et al. | |
| 2008/0278275 A1* | 11/2008 | Fouquet | H01F 27/2804 336/200 |
| 2008/0284014 A1 | 11/2008 | Lee et al. | |
| 2009/0153283 A1* | 6/2009 | Fouquet | H01F 27/2804 336/200 |
| 2009/0160049 A1 | 6/2009 | Shinkai et al. | |
| 2010/0148911 A1* | 6/2010 | Fouquet | H01F 27/2804 336/200 |
| 2010/0176660 A1* | 7/2010 | Fouquet | H01L 25/16 307/109 |
| 2012/0032190 A1 | 2/2012 | Takagi | |
| 2012/0319237 A1 | 12/2012 | Cooney et al. | |
| 2013/0027170 A1* | 1/2013 | Chen | H01F 5/06 336/200 |
| 2013/0241543 A1* | 9/2013 | Stenson | G01R 33/096 324/252 |
| 2013/0277797 A1 | 10/2013 | Menath et al. | |
| 2013/0280879 A1 | 10/2013 | Stecher et al. | |
| 2014/0218153 A1* | 8/2014 | Chen | H01F 27/2804 336/200 |
| 2015/0303159 A1 | 10/2015 | Lin | |
| 2016/0005530 A1* | 1/2016 | Kubík | H01F 17/0033 336/182 |
| 2016/0079193 A1 | 3/2016 | Arvin et al. | |
| 2017/0117602 A1* | 4/2017 | McLoughlin | H01P 1/36 |
| 2018/0006352 A1 | 1/2018 | Issakov et al. | |
| 2018/0061569 A1* | 3/2018 | Kubík | H01F 41/0206 |
| 2018/0358166 A1* | 12/2018 | Kubik | H01F 27/263 |
| 2019/0252316 A1* | 8/2019 | Zhang | H01F 17/0013 |
| 2020/0135388 A1* | 4/2020 | Chang | H01F 41/04 |
| 2020/0194168 A1 | 6/2020 | Zou et al. | |
| 2020/0328114 A1 | 10/2020 | Kubik et al. | |
| 2021/0035856 A1 | 2/2021 | Tsai et al. | |
| 2021/0202360 A1* | 7/2021 | Hsu | H01L 25/18 |
| 2021/0296265 A1 | 9/2021 | Fuji et al. | |
| 2022/0246552 A1* | 8/2022 | Yun | H01F 17/0013 |
| 2022/0285080 A1* | 9/2022 | Kim | H04B 1/40 |
| 2022/0320019 A1* | 10/2022 | Chang | H01L 23/145 |
| 2022/0328237 A1* | 10/2022 | Li | H01F 27/29 |
| 2022/0376034 A1* | 11/2022 | Chen | H01L 28/10 |
| 2022/0384560 A1* | 12/2022 | Kamgaing | H01F 5/003 |
| 2022/0415829 A1* | 12/2022 | Blecic | H01L 21/4857 |
| 2023/0090759 A1* | 3/2023 | Pietambaram | H05K 1/165 257/678 |
| 2023/0101378 A1* | 3/2023 | Baumgartner | H01L 28/10 257/379 |
| 2023/0223362 A1* | 7/2023 | Suraj Prakash | H01F 19/04 257/531 |

FOREIGN PATENT DOCUMENTS

| | | |
|---|---|---|
| EP | 3 336 889 A1 | 6/2018 |
| EP | 3 483 308 A1 | 5/2019 |
| JP | 2011-054672 A | 3/2011 |
| KR | 10-0769042 | 10/2007 |
| KR | 2008-0109281 A | 12/2008 |
| KR | 10-1643333 | 7/2016 |
| KR | 2019-0003920 A | 1/2019 |

OTHER PUBLICATIONS

Extended European Search Report dated Apr. 15, 2019 in European Patent Application No. 18 20 4206; 9 pages.

Green, Todd A., "Gold Electrodeposition for Microelectronic, Optoelectronic and Microsystem Applications", 2007, pp. 105-114, vol. 40, Iss. 2, Newcastle, UK.

Hayden et al., "Helicon Plasma Source for Ionized Physical Vapor Deposition", Surface and Coatings Technology, 1999, pp. 401-404, Urbana, IL, USA.

Ting et al., Advances in copper metallization technology, Solid-State and Integrated-Circuit Technology, 2001, pp. 1-3, San Jose, CA.

Office Action dated Sep. 23, 2022 in Chinese Patent Application No. 201811342215.6; 11 pages.

Extended European Search Report dated Jul. 14, 2023 in European Patent Application No. EP 23154345.5; 8 pages.

* cited by examiner

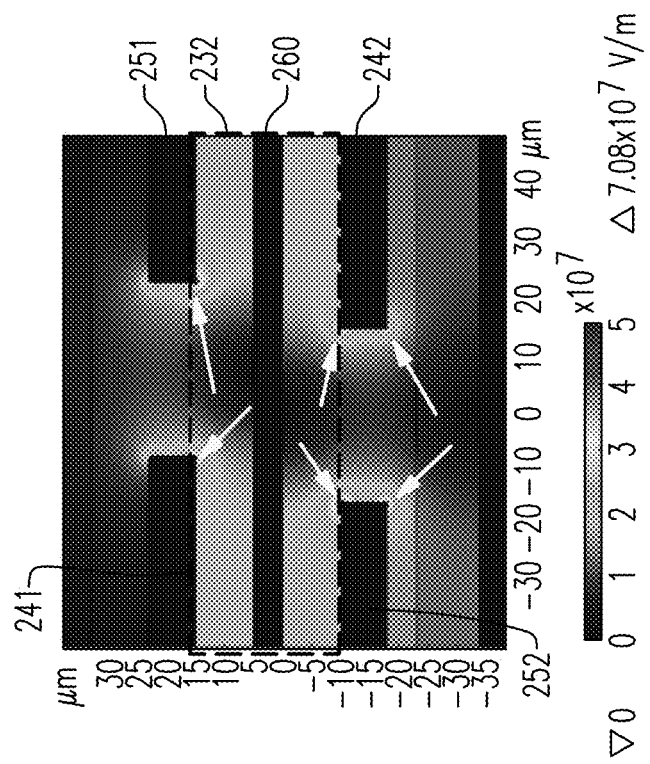
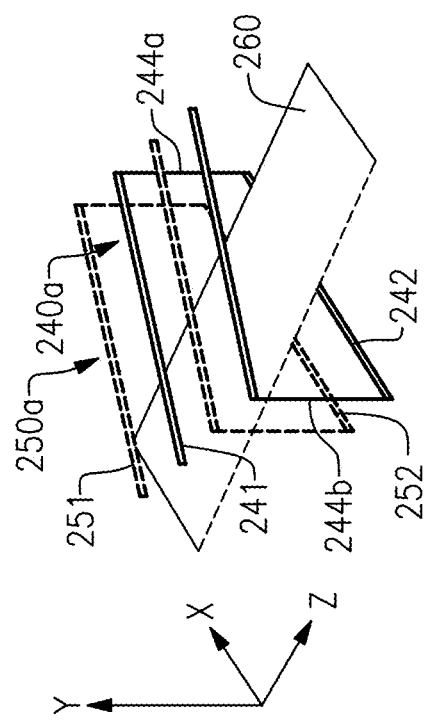
FIG. 2D
FIG. 2C

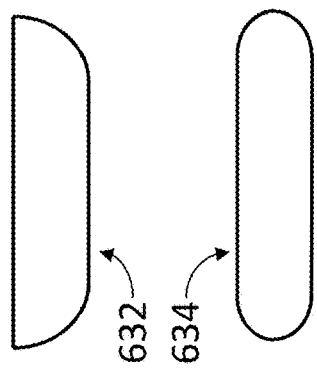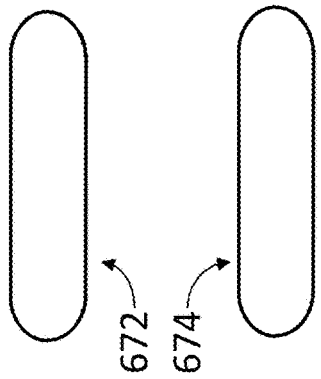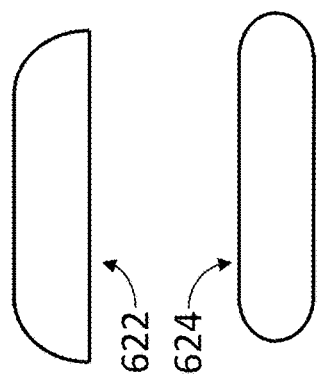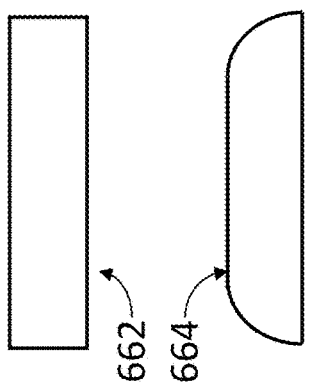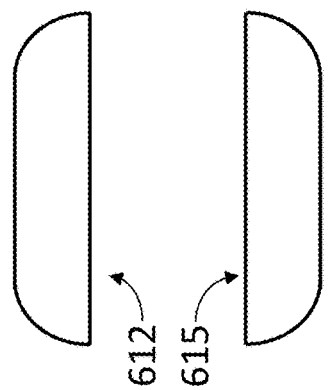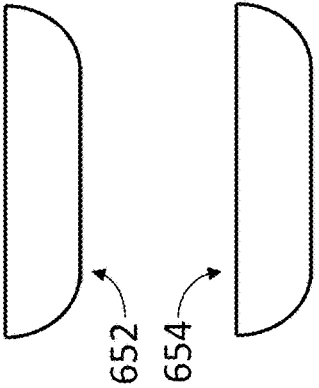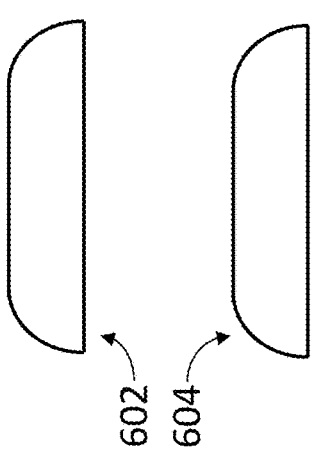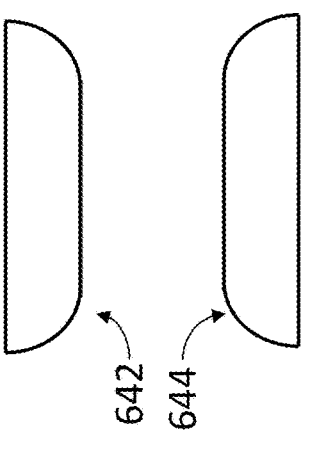

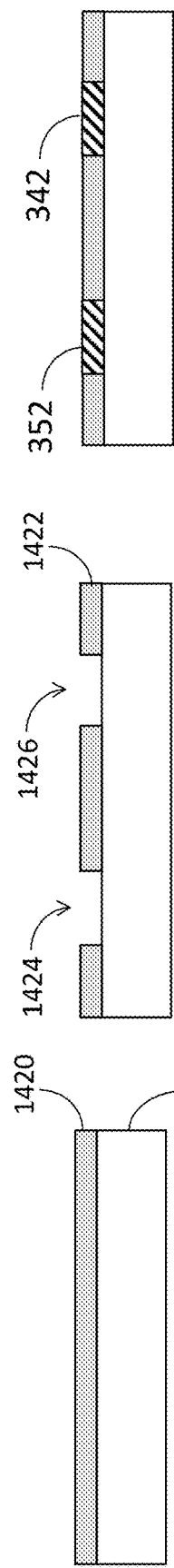
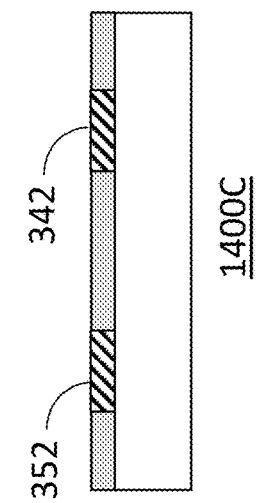
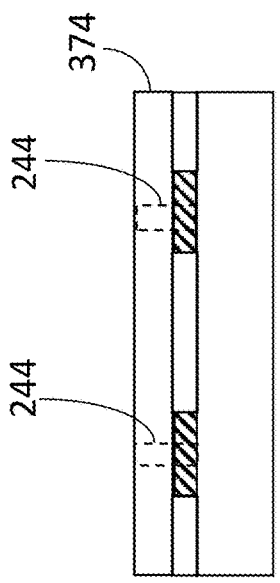
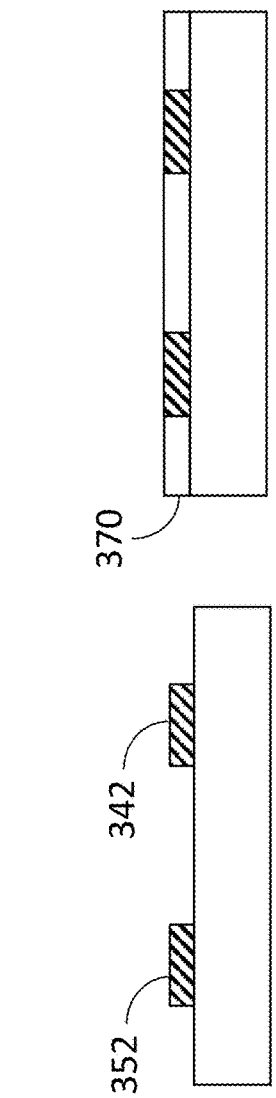
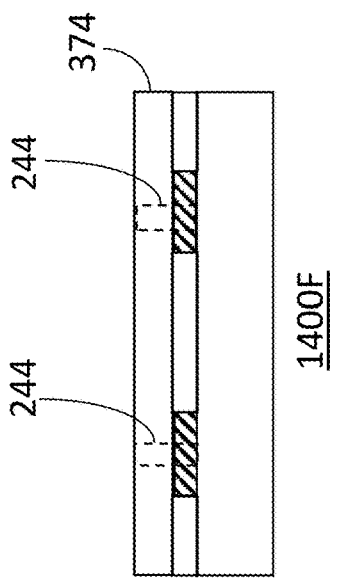

1400G

1400H

1400I

1400J

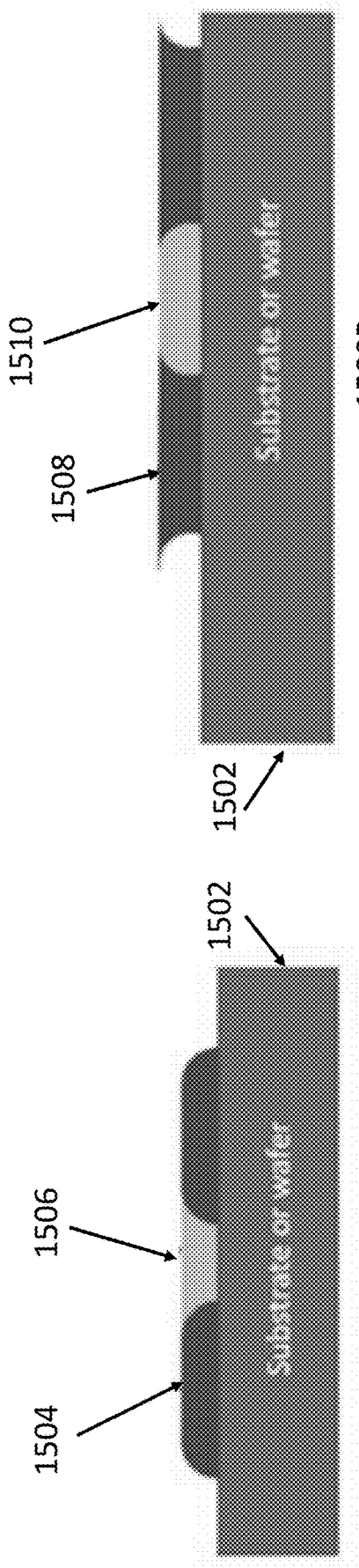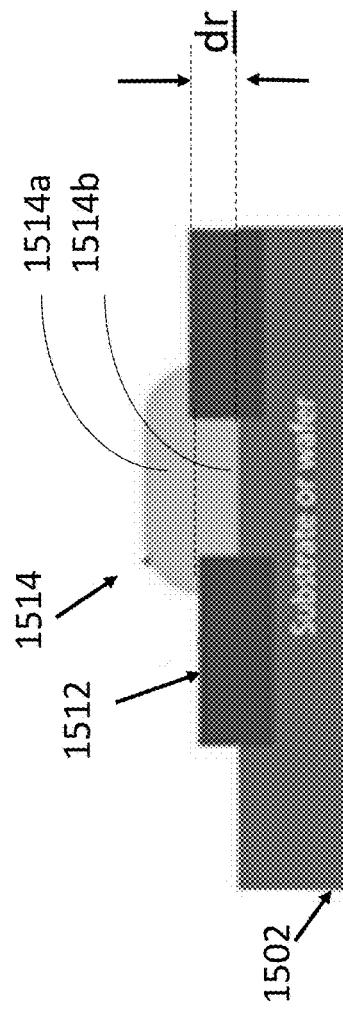
FIG.15A 1500A
FIG.15B 1500B
FIG.15C 1500C

1500E

1500D

SHAPED METAL EDGE FOR GALVANIC OR CAPACITIVE ISOLATOR

FIELD OF THE DISCLOSURE

The disclosed technology generally relates to conductive lines for integrated circuit devices, and more particularly to conductive lines used in integrated transformers and isolators.

BACKGROUND

Conductive line and metallization structures constitute an integral part of many electronic devices and components. Some conductive lines serve as wiring that electrically interconnects various active devices, such as transistors, while some other metallization structures serve as passive or active devices themselves, such as inductors, resistors or transformers. Some conductive lines can be formed as an integral part of an integrated circuit (IC) device. For example, conductive lines may be used to form integrated inductors and transformers for various applications such as electric isolation, voltage or current conversion, and other applications. In some cases, an integrated circuit can be a monolithic circuit monolithically fabricated on a substrate. Monolithic fabrication allows integration of a large number of electronic devices electrically interconnected by conductive lines, in a small volume or area of a chip or a substrate.

SUMMARY OF SOME ASPECTS OF THE DISCLOSURE

In one aspect described herein, an integrated circuit device comprises a substrate having a main surface, a core layer disposed over the substrate; and a lithographically patterned primary coil where the primary coil comprises one or more windings wound around a winding axis parallel to the main surface. Each of the windings comprises a top conductive line arranged over the core layer, the top conductive line having a first thickness along a vertical axis perpendicular to the main surface, where a cross-section of the top conductive line in a plane parallel to the winding axis and perpendicular to the main surface comprises a rounded convex portion of a side surface of the top conductive line, where the rounded convex portion has a radius of curvature larger than 1 micron. Each of the windings further comprises a bottom conductive line arranged under the core layer, the bottom conductive line having a second thickness along the vertical axis, where a cross-section of the bottom conductive line in the plane comprises a rounded convex portion of a side surface of the bottom conductive line, the rounded convex portion having a radius of curvature larger than 1 micron. Each of the windings further comprises a first conductive via extended along the vertical axis electrically connecting the top and bottom conductive lines, and a second conductive via extended along the vertical axis electrically connecting one but not the other of the top and bottom conductive lines to a conductive line of another winding of the primary coil.

In another aspect described herein, an integrated circuit device comprises a substrate having a main surface, a core layer disposed over the substrate, and a lithographically patterned primary coil, where the primary coil comprises one or more windings wound around a winding axis parallel to the main surface. Each of the windings comprises: a top conductive line arranged over the core layer, where an acute angle between a negatively sloped side surface and the top surface of the top conductive line is less than 75 degrees, a bottom conductive line arranged under the core layer, where an acute angle between a positively sloped side surface and the bottom surface of the bottom conductive line is less than 75 degrees. Each of the windings comprises a first conductive via extended along a vertical axis perpendicular to the main surface electrically connecting the top and the bottom conductive lines, and a second conductive via extended along the vertical axis electrically connecting the top or the bottom conductive lines to a conductive line of another winding of the primary coil.

In another aspect described herein, an integrated circuit device comprises a substrate having a main surface, a core layer disposed over the substrate, and a lithographically patterned primary coil, the primary coil comprising one or more windings wound around a winding axis parallel to the main surface. Each of the windings comprises a top conductive line arranged over the core layer, where a side surface of the top conductive line comprises a stepped portion having one or more side surface sections, and where individual ones of the side surface sections comprise a flat surface substantially perpendicular to the main surface. Each of the windings further comprises a bottom conductive line arranged under the core layer, a first conductive via extended along a vertical axis perpendicular to the main surface and electrically connecting the top and bottom conductive lines, and a second conductive via extended along the vertical axis and electrically connecting one but not the other of the top and bottom conductive lines to a conductive line of another winding of the primary coil.

In another aspect described herein, an integrated circuit device comprises a semiconductor substrate having a main surface, a primary coil and a secondary coil each wound around a winding axis parallel to the main surface, where the windings of the primary coil and the secondary coil are interlaced with each other such that the windings of the primary coil alternate with the windings of the secondary coil along the winding axis. Each of the windings of the primary coil and the secondary coil comprises lithographically patterned and electroplated top and bottom conductive lines connected by a vertical conductive via connecting the top and bottom conductive lines, where laterally adjacent ones of the top conductive lines of the primary coil and the secondary coil have side surfaces facing each other, and where laterally adjacent ones of the bottom conductive lines of the primary coil and the secondary coil have side surfaces facing each other, where at least some of the side surfaces comprise an electric field reducing structure selected from the group consisting of a rounded side surface, a sloped side surface and stepped side surface.

In another aspect described herein, a method of fabricating a conductive line comprises forming a masking layer on a top surface of the substrate, the masking layer having a thickness along a vertical direction perpendicular to the top surface of the substrate, forming an opening through the masking layer exposing a region on the top surface of the substrate, where at least a portion of a sidewall of the opening comprises a concave curved surface having a radius of curvature larger than 1 micron, and electro plating a metal on the exposed region of top surface of the substrate.

In another aspect described herein, a method of fabricating a conductive line comprises forming a first masking layer on a top surface of the substrate where the first masking layer has a first thickness along a vertical direction perpendicular to the top surface of the substrate, forming a first opening through the first masking layer to expose a region on the top surface of the substrate, where the opening has a width along a lateral direction parallel to the main surface of the substrate, and plating a first metal on the first masking layer and the exposed region of the top surface of the substrate. The method further comprises forming a second masking layer on the first masking layer, where the second masking layer has a second thickness along a vertical direction perpendicular to the main surface of the substrate; forming a second opening through the second masking layer to expose a region on the first metal and the first masking layer, the second opening having an maximum width along a lateral direction parallel to the main surface of the substrate, where at least one sidewall of the second opening comprises a concave curved surface having a radius of curvature larger 1 micron, and plating a second metal on the second masking layer, and the exposed region of the first metal and the first masking layer.

BRIEF DESCRIPTION OF THE DRAWINGS

FIG. 2C illustrates the arrangement of a single turn of the primary coil and a single turn of the secondary coil of the transformer shown in FIG. 2A wound around a core element.

FIG. 2D illustrates simulated electric field distribution over a cross-sectional plane of the transformer shown in FIG. 2B.

FIGS. 6A-6H illustrate cross-sectional views of examples of top and bottom sections of conductive lines of an integrated transformer or coil having a curved side surface. Cross-sectional plane is perpendicular to the main surface of the core layer and parallel to the winding axis (z-axis) of the transformer

FIGS. 14A-14J illustrate intermediate structures at various fabrication steps of a transformer having laterally isolated primary and secondary coils wound around a winding axis parallel to a main surface of a core layer (e.g., a transformer similar to that shown in FIG. 2B).

FIG. 15A illustrates an intermediate structure including an example conductive line having a curved concave side surface formed by electroplating in an opening formed in a photoresist layer.

FIG. 15B illustrates an intermediate structure including an example conductive line having a curved convex side surface formed by electroplating in an opening formed in a photoresist layer.

FIG. 15C illustrates an intermediate structure including an example conductive line having a curved and stepped side surface formed by electroplating in an opening formed in a photoresist layer.

DETAILED DESCRIPTION

Figure 1B:
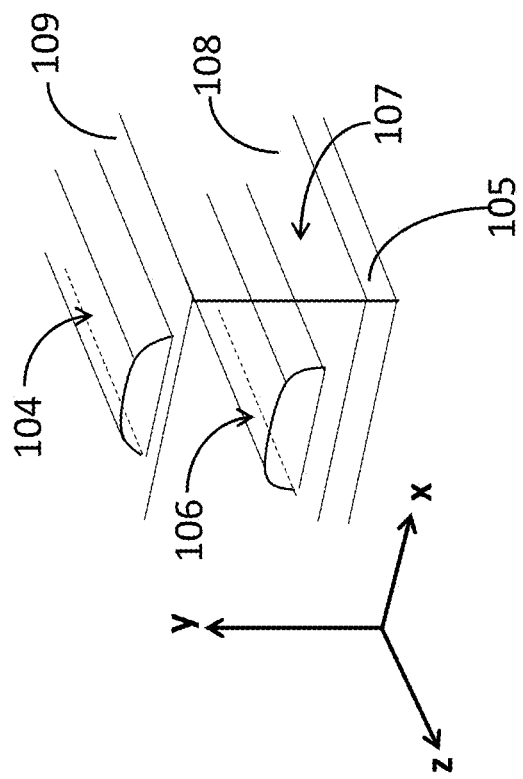
FIG. 1B schematically illustrates two conductive lines having curved surfaces disposed at two different vertical levels of an integrated circuit.

As integrated circuits are made smaller, the spacing between conductive lines that connect active electronic devices, and those that serve as passive or active devices themselves may also be reduced. Since for a given voltage applied between two conductive lines, the magnitude of the corresponding electric field increases inversely with the distance between them, the magnitude of the electric field generated in the vicinity of the conductive lines becomes larger as ICs become smaller and/or more devices are included in an IC. In some cases, an operating voltage of an IC or device include in the IC may become limited by onset of electric discharge between closely spaced conductive lines on the IC. Challenges associated with increasing the operating voltage of ICs include designing closely spaced conductive lines that support larger voltages before the onset of electric discharge between two conductive lines. Various structures and methods according to embodiments disclosed herein addresses these and other challenges associated with closely spaced conductive lines in an IC operating at higher voltages and/or generating smaller electric field fields at given a voltage difference with another device or conductive line.

The maximum operating voltage of some integrated circuits (e.g., monolithically fabricated integrated circuits) that include closely spaced conductive lines may be limited by the onset of electric discharge between two or more conductive lines. In these integrated circuits (IC), operating the circuit by a voltage above a threshold voltage may cause the electric field (E-field) in certain locations within the IC (e.g., near or between the conductive lines) to grow above a threshold E-field magnitude required to break down a medium (e.g., a dielectric medium or air) surrounding the conductive live lines and result in formation of an electric discharge (e.g., between the two conductive lines). The first break down in an IC is typically initiated at the first point (e.g., a point near a sharp corner) where the E-field exceeds a threshold E-field magnitude. As such, in some cases, the operating voltage of an IC (or an integrated device in an IC), may be limited by the maximum magnitude of the E-field in an E-field distribution formed by the voltage provided to the IC. In some cases, maximum magnitude of the E-field can be a global maximum in an E-field distribution.

The magnitude of the threshold electric field is determined by the electrical properties of the medium(s) in which the electric field distributes when a voltage is provided to the IC. For a given voltage difference between two conductive lines, the maximum E-field magnitude in an E-field distribution generated around the conductive lines depends at least partly on a shape of each conductive line (e.g., shape of the corners formed by different surfaces of the conductive line). As such, a threshold voltage required for formation of an electric discharge between conductive lines (e.g., in an IC), may be controlled by the electrical properties of dielectric material(s) surrounding the conductive lines, and the shape of the conductive lines.

In some cases, the maximum operating or working voltage of an IC may be increased by selecting dielectric materials that can tolerate high voltages before breaking down and causing the formation of electric discharge between the two conductive lines. In some such cases, tailoring the shape of a conductive line in the IC may further increase the operating or working voltage of the IC. In some other cases, where selection of the dielectric material is constrained by other the properties of the IC or device in an IC, tailoring the shape of a conductive line may increase the maximum operating voltage of an IC for given dielectric material surrounding the conductive lines or other devices near which the maximum E-field magnitude of a corresponding E-field distribution occurs. Given the small thickness of the conductive lines fabricated using conventional IC fabrication processes, shaping conductive metal lines can be a challenging task. The designs, and fabrication methods disclosed herein may be used to overcome this and other challenges. In particular, according to various embodiments, sidewall surfaces of lines, e.g., electroplated lines, may be lithographically defined to include an electric field reducing structure, which may include one or more of a rounded corner and/or curved side surface, a sloped side surface and a stepped side surface. Without limitation, the inventors have discovered that integrated galvanic and capacitive isolators and transformers can particularly benefit from tailoring the shape of conductive lines using lithographic and electroplating processes.

In some cases, the maximum electric field magnitude in an electric field distribution around a conductive occurs near the conductive corners or edges having small radii of curvature (ROC) also referred to therein as sharp edges. It will be appreciated that a sharp corner may be a corner naturally shaped during a conventional fabrication process due to, e.g., lithography and etch processes. In some cases, for example when the conductive line is formed by electroplating openings in a patterned dielectric layer, a naturally formed corner may be a sharp corner having an ROC of less than 0.8 microns, less than 0.5 microns, less than 0.2 microns or smaller. As described herein, a lithographically rounded structure (e.g., a rounded corner or a curved side surface) refers to a rounded structure that is rounded to have larger ROCs than those that occurring naturally.

In some implementations, the maximum operating or working voltage of an IC may be increased by tailoring the shape of a corner (e.g., a sharp corner) and/or a side surface of a conductive line. In some examples, a section of a conductive line may comprise a top surface, a bottom surface, and two side surfaces connecting the top and bottom surfaces, and corners formed between the top and bottom surfaces and the side surfaces. In some cases, the side surfaces formed by a conventional fabrication process can be substantially flat or nearly flat surfaces that are substantially perpendicular to the top and bottom surfaces. In some examples, such vertical side surfaces may form an acute angle with the bottom surface that is larger than 80 degrees.

In some cases, a side surface of the conductive line may comprise a curved side surface. In some cases, a conductive line having one or more curved side surfaces may have three or less corners (e.g., sharp corners). In some cases, a rounded corner may comprise a curved side surface. In some cases, the maximum E-field magnitude in an E-field distribution around a conductive line having curved surfaces can be smaller than the maximum E-field magnitude that may occur in conductive lines having flat vertical side surfaces. In some cases, the maximum E-field magnitude in an E-field distribution around a conductive line may be smaller for conductive lines having corners with larger ROCs.

According to various embodiments, a shape of a conductive line may be tailored to increase the radius of curvature of one or more corners or side surfaces of the conductive line, e.g., to be greater than a naturally occurring radius of curvature, in order to reduce the maximum E-field in an E-field distribution around the conductive line. In some examples, the radius of curvature of a corner may be designed to be larger than 1 micron, 2 microns, 3 microns, 4 microns, or 5 microns, or have a value in a range defined by any of these values.

In some cases, the radius of curvature (ROC) of a corner or a side surface of the conductive line may deigned or tailored to be close, equal, or larger than the thickness or a distance between the top and the bottom surface of the conductive line. In some examples, the tailored ROC of a corner or a side surface may be larger than 10%, 15%, 20%, 30%, 50%, 70%, 90%, or 100% of the thickness of the conductive line or any values larger or smaller than these values. In various examples, the tailored ROC can not be smaller than a grain size of the metal conductor. In some implementations, the tailored ROC corner or a side surface may be larger than 0.8 microns, 0.9 microns, 1 microns, 1.2 microns, 1.4 microns, 1.5 microns, 1.8 microns, 2 microns.

In some cases, the maximum E-field in an E-field distribution around a conductive line may be reduced by tailoring an angle between a side surface (e.g., flat side surface) and the top or bottom surface of the conductive line to provide a sloped surface. For example, the angle between a sloped side surface and the top or bottom surface may be less than 85 degrees, less than 60 degrees, less than 45 degrees, less than 30 degrees, or a value in a range defined by any of these values or smaller.

In some cases, the maximum E-field in an E-field distribution around a conductive line may be reduced by tailoring a side surface of the conductive line to provide a stepped side surface comprising one or more or several side surface sections. A surface of a side surface section can be a curved, flat or sloped surface. For example, a side surface of a conductive line may have two sections, one having a curved surface and the other a flat vertical surface. In some cases, a flat portion of a stepped side surface can be substantially perpendicular to the top and/or the bottom surface of the conductive line. In some examples, an angle (e.g., an acute angle) between the flat portion and the top and/or bottom surface can between 80 degrees and 90 degrees.

In various implementations, a shape (e.g., a cross-sectional shape) of a conductive line may be tailored to provide a combination of the features described above, including curved, stepped and sloped surfaces. For example, a conductive line may comprise a stepped side surface having a curved side surface section and/or a sloped side surface section. Other combinations may be used.

In some implementations, the shape of a conductive line may be designed or selected based at least in part a shape of another conductive line that contributes in formation of the E-field distribution to reduce a maximum E-field in the E-field distribution. In some such implementations, a shape of two conductive lines (e.g., vertically or laterally positioned with respect to each other) of a plurality of conductive lines may be tailored or designed based at least in part on the shapes and their relative positions.

Integrated galvanic and capacitive isolators and transformers are example of ICs that may benefit from increased operating voltage resulting from tailoring the shape of conductive lines. In some cases, these devices include a primary coil and a secondary coil that are coupled via magnetic field. In some cases, the maximum operating voltage of an integrated isolator or transformer may be limited by the maximum E-field generated between the corresponding primary and secondary coils during the operation of the device.

The primary and secondary coils of a transformer may comprise one or more conductive lines configured to support magnetic interaction between the primary and the secondary coils. In some cases, the transformer may further comprise a magnetic core to enhance the magnetic interaction between the primary and secondary coils.

In various implementations, the conductive lines of the primary and/or the secondary coils may be designed and fabricated to have a shape (e.g., a cross-section shape) similar to the shapes described above.

In some cases, the coils and transformers can be monolithic transformers or coils that are lithographically defined and are fabricated using monolithic fabrication techniques. The inventors have discovered that the conductive lines of these monolithic transformers may be fabricated and shaped by lithographically structuring and shaping a patterning layer such as a photoresist layer and plating (e.g., electroplating) a metal to conform to the structured photoresist layer. As described herein, this combined approach advantageously enables the fabrication of conductive lines having cross-sectional shapes tailored to reduce the magnitude of the E-field in an E-field distribution around the conductive lines.

In some implantations, fabricating conductive lines of an IC (e.g., a transformer) using electroplating openings in a dielectric material (e.g., a photosensitive material), may particularly enable versatile tailoring of a shape of the conductive lines (e.g., a shape in cross-sectional view of a plane perpendicular to a length of the conductive line) with increased accuracy. In some such cases, a conductive line may be tailored to have a shape (e.g., a cross-sectional shape) that is more complex and includes more features for controlling E-field distribution near the conductive line compared to the conductive lines that are fabricated and shaped using other methods, e.g., physical or chemical vapor-based deposition techniques. For example, unlike some vapor-based deposition techniques that may be affected by shadowing effects, electroplating may allow fabricating thicker conductive lines and enable formation of conductive lines having curved, stepped, or sloped side surfaces due to its high conformity to the underlying pattern. In some cases, thicker conductive lines may be shaped according to conductor shaping strategies developed for shaping large (macroscopic) electrodes used in high voltage engineering in order to mitigate the fringing field and avoid electric arcing. For example, edges of the conductors fabricated using electroplating may be rounded based on spherical or Rogowski-like shapes.

In some embodiments, the operating voltage of an IC may be limited by electric discharge between laterally separated conductive lines fabricated on a layer or substrate. In some embodiments, the operating voltage of an IC may be limited by electric discharge between vertically separated conductive lines fabricated on two layers. In both cases, tailoring the shapes of the conductive lines may increase the operating voltage of the IC by reducing the maximum E-field magnitude in the E-field distribution around the conductive lines resulting from a voltage difference between them.

Figure 1A:
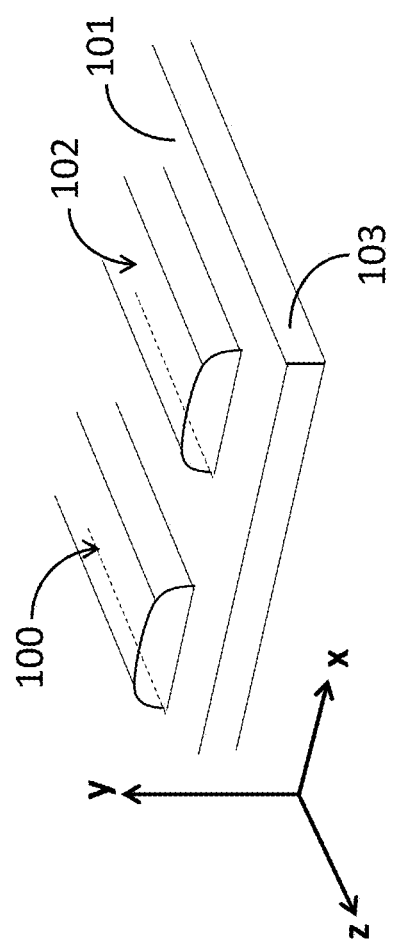
FIG. 1A schematically illustrates two conductive lines having curved surfaces disposed side-by-side on a substrate or a layer of an integrated circuit.

FIG. 1A schematically illustrates an example of two conductive lines 100, 102 having side curved surfaces (e.g., rounded corners) disposed side-by-side on a top surface 101 of a layer 103 of an integrated circuit (IC). The conductive lines 100 and 102 may be laterally separated by a distance (e.g., along x-axis). In some cases, the layer 103 is a substrate layer. In some other cases, the layer 103 can be a layer disposed on a substrate layer or disposed on one or more of layers disposed on a substrate. In yet other examples, the layer 103 can be a layer of the plurality of layers in a multilayer IC. Each conductive line 100, 102 includes a top surface, a bottom surface, and two side surfaces. In some cases, the top surface and the bottom surface may be flat or nearly flat surfaces substantially parallel to the top surface 101 of the layer 103. However, embodiments are not so limited and the top and bottom surfaces may be curved. In some cases, an angle between the top and the bottom surface can be less than 5 degrees, less than 3 degrees, or less than one degree. Each conductive line may have a thickness along direction perpendicular to the top surface 101 (e.g., along y-axis). The conductive lines 100, 102 can be part of a monolithically fabricated integrated circuit (IC) and may be fabricated during one or more fabrication steps of a fabrication process of the IC. In some cases, the conductive lines 100, 102 may be fabricated along with other components of IC disposed on the layer 103.

FIG. 1B schematically illustrates an example of two conductive lines 104, 106 having curved surfaces disposed on a top surface 108 of a first layer 105, and on a top surface 109 of a second layer 107, of an IC, respectively. In some cases, the layer 105 is a substrate layer. In some other cases, the layer 105 may comprise a plurality of layers disposed on a substrate layer. In some cases, the second layer 107 may include two or more sublayers. Each conductive line 104, 106 includes a top surface, a bottom surface, and two side surfaces. In some cases, the top surface and the bottom surface of the conductive line 106 (or conductive line 104) may be flat or nearly flat surfaces substantially parallel to the top surface 108 of the layer 105 and/or the top surface 109 of the layer 107. Each conductive line 104, 106 may have a thickness along a direction perpendicular to the top surface 105 and/or the top surface 109 (e.g., along y-axis). The conductive lines 106/104 can be part of a monolithically fabricated integrated circuit (IC) and may be fabricated during one or more fabrication steps of a fabrication process of the IC. In some cases, the conductive line 106 may be fabricated along with other components of IC disposed on the layer 107 and the conductive line 106 may be fabricated along with other components of IC disposed on the layer 109.

Each of the conductive lines 100, 102, 104, 106 has a width in the lateral direction parallel to the top surface 103 or the top surface 109 (e.g., along x-axis) and is extended in a longitudinal direction (e.g., along z-axis) perpendicular to the lateral direction and parallel to the top surface 103 or the top surface 109. The width of each conductive line 100, 102, 104, 106 may be 3, 4, 5, or 10 times greater than its thickness, or have a value in a range defined by any of these values. In some cases, one or both side surfaces of the conductive lines 100, 102, 104, 106 can include curved surfaces having a radius of curvature larger than 5%, 10%, 10%, 30%, 40%, 50% or 60% of the thickness of the conductive line, or a value in a ranged defined by any of these values.

In some implementations, a side view cross-section of a conductive line in a plane perpendicular to the longitudinal axis of the conductive line (e.g., along z-axis), may comprise one or more curved regions. In some cases, a curved region may be extended to the top or the bottom surface of the conductive line. In such cases, a portion of the top surface or the bottom surface may have a curved cross-section.

In some examples, the conductive lines 100, 102, 104, 106 may be fabricated using a patterned dielectric layer (e.g., a dielectric layer comprising a photosensitive material) and electroplating. The pattern dielectric layer may be fabricated using photolithography and etching.

In some cases, the shapes of conductive lines of an integrated transformer may be tailored to increase an operating voltage of the transformer. In some cases, the integrated transformer can be a monolithic transformer. In such cases, the integrated transformer may be a stand-alone IC. In some other cases, the integrated transformed may be integrated with other components and/or devices of an IC. For example, the transformer and other components and devices may be monolithically fabricated on a single layer or substrate. A transformer can be an isolator configured to electrically isolate circuits.

Figure 2B:
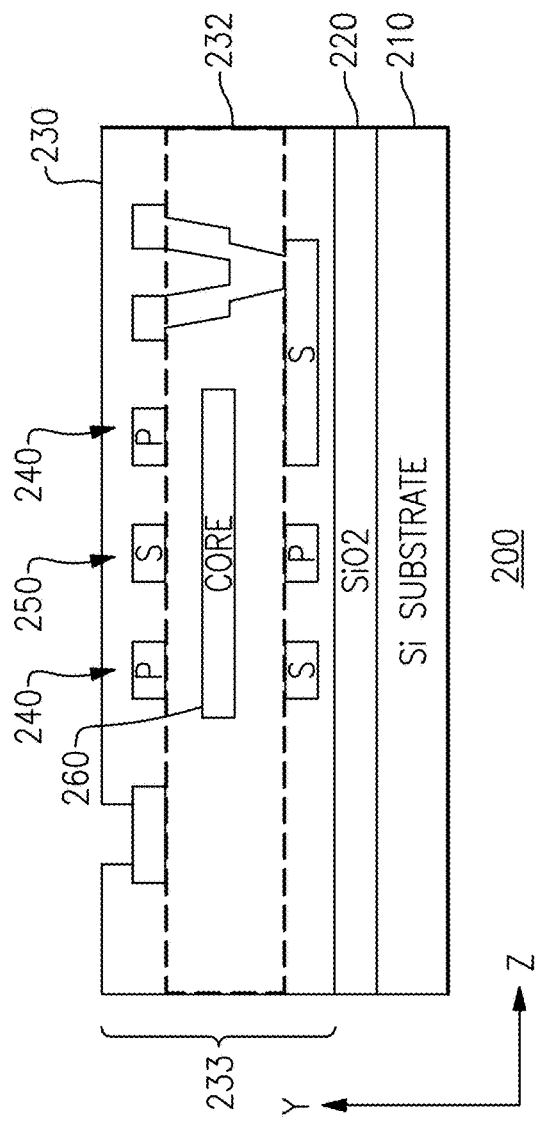
FIG. 2B illustrates a side view of the integrated transformer shown in FIG. 2A in a cross-sectional plane, where the cross-sectional plane is perpendicular to the main surface of the substrate and parallel to the winding axis of the transformer.
Figure 2A:
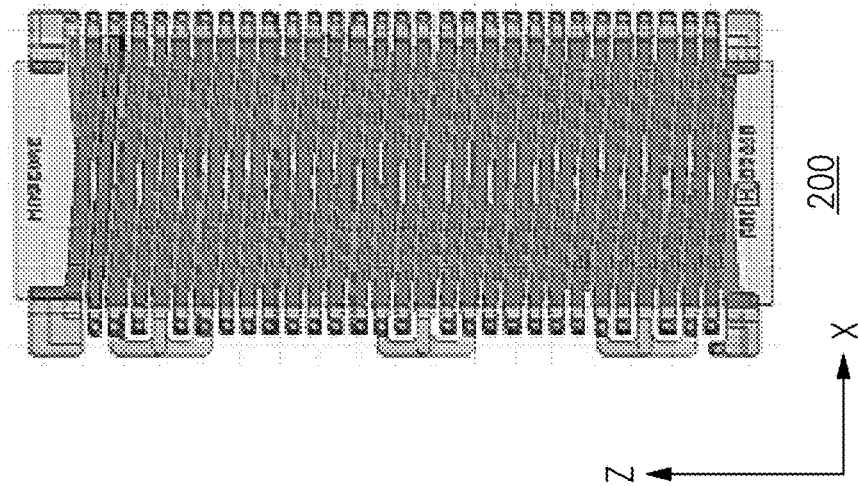
FIG. 2A is a top view image of an example integrated transformer having laterally isolated primary and secondary coils wound around a winding axis parallel to a main surface of a core layer.

FIG. 2A is a top view of an example integrated transformer 200 having laterally (along z-axis) isolated primary and secondary coils wound around a winding axis (e.g., the z axis) parallel to a main surface of a core layer (e.g., a surface parallel to x-z plane). FIG. 2B illustrates a side cross-sectional view of the transformer 200 shown in FIG. 2A, across a cross-sectional plane (e.g., y-z plane) perpendicular to the main surface of the core layer 232 (e.g., x-z plane) and parallel to winding axis of the transformer 200 (e.g., parallel to z-axis). As illustrated, the windings of the primary coil and the secondary coil are interlaced with each other such that the windings of the primary coil alternate with the windings of the secondary coil along the z-axis. The interlaced arrangement of the primary and secondary coil is schematically illustrated in FIG. 2C.

Referring to FIGS. 2A-2C, the transformer 200 may be a galvanic isolator usable for electrically isolating two circuits while allowing voltage transformation between the circuits via magnetic coupling. The primary coil 240 and the secondary coil 250 (FIG. 2B) of the transformer 200 each may have one or more windings or turns where each turn includes a top conductive line and a bottom conductive line, both being substantially parallel to the main surface of the core layer 232, and two vertical conductive lines (referred to herein to as vias) perpendicular to the main surface of the core layer 232 (e.g., parallel to y-axis). The two vias may electrically connect the top and the bottom conductive lines. The top/bottom conductive lines may have a length along a longitudinal axis of the conductive line (e.g., along x-axis or an axis making an angle smaller than 30 degrees with x-axis) and a width along a lateral axis of the conductive line (e.g., along z-axis or an axis making an angle smaller than 30 degrees with z-axis). The primary and secondary coils may be extended along the winding axis of the transformer 200 (e.g., parallel to z-axis). In some cases, an angle between the winding axis of the transformer 200 and the lateral axes of the top/bottom conductive lines may be smaller than 10 degrees, 20 degrees, 30 degrees, 40 degrees, or have a value in a range defined by any of these values. In some cases, the lateral axes of the top/bottom conductive lines are substantially parallel to the winding axis of the transformer 200 (e.g., z-axis) and the longitudinal axes of the top/bottom conductive lines are substantially perpendicular to the longitudinal axis of the transformer 200. The core layer 232 may include a core element 260 comprising a magnetic (e.g., a ferromagnetic material) material having a relative permeability that is at least an order of magnitude greater than 1.

Examples of materials that can be used for the core element 260 include but are not limited to NiFe, CoZrTa, CoFeB, CoZrTaB, CoZrO, or CoFe.

However, in some embodiments other materials may be used to form the core element 260. The core element 260 can be an elongated element configured to improve the magnetic coupling between the primary 240 and secondary 250 coils. The core element 260 can have a rectangular lateral cross-section (e.g., in a plane parallel to the main surface of the core layer 232 or parallel to x-z plane), and a rectangular cross-sectional shape in a plane perpendicular to the main surface of the core layer 232 (e.g., a plane parallel to y-axis and parallel to the z-axis or the x-axis). In some cases, the core element 260 may have other shapes in a plane parallel to the main surface of the core layer 232 or a plane parallel to the winding axis and perpendicular to the main surface of the core layer. In some implementations, an integrated transformer having laterally isolated primary and secondary coils may not have a core element.

In the illustrated cross sectional view in FIG. 2B, the top and bottom conductive lines of the primary coil 240 and the secondary coil 250 have rectangular or near rectangular cross-sections (in the cross-sectional plane parallel to the y-z plane) and are disposed on top and below the core layer 232. The primary coil 240, the secondary coil 250, and the core element 260 may be embedded in a top layer 233 that is disposed on a first buffer layer 220 (e.g., an oxide layer or a polymer layer), where the buffer layer is disposed on a substrate 210 (e.g., a silicon substrate). In the example shown, the top layer 233 comprises a first dielectric material and the buffer layer 220 may comprise a second dielectric material. In some other examples, the top layer may include two or more sub-layers including the core layer 232. In various implementations, the one or more sublayers of the core layer 232 may comprise one or more dielectric materials of different types including but not being limited to a polymer (e.g., polyimide, SUB, BCB), silicon dioxide, or silicon nitride. The top/bottom conductive lines may comprise a metal (e.g., copper, aluminum, gold, silver, or an alloy formed by these metals or other conductive materials). In particular, the metal is a plated metal according to various embodiments described herein.

FIG. 2C schematically illustrates the arrangement of a single turn 240a of the primary coil 240 and a single turn 250a of the secondary coil 250 of the transformer shown in FIG. 2A, wound around the core element 260. The single turn 240a of the primary coil 240 includes a top conductive line 241, a bottom conductive line 242, a first via 244a, and a second via 244b. The first via 244a electrically connects the top conductive line 241 and the bottom conductive line 242. The second via 244b electrically connects the bottom conductive line 242 to the next turn of the primary coil 240. The single turn 250a of the secondary coil 250 includes a top conductive line 251, a bottom conductive line 252 that are also connected by two vias. According to the illustrated arrangement, the windings of the primary coil 240 and the secondary coil 250 are interlaced with each other such that the windings of the primary coil 240 alternate with the windings of the secondary coil 250 along the winding axis (e.g., the z-axis). As such, the top conductive lines 241 of the primary coil 240 and the top conductive lines 251 of the secondary coil 250 alternate along the winding axis, and the bottom conductive lines 242 of the primary coil 240 and the bottom conductive lines 252 of the secondary coil 250 alternate along the winding axis.

As mentioned above, the top and bottom conducive lines of the transformer 200 may have rectangular or near rectangular cross-sectional shape. It will be appreciated that the cross-sectional shape of the conductive lines of the transformer 200 defined by a conventional fabrication process used to fabricate the conductive lines may have four corners including one or more sharp corners (e.g., having a radius of curvature smaller than 0.5 microns). In some cases, such sharp corners may result in formation of E-field distributions comprising maximum E-fields with large magnitudes, near the conductive lines. In some cases, several local E-field maximums may be formed at "hot spots" near or at the sharp corners.

FIG. 2D illustrates simulated static electric field distribution over the cross-sectional plane of the transformer shown in FIG. 2B fabricated using a conventional fabrication process, when a primary voltage is applied on the primary coil 240 and a secondary voltage different from the primary voltage is applied on the secondary coil 250 resulting in an electric potential difference between the primary and the secondary coils. The resulting electric field distribution has been calculated assuming that the primary and the secondary voltages are static. The cross-sectional plane (e.g., y-z plane) is perpendicular to the main surface of the substrate 210 or the core layer 232 (e.g., x-z plane) and parallel to the winding axis of the transformer 200. FIG. 2D illustrates the electric field distribution near the top and bottom electrodes 241, 424 of the primary coil 240 and the top and bottom electrode 251, 252 of the secondary coil 250.

As indicated by the white arrows (pointing to E-field hot spots) in FIG. 2D, the magnitude of the electric field near the corners of the top and bottom conductive lines of the primary and secondary coils is significantly larger than the other regions within the core layer 232. In some cases, the large magnitude of the electric field near the corners may cause electric discharge between the primary and the secondary coils. For example, an electric discharge may occur between a corner of a top conductive line 241 of the primary coil and the corner of the top conductive line 251 of the secondary coil.

Figure 2E:
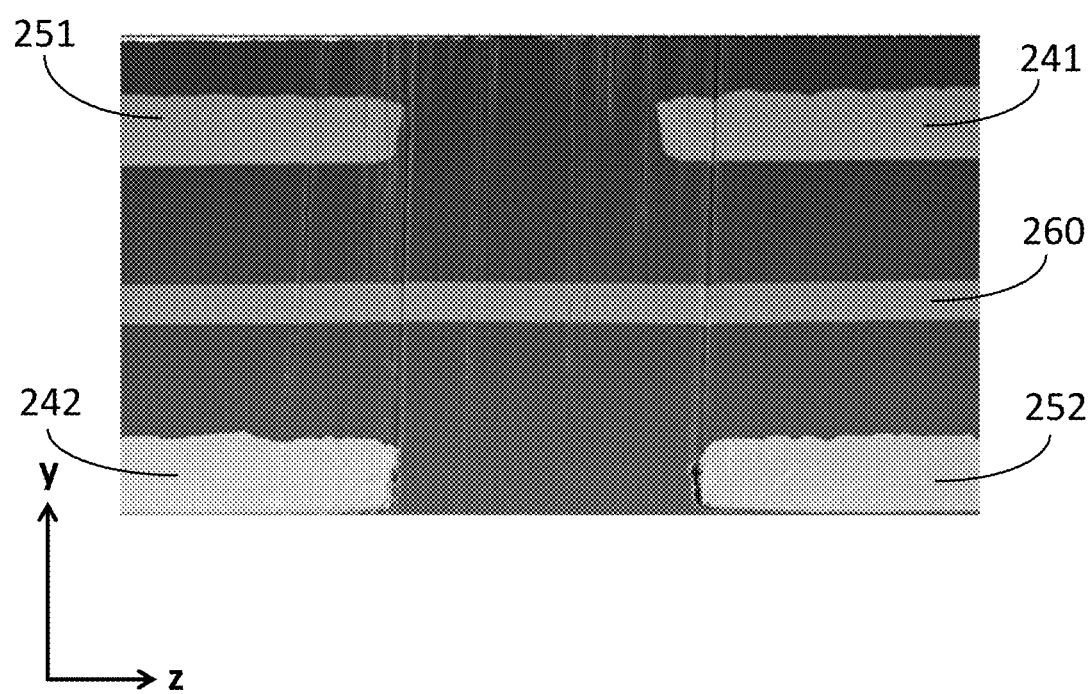
FIG. 2E is a side cross-sectional scanning electron microscope (SEM) image of an example integrated transformer (similar to the transformer shown in FIG. 2A), showing portions of its primary coil, secondary coil, and core element.

FIG. 2E is a cross-sectional scanning electron microscope (SEM) image of an example transformer having laterally isolated primary and secondary coils (similar to transformer 200, FIGS. 2A-2C) in the y-z plane showing portions of top/bottom conductive lines 241/242 of the primary coil 240, portions of top/bottom conductive lines 251/252 of the secondary coil 250, and the core element 260. The conductive lines 241, 242, 251, 252 may be formed using electroplating of rectangular opening formed in a photoresist, using a conventional process. In some cases, the thickness of the core element 260 along y-axis can be 4.5 microns.

Figure 2F:
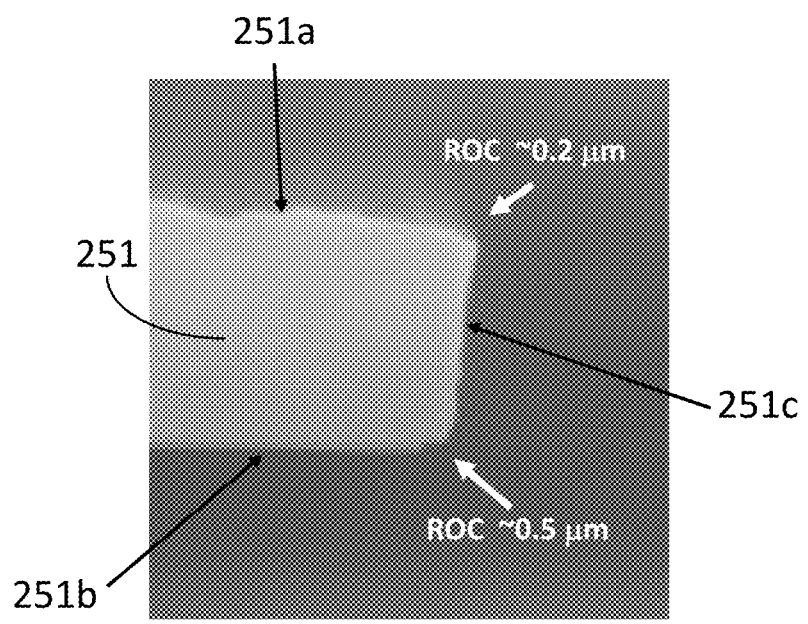
FIG. 2F is a close-up side cross-sectional SEM image of the top-left conductive line in FIG. 2E.

FIG. 2F is a close-up side cross-sectional view of a portion of a conductive line 251 in FIG. 2E in the x-z plane. The conductive line 251 has a near-rectangular cross-sectional shape in the y-z plane having a top surface 251a, a bottom surface 251b, a first side surface 251c and a second side surface (not shown). The top surface 251a and the bottom surface 251b are substantially parallel to the main surface of the core layer 232. In the example shown, the side surface is a substantially flat surface (e.g., +/−0.1 to +/−5 degrees offset relative to a nominally vertical plane) that is substantially perpendicular (e.g., +/−0.1 to +/−5 degrees relative to a nominally 90 degree angle) to the top surface 251a and bottom surface 251b. A radius of curvature of the top corner between the side surface 251c and the top surface 251a, and a radius of curvature of the bottom corner between the side surface 251c and the bottom surface 251b, may be less than 0.1 microns, less than 0.2 microns or less than 0.5 microns. The inventors have found that such small radii of curvature may result in formation of large electric fields near the corners of the conductive lines and reduce a maximum amount of voltage that can be supported by the first and the second coil of the corresponding transformer.

Figure 3B:
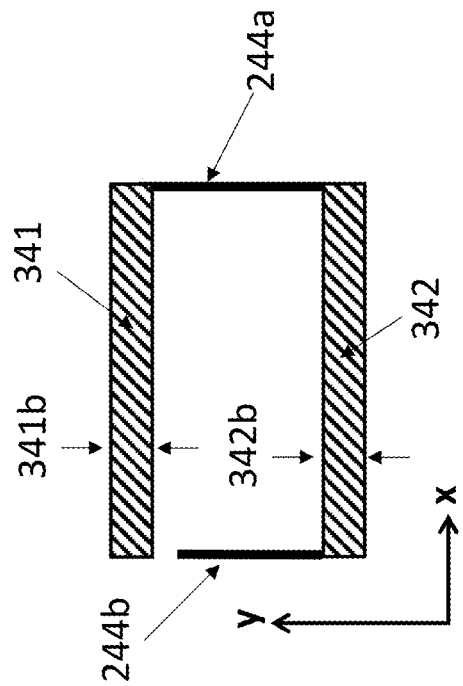
FIG. 3B illustrates a cross-sectional view of the single turn of the primary or secondary coil shown in FIG. 3A.
Figure 3A:
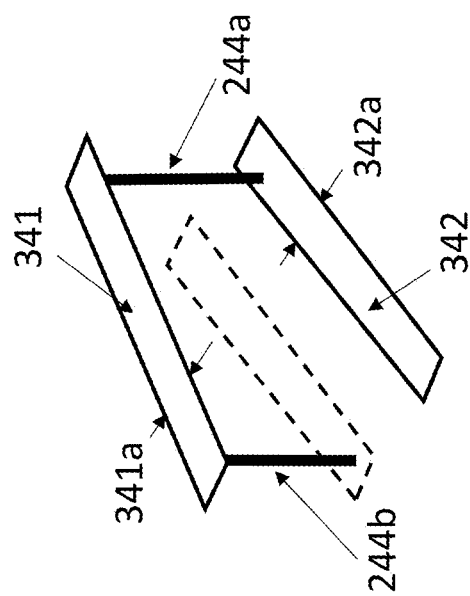
FIG. 3A illustrates a three-dimensional (3D) view of the structural features of a single turn in a primary coil or a secondary coil of an integrated transformer.

FIG. 3A and FIG. 3B schematically further illustrate a three-dimensional view and a two dimensional view of a single turn of a coil (e.g., the primary coil or the secondary coil) of the transformer 200 (FIG. 2A). The single turn includes a top conductive line 341 having a width 341a and thickness 341b, a bottom conductive line 342 having a width 342a and thickness 342b, a first via 244a and a second via 244b. In various embodiments, the vias 244a, 244b may be vertical or nearly vertical conductive lines perpendicular to the main surface of the core layer 232 and/or the substrate 210, and electrically connecting the top conductive line to the bottom conductive line and having circular or rectangular cross-sections. The thicknesses 341b, 342b of the top conductive line 341 and the bottom conductive line 342 may be from 4 to 8 microns, 8 to 12 micron, or 12a to 20 microns (e.g., along y-axis). The widths 341a, 342a of the top conductive line 341 and the bottom conductive line 342 may be from 40 to 70 microns, 70 to 100 microns, or 100 to 120 microns. In some examples, the thickness 341b of the top conductive line 341 and the thickness 342b of the bottom conductive line 342 can be substantially equal.

Figure 3C:
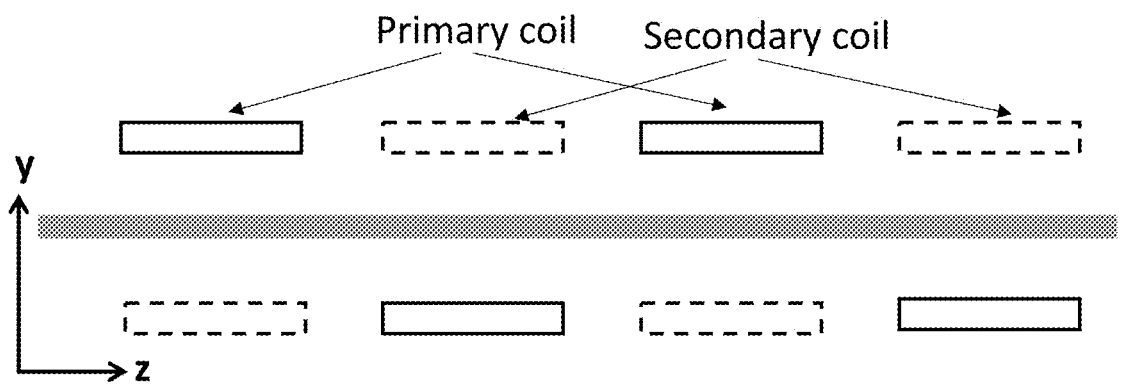
FIG. 3C illustrates a side view of the conductive lines of two turns of the primary coil, two turns of the secondary coil, and the core element, of an example integrated transformer in a plane. The plane is perpendicular to the main surface of the substrate and parallel to the winding axis of the transformer.

FIG. 3C further illustrates an example arrangement of the top conductive lines and the bottom conductive lines of the primary and the secondary coils of an integrated transformer with laterally isolated primary and secondary coils (e.g., transformer 200), in a plane (e.g., y-z plane) perpendicular to a main surface of the core layer of the transformer and parallel to a winding axis (z-axis) of the transformer.

Figure 3D:
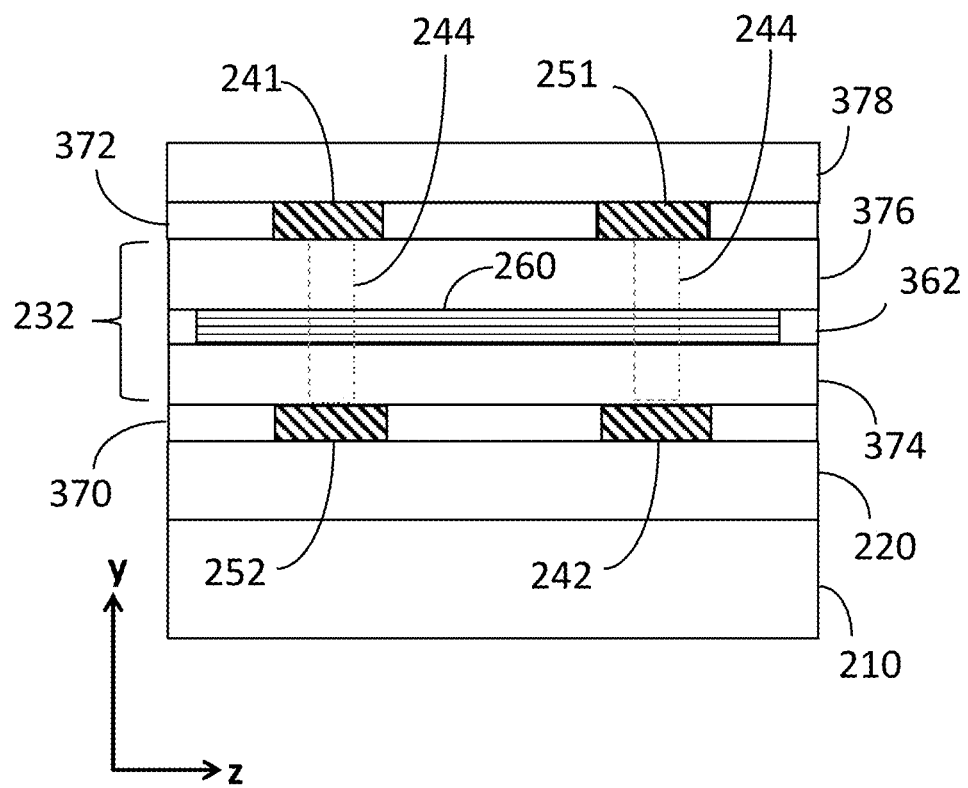
FIG. 3D illustrates a cross-sectional view of a portion of the integrated transformer shown in FIG. 2B or FIG. 3C in a plane parallel to the longitudinal axis of the transformer (z-axis) and perpendicular to the main surface of the transformer, depicting various layers of the transformer.

FIG. 3D further illustrates a cross section of a portion of an example transformer fabricated on a substrate 210 depicting different layers disposed on the substrate 210. The cross-section shown in FIG. 3D can be a cross-section of the transformer 200 (FIG. 2A-2C). The cross-section can represent a view of a plane parallel to the x-y plane perpendicular or the main surface of the core layer 232 (or the substrate 210) of the transformer 200 and parallel to its winding axis of the transformer (e.g., z-axis). The transformer may include a buffer layer 220 disposed on the substrate layer 210, a bottom electrode layer 370, disposed on the buffer layer 220, the core layer 232, a top electrode layer 372 disposed on the core layer 232, and a cap layer 378 disposed on the top electrode layer. The bottom electrode layer 370 may include at least a bottom conductive line 242 of the primary coil and a bottom conductive line 252 of the secondary coil. The top electrode layer 372 may include at least a top conductive line 241 of the primary coil and a top conductive line 251 of the secondary coil. In some cases, the buffer layer 220 may include one or more layers. In some embodiments, the core layer 232 may include a bottom core layer 374, a mid-core layer 362, and a top core layer 376. The middle core layer 362 may include the core element 260. In some embodiments, at least a portion of the buffer layer 220, a nonconductive portion of the bottom electrode layer 370, a non-magnetic portion of the core layer 232, and a nonconductive portion of the top electrode layer 376 may comprise the same material (e.g., a dielectric material). In some cases, the non-conductive materials used to form any of the buffer layer 220, the bottom electrode layer 370, the bottom core layer 374, the middle core layer 362, the top core layer 376, the top electrode layer 372 and the cap layer 378 may be similar or different to that of another layer. In various embodiments, the non-conductive and non-magnetic materials used to form different layers of the transformer on the substrate may include but not limited to Polymers (polyimide, SU8, BCB), silicon dioxide, silicon nitride, or other materials. The substrate 210 may comprise, silicon, glass (e.g., SiO$_2$), quartz, ceramic, or other materials. FIG. 3D illustrates that the bottom conductive lines 242, 252, and the top conductive lines 241, 251 are formed at a bottom metallization layer (e.g., the bottom electrode layer 370), and an upper metallization layer (e.g., the top electrode layer 372), respectively, wherein the top, and bottom metallization layers are distinct metallization layers. As described herein, a metallization layer refers to a layer having a lithographically defined metallized portion and an intermetal dielectric portion at least partly embedding the metallized portion. It will be appreciated that via, e.g., the vias 244a, 244b, may vertically traverse one or more metallization levels. According to various embodiments, at least the bottom and upper metallization layers defining bottom conductive lines 242, 252 and the top conductive lines 241, 251, respectively, may be formed by electroplating over predefined dielectric patterns, e.g., resist patterns.

In some implementations, the transformer may include a middle metallization level between the bottom and the top metallization level. In some cases, the middle metallization level may comprise the middle core layer 362. In these implementations, the middle metallization level defining the middle core layer 362, may be formed by electroplating (e.g., electroplating a magnetic metal) over predefined dielectric patterns, e.g., resist patterns.

Figure 4A:
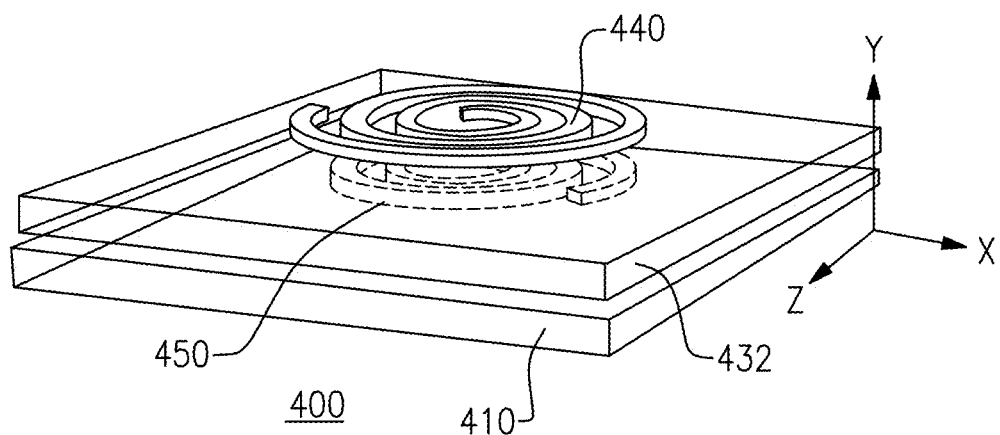
FIG. 4A illustrates a 3D view of an example of an integrated transformer having vertically isolated primary and secondary coils wound around a winding axis perpendicular to a main surface of a core layer.
Figure 4B:
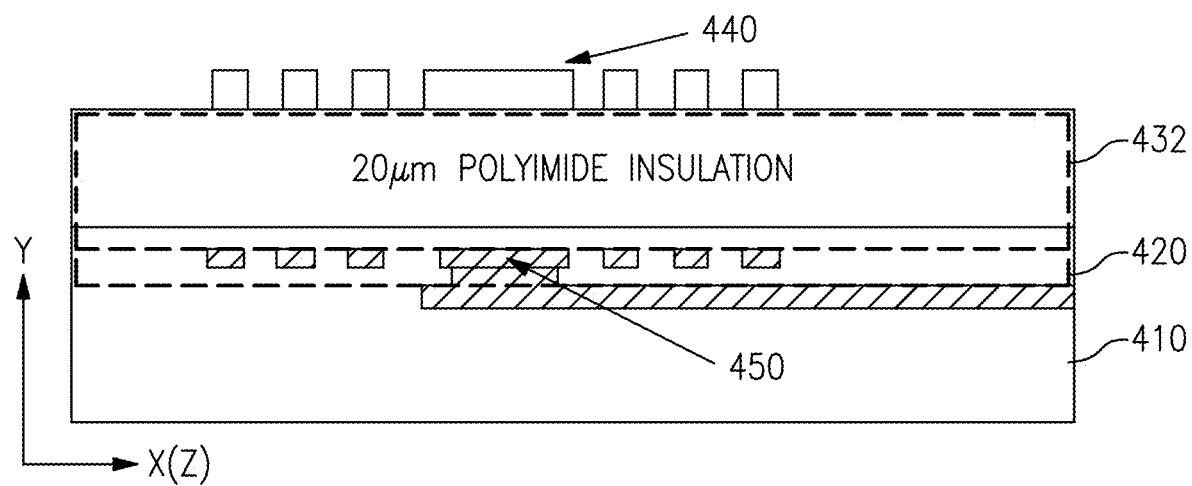
FIG. 4B illustrates a cross-sectional view of the transformer shown in FIG. 4A in a plane perpendicular to the main surface of the core layer and parallel to the winding axis of the transformer (y-axis).

FIG. 4A illustrates a perspective view an example transformer 400 having vertically (along y-axis) isolated primary 440 and secondary 450 coils wound around a winding axis (e.g., y-axis) perpendicular to a main surface of a core layer 432 (e.g., a surface parallel to x-z plane), according to an alternative embodiment. The transformer 400 may be a galvanic isolator usable for electrically isolating two circuits while allowing voltage transformation between the circuits via magnetic coupling. The primary coil 440 may be disposed on top of the core layer 432 and the secondary coil 450 may be disposed at the bottom of the core layer 432. The transformer 400 may further include a buffer layer 420 below the core layer 432 and a substrate 410 on which the buffer layer is disposed. The primary coil 440 and the secondary coil 450 of the transformer 400 each may comprise a spiral-shaped conductive line having one or more windings or turns with different radii of curvature. The conductive line of each coil may have a width along a radius of curvature of the conductive line and a thickness along the winding axis of the transformer 400. FIG. 4B illustrates a side cross-sectional view of the transformer 400 shown in FIG. 4A, across a cross-sectional plane (e.g., y-z or y-x plane) perpendicular to the main surface of the core layer 432 and parallel to the winding axis of the transformer 400 (e.g., y-axis). In the example shown, the top and bottom conductive lines of the primary coil 440 and the secondary coil 450 have substantially rectangular cross-sections (in the cross-sectional plane) and are disposed on top and below the core layer 232. The secondary coil 420 may be embedded in the buffer layer 420 that is disposed on the substrate 410. In some cases, the core layer 432 may comprise a first dielectric material and the buffer layer 420 may comprise a second dielectric material. The first or the second dielectric material may comprise a polymer (e.g., polyimide, SU8, or BCB), glass, silicon oxide, silicon nitride, or aluminum oxide. In various implementations, the first and the second dielectric materials can be the same or different materials. The substrate 410 may comprise silicon, glass, or ceramic. In various implementations, the transformer 400 may comprise one or more features analogously described above with respect to the transformer 200 (FIGS. 2A-2C).

Figure 4C:
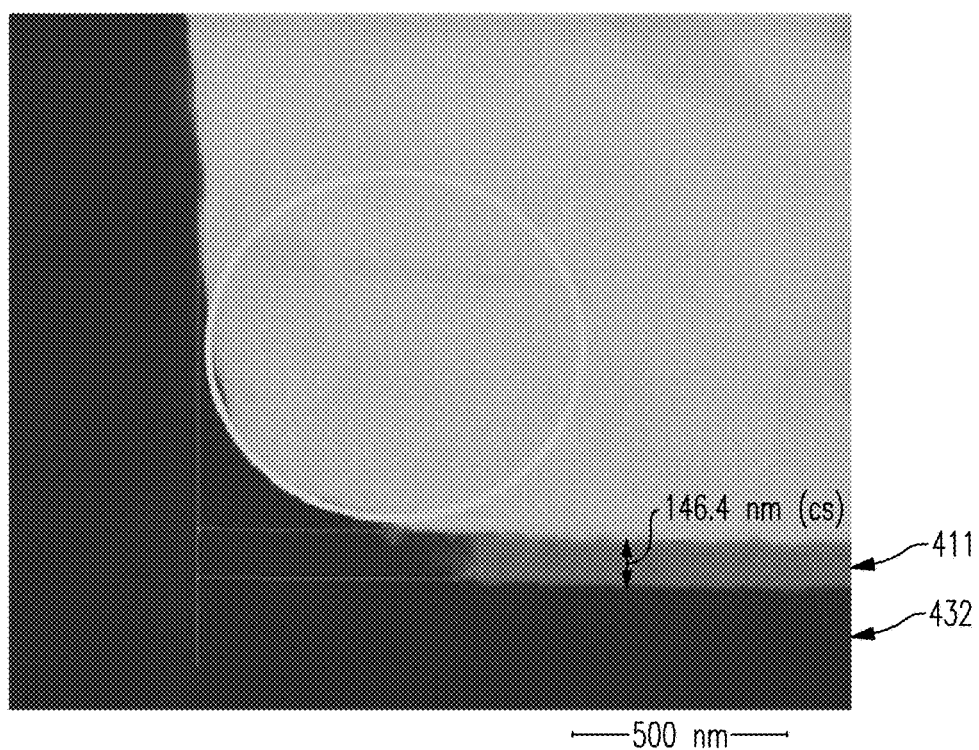
FIG. 4C is an SEM image of the lower corner of a conductive line used in an example transformer similar to that illustrated in FIG. 4B.

FIG. 4C shows a scanning electron microscope (SEM) image of a portion of the conductive line of the primary coil 440. In some examples, the conductive line may be disposed on a seed layer 411 formed on the core layer 432. In the example shown, a bottom corner of the conductive line has a radius of curvature (ROC) of about 450 nm. In some cases, the conductive line shown in FIG. 4C may be fabricated using an electroplating process similar to the process described with respect to conductive lines of the transformer 200 (FIGS. 2A-2C). In some cases, the relatively small ROC of the bottom corner line may result in formation of E-field hot spots near this corner.

Figure 4D:
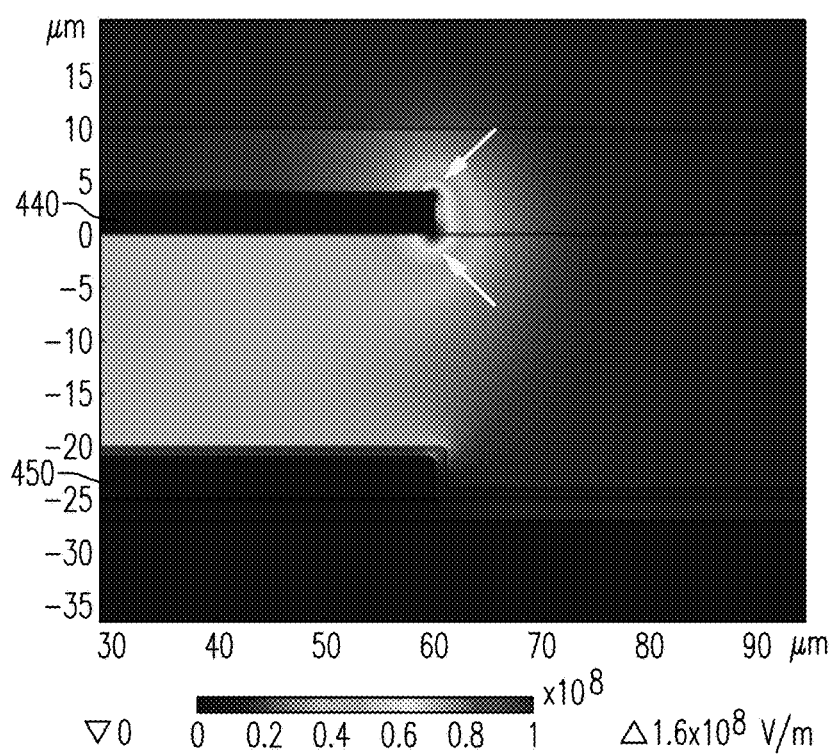
FIG. 4D illustrates a simulated electric field distribution over the cross-sectional plane of the transformer shown in FIG. 4B.

FIG. 4D illustrates a simulated electric field distribution profile over a cross-sectional plane of the transformer 400 when a primary voltage is applied on the primary coil 440 and a secondary voltage different than the primary voltage is applied on the secondary coil 450 to generate an electric potential difference between the primary and the secondary coils. The cross-sectional plane is perpendicular to the main surface of the core layer 432 and parallel to the winding axis of the transformer (e.g., y-axis).

As indicated by the white arrows in FIG. 4D, the magnitude of the electric field near the corners of the primary coil 440 (e-field host spots), is significantly higher than the other regions within the core layer 432. In some cases, the large magnitude of the electric field near the corner may cause electric discharge between a corner of the primary coil 440 and a corner of the secondary 450 coil.

In various implementations, a shape of the conductive lines of the transformer 200 and/or transformer 400 may be tailored to reduce the magnitude of the maximum E-fields in the E-field distributions formed by the primary and the secondary coils. In some cases, tailoring the shape of the conductive lines may reduce the number of E-field hot spots in the vicinity of the coils. In some implementations, a shape of a conductive line of the transformer 200 (FIGS. 2A-2C) and/or transformer 400 (FIGS. 4A-4B) may be tailored to include an electric field-reducing structure. According to various embodiments, the electric field-reducing structure serves to decrease E-field magnitude by: increasing the ROC of a corner, to make a side surface curved, to make a side surface sloped, to provide a stepped side surface, or to provide a combination of these and other features. In some cases, a cross-sectional shape of a conductive line (e.g., a conductive line of a transformer or a coil) may be tailored by shaping the sidewalls of an opening formed though a patterning layer in which the conductive line is disposed by electro-plating. For example, the sidewalls of an opening in a photoresist layer may be tailored using various photoresist shaping techniques, to have a shape that is complementary to a desired shape of a side surface of the conductive line formed by electroplating the opening.

Conductive Lines Having a Rounded Edge Portion

FIGS. 5A-5E illustrate cross-sections of various example conductive lines including the electric field-reducing structure, which are viewed in a plane perpendicular to an axis along the length of the conductive line. In some cases, the cross-sections shown in FIGS. 5A-5E can represent cross-sections of conductive lines of a transformer in a plane perpendicular to a main surface of the corresponding core layer and parallel with the winding axis of the transformer. In some cases, these cross-sections may represent cross-section of a top (or bottom) conductive line of the primary coil 240 or the secondary coil 250 of the transformer 200 (FIG. 2B). In some cases, the cross-section 500 may be the cross-section of the conductive line of the primary coil 440 or the secondary coil 450 of the transformer 400 (FIG. 4A).

Figure 5A:
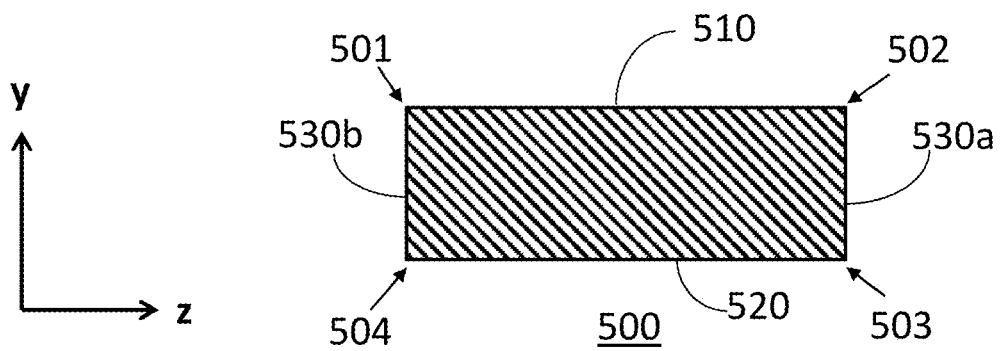
FIG. 5A illustrates a cross-section of a conductive line of an integrated transformer or coil in a plane perpendicular to the main surface of the core layer and parallel to the winding axis (z-axis) of the transformer.
Figure 5B:
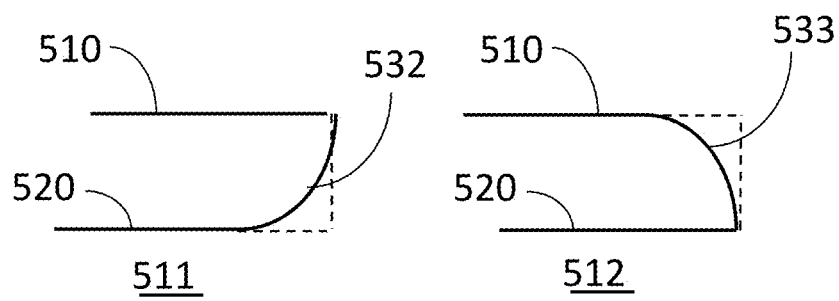
FIGS. 5B-5E illustrate cross-sections of example conductive lines having a curved side surface.

The conductive line 500 shown in FIG. 5A represents a non-tailored conductive line formed by conventional fabrication techniques without implementation of special designs and fabrication techniques according to embodiments disclosed herein that may comprise formation of rounded corners (e.g., with ROCs larger than 1 micron), sloped side surfaces and/or stepped side surfaces. The cross-section 500 depicts four corners 501, 502, 503, 504, a top surface 510, a bottom surface 520, and two side surfaces 530*a*, 530*b* of the corresponding conductive line. In various embodiments, the corners 501, 502, 503, 504 may be sharp corners, for example corners having radii of curvature less than 1 micron. As described above, such sharp corners may reduce a maximum voltage that can be applied or generated between the conductive lines (e.g., the primary and the secondary coils of a transformer) before the onset of an electric discharge that may occur between them.

FIGS. 5B-5E illustrate portions (e.g., a right side portion) of cross-sections of conductive lines having a curved side surface according to embodiments. In some cases, conductive lines 511-517 shown in FIGS. 5B-5E may be tailored conductive lines formed by implementation of special techniques according to embodiments disclosed herein to form curved side surfaces and rounded corners having large ROCs (e.g., larger than 1 micron). Conductive lines 511 and 512 shown in FIG. 5B have a fully curved side surface (e.g., side surface 532 or side surface 533) extended between the top surface 510 and the bottom surface 511. A top corner (e.g., corner 502) of the conductive line 511 or a bottom corner (e.g., corner 503) of the conductive line 512 may be a sharp or unrounded corner defining an angle less than 100 degrees, or less than 80 degrees. In some cases, when the ROC of a rounded corner is large (e.g., larger than 50% of a vertical distance between the bottom surface 520 and top surface 510), the entire side surfaces 530*a*, 530*b* may be rounded. As such, a bottom corner (e.g., corner 503) of the conductive line 511 or a top corner of the conductive line 512 may be a round corner having a radius of curvature substantially equal to that of the side surface 532 or side surface 533 respectively.

Figure 5C:
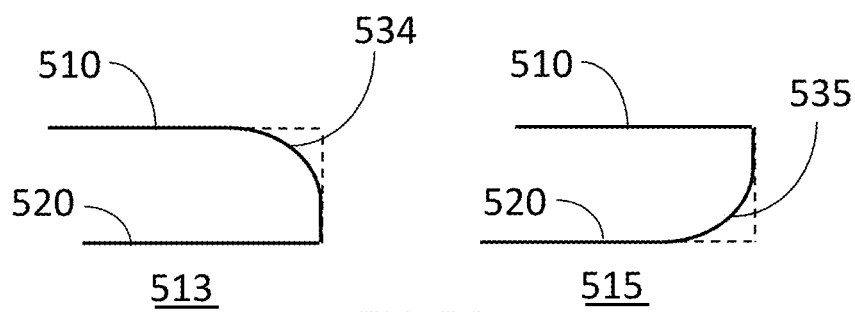

Conductive lines 513 and 514 shown in FIG. 5C have a partially curved side surface (e.g., side surface 534 or side surface 535) extended between the top surface 510 and the bottom surface 520. The side surface 534 may have a flat portion perpendicular to the bottom surface 520 and a curved (or round) portion. The side surface 535 may have a flat portion perpendicular to the top surface 510 and a curved (or round) portion. A bottom corner (e.g., corner 503) of the conductive line 513 or a top (e.g., corner 502) of the conductive line 514 may be a sharp or unrounded corner defining an angle less than 100 degrees, or less than 80 degrees.

Figure 5D:
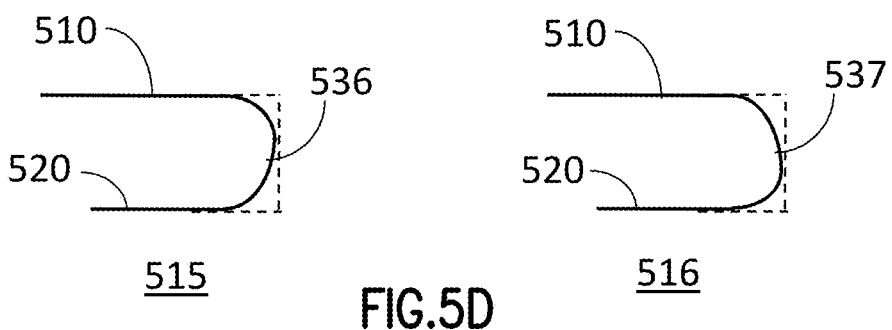

Conductive lines 515 and 516 shown in FIG. 5D have a fully curved side surface (e.g., side surface 534 or side surface 535) extended between the top surface 510 and the bottom surface 520. The side surface 536 of the conductive line 515 or the side surface 537 of the conductive line 516 may have a top portion near the top surface 510 and a bottom portion near the bottom surface 520. A radius of curvature of the top portion of the side surface 536 may be smaller than the radius of curvature the bottom portion of the side surface 536. A radius of curvature of the top portion of the side surface 537 may be larger than the radius of curvature the bottom portion of the side surface 537. In some cases, such as the conductive lines 517 shown in FIG. 5E, the radius of curvature of the top and bottom portions can be substantially equal. In these cases, the sidewall 538 can be a semi-circular side surface.

A curved side surface may be also referred to as a rounded corner. For example, the curved side surface 532 of the conductive line 511 may be referred to as a rounded to bottom corner of the conductive line 511. Similarly, the curved side surface 534 of the conductive line 513 may be referred to as a rounded to top corner of the conductive line 511.

In some implementations, a radius of curvature (ROC) of the curved or curved portion of the side surfaces 532, 533, 534, 535, 536, 537, 538 can be greater than 1 micron, larger than 2 microns, larger than 3 microns, larger than 5 microns or be a value in a range defined by any of these values.

In some implementations, a radius of curvature (ROC) of each of the curved or curved portion of the side surfaces 532-538 can be larger than 10%, 15%, 20%, 30%, 50%, 70%, 90%, or 100% of a thickness of the corresponding conductive line or any range between these values, or be smaller or larger than these values. The thickness of the conductive line 500, 512, 513, 514, 515, 516. 517 can be a vertical distance (e.g., an average distance along y-axis) between a top surface 510 and a bottom surface 520 of the conductive line. In various examples, the thickness of the conductive line 500, 512, 513, 514, 515, 516, 517 can be from 0.5 to 1 microns, 1 to 5 microns, 5 to 10 microns, 10 to 15 microns, 15 to 20 microns or any values between these ranges, or larger or smaller. In some examples, radius of curvature (ROC) of each of the curved or curved portion of the side surfaces 532-538 may not exceed 300% of the thickness of the corresponding conductive line.

FIGS. 6A-6H illustrate the cross-sections of a top conductive line and the respective bottom conductive lines of a transformer in a plane perpendicular to a main surface of the corresponding core layer and parallel with the winding axis of the transformer. In some cases, these cross-sections may be the cross-sections of a top and bottom conductive lines of the primary coil 240 and/or the secondary coil 250 of the transformer 200 (FIGS. 2A-2C). In some cases, these cross-sections may be the cross-sections of the conductive line of the primary coil 440 and the respective secondary coil 450 of the transformer 400 (FIGS. 4A-4B).

In some implementations, a shape (e.g., a cross-sectional shape) of a conductive line in a coil or a transformer may be selected or designed based at least in part on a shape of another conductive line of the coil or the transformer. For example, a shape of the top conductive line of the primary coil of a transformer may be designed or selected based on a shape of bottom conductive line of the secondary coil of the transformer. FIGS. 6A-6H illustrate the cross-sections of conductive line pairs of a transformer (e.g., the top conductive line of the primary coil and bottom conductive line of the secondary coil) having different shapes. In some cases, the combinations of shapes selected for a pair of conductive lines may result in reduction of the maximum E-field in a E-field distribution generated between the conductive lines of the pair for a given voltage difference between them.

Still referring to the conductive lines shown in FIG. 6A-6H, each conductive line may have two side surfaces having a radius of curvature larger than 1 microns, 3 microns, 5 microns or a value in a range defined by any of these values. FIG. 6A shows a top conductive line 602 and bottom conductive line 604 having sharp bottom corners. FIG. 6B shows a top conductive line 612 having sharp bottom corners and a bottom conductive line 610 having sharp top corners. FIG. 6C shows a top conductive line 622 having sharp bottom corners and a bottom conductive line 624 with no sharp corners (fully curve side surfaces). FIG. 6D shows a top conductive line 632 having sharp top corners and a bottom conductive line 634 with no sharp corners (fully curve side surfaces). FIG. 6E shows a top conductive line 642 having sharp top corners and a bottom conductive line 644 with sharp bottom corners. FIG. 6F shows a top conductive line 652 and a bottom conductive line 654 both having top sharp corners. FIG. 6G shows a top conductive line 662 having sharp top and bottom corners and a bottom conductive line 664 having sharp bottom corners. FIG. 6H shows a top conductive line 672 and a bottom conductive line 674 both having fully curved side surfaces. In various implementations, the top and bottom conductive lines of a transformer (e.g., transformer 200 or transformer 400) may comprise any combinations of the cross-sections shown in FIGS. 6A-6H. Shaping the top and bottom conductive lines based according to combinations of shown in FIGS. 6A-6H (and other possible combinations) may advantageously increase the operating voltage of the corresponding transformer by decreasing the magnitude of the electric field in a region near the top and/or bottom conductive lines. In various implementations, a radius of curvature (ROC) of a curved side surface can be 1-2 microns, 2-4 microns, 4-6 microns, 6-8 microns, 8-10 microns, or have a range between any of these values and/or have a combination thereof. In various implementations, a sharp corner may have an ROC between 0.01 microns and 0.1 microns, 0.1 micron and 0.4 microns, or 0.4 microns, 0.6 microns or have a value in a range defined by any of these values. In some cases, a curved side surface may comprise a corner having a radius of curvature larger than 0.6 microns, 1 microns, 4 microns, 6 microns or a value in a range defined by any of these values.

FIGS. 7A-7D illustrate simulated 2D electric field distributions over a cross-sectional plane of a transformer similar to the transformer shown in FIGS. 2A and 2B, having top and bottom conductive lines with different cross-sectional shapes. In some cases, such electric field distributions may be associated with a first voltage applied on the primary coil 240 and a second voltage different from the first voltage applied on the secondary coil 250, to generate an electric potential difference between the primary and the secondary coils. The cross-sectional plane (e.g., y-z plane) is perpendicular to the main surface of the substrate 210 and parallel to the winding axis (z-axis) of the transformer 200.

Figure 7A:
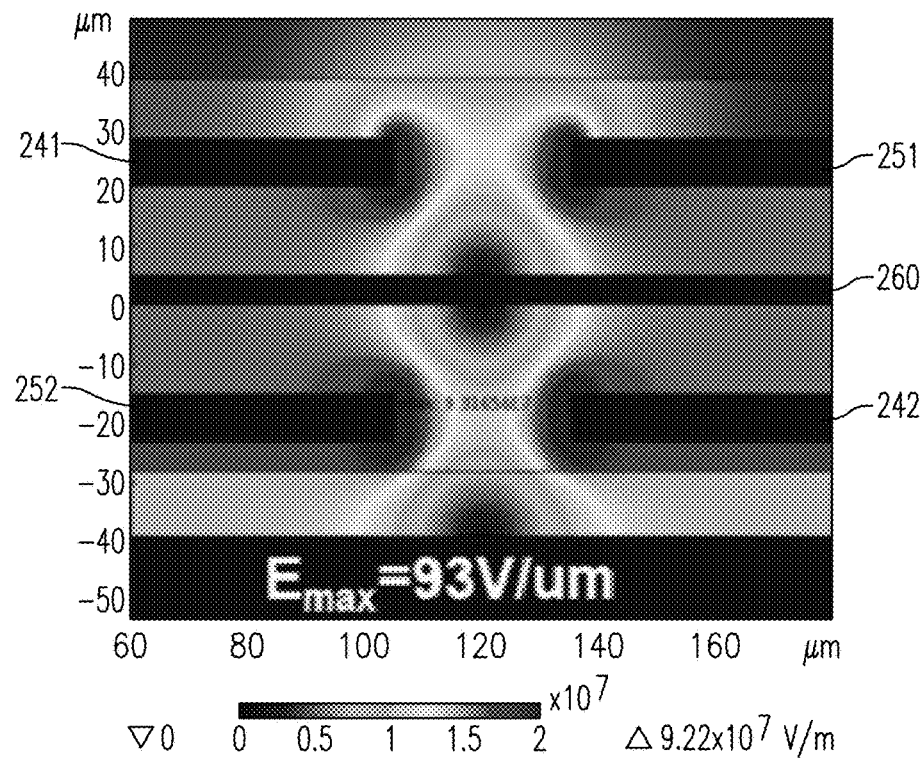
FIG. 7A illustrates electric field distributions over a cross-sectional plane of an integrated transformer (e.g., similar to the transformer shown in FIG. 2B) having top and bottom conductive lines with flat side surfaces, according to a comparative example.

FIG. 7A shows the 2D electric field distribution near the edges of a pair top 241, 251 and bottom 252, 242 conductive lines having sharp top corners (e.g., with ROC of about 0.2 microns), sharp bottom corners (e.g., with ROC of about 0.5 microns) and a vertical side surface with no curvature (similar to the top conductive line 662 shown in FIG. 6G). The maximum magnitude of the E-field in this E-field distribution is about 93 V/micron. As expected, the E-field magnitude is close to the maximum value near the sharp corners.

Figure 7B:
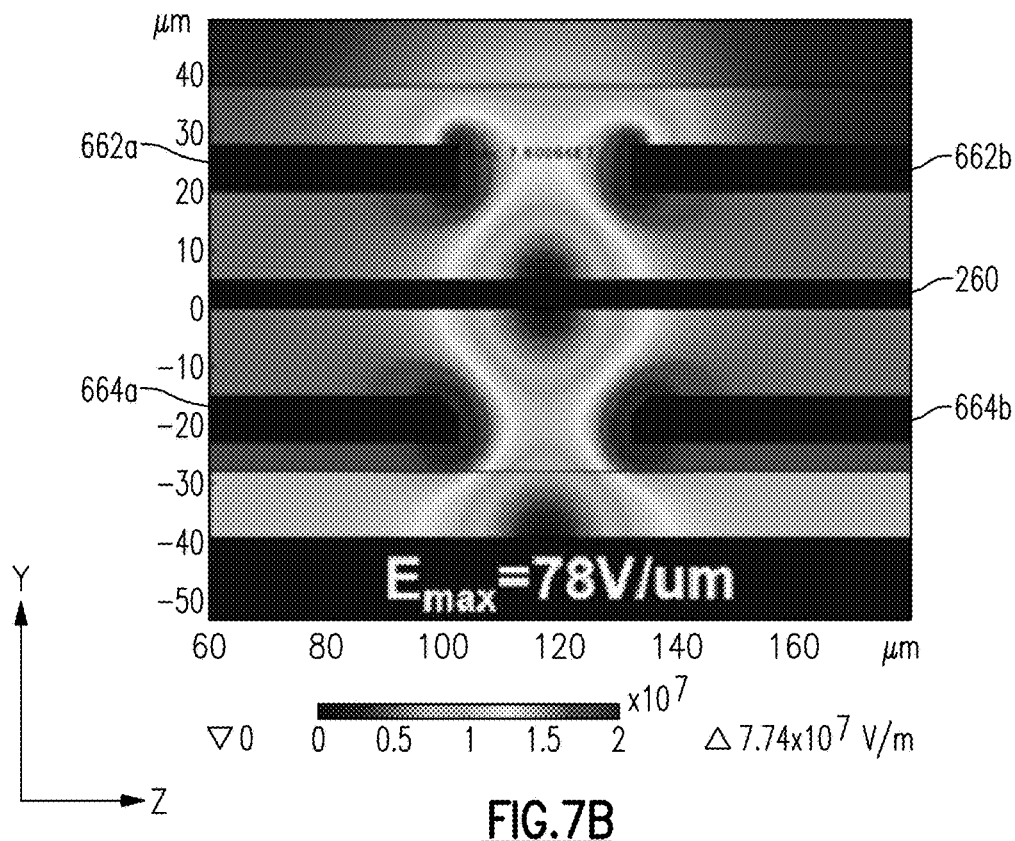
FIGS. 7B-7D illustrate electric field distributions over a cross-sectional plane of integrated transformers (e.g., the transformer shown in FIG. 2B) having top and/or bottom conductive lines with curved side surfaces.

FIG. 7B shows the 2D electric field distribution near the edges of a pair of top 662a,662b and bottom 664a,664b conductive lines similar to the top 662 and bottom 664 conductive lines of the top/bottom conductive line 660 shown in FIG. 6G. The curved side surfaces of the bottom conductive lines 664a, 664b may have ROCs of about 5 microns. The maximum magnitude of the E-field in this E-field distribution is about 78 V/micron that occurs near sharp corners of the top conductive lines 662a/662b. The reduction the value of the maximum E-field magnitude, compared to that of the FIG. 7C, may be associated with the curved side surfaces of the bottom conductive lines 664a/664b.

Figure 7C:
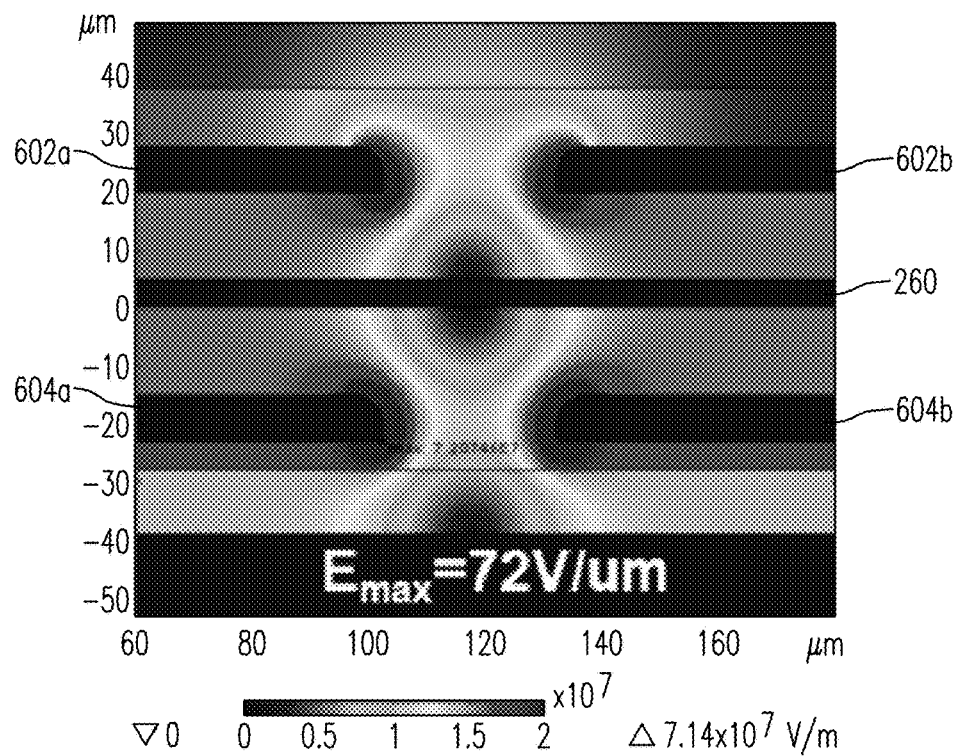

FIG. 7C shows the 2D electric field distribution near the edges of a pair of top 602a/602b and bottom 604a/604b conductive lines similar to the top 602 and bottom 604 conductive lines of the top/bottom conductive line 600 shown in FIG. 6A. The curved side surfaces of the conductive lines may have ROCs of about 5 microns. The maximum magnitude of the E-field in this E-field distribution is about 72 V/m that occurs near the bottom sharp corners of the bottom conductive lines 604a/604b. The reduction of the value of the maximum E-field magnitude, compared to that of the FIG. 7B, may be associated with the curved side surfaces of the bottom conductive lines 604a/604b.

Figure 7D:
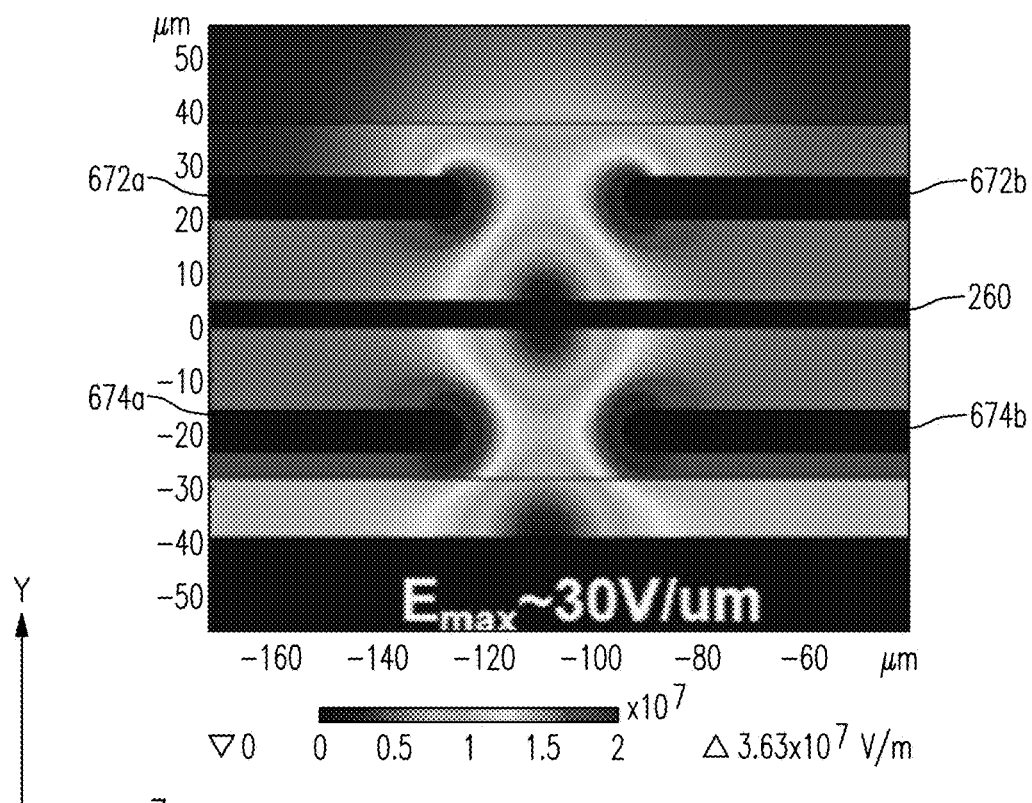

FIG. 7D shows the 2D electric field distribution near the edges of a pair of top 672a/672b and bottom 674a/674b conductive lines similar to the top 672 and bottom 674 conductive lines of the top/bottom conductive lines 670 shown in FIG. 6H. The curved side surfaces of the conductive lines may have ROCs of about 4 microns. The maximum magnitude of the E-field in this E-field distribution is about 30 V/m. The reduction of the value of the maximum E-field magnitude, compared to that of the FIG. 7C, may be associated with the fully curved side surfaces of the top 672a/672b and bottom 674a/674b conductive lines.

Figure 7E:
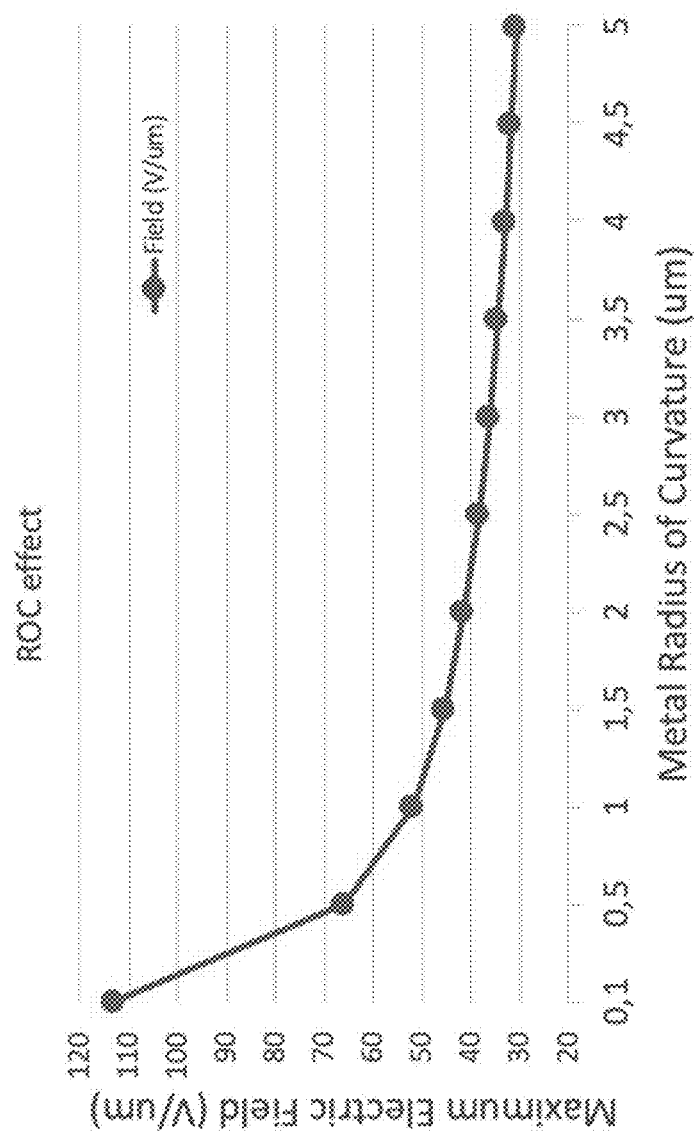
FIG. 7E is a graph showing maximum electric field in an E-field distribution in the vicinity of conductive lines shown in FIG. 7D plotted against the radius of curvature of the side surface of the top conductive line of a turn in an integrated coil.

FIG. 7E shows the maximum E-field from simulated E-field distributions near the edges of the pair of top and bottom conductive lines having fully curved and symmetric side surfaces (e.g., similar to FIG. 6H and FIG. 7D) with identical ROCs, plotted against the corresponding ROC. The ROC is varied from 0.1 microns to 5 microns. An ROC value of less than 0.6 microns may correspond to a sharp corner that may be the radius of curvature of a conductive line fabricated using a conventional fabrication process. An ROC value of larger than 0.5 microns may be correspond to rounded corner or a curved side surface formed by a modified fabrication process configured to provide a curved side (e.g., fully curved) surface having a large ROC. As depicted by the behavior of the Emax in FIG. 7E, increasing the ROC from 0.1 microns to 1 micron or larger values can significantly decrease Emax super-linearly (e.g., exponentially). Further increasing the ROC from 1 microns to 5 microns (and larger), may decrease the Emax substantially linearly. A reduction of Emax from 110 V/micron (when ROC=0.1 microns) to 30 V/micron (when ROC is 5 microns) may increase the operating voltage of a transformer by 3 to 5 times.

Metal Lines Having a Stepped or Sloped Edge Portion

In some implementations, the maximum magnitude of electric field near a conductive line may be reduced (for a given voltage) by decreasing the width of the conductive line along the thickness of the conductive line from a top surface toward a bottom surface that is in contact with a substrate or layer on which the conductive line is disposed. In some such implementations, the width may be decreased step-wise via one or more steps forming a stepped side surface. In such implementations, one or more gaps or undercut sections may be formed below the top surface of the conductive line. In some cases, the width may be decreased linearly to form a sloped or tilted side surface and top corner having an angle less than 90 degrees. In some cases, the slope of a sloped side surface of a conductive line having a width decreasing from the top surface to the bottom surface may be referred to as a "negative slope."

In some implementations, the magnitude of electric field near sharp corners of a conductive line may be decreased by increasing the width of the conductive line along the thickness of the conductive line from a top surface toward a bottom surface that is in contact with a substrate or layer on which the conductive line is disposed. In some such implementations, the width may be linearly increased to form a sloped or tilted side surface and bottom corner having an angle less than 90 degrees. In some cases, the slope of a sloped side surface of a conductive line having a width increasing from the top surface to the bottom surface may be referred to as a "positive slope."

Referring back to FIG. 3A as an illustrative example, the width 341a of the top conductive line 341 (in FIG. 3A) may be decreased along its thickness 341b from top to bottom to form a stepped or a negatively sloped side surface. Alternatively, the width 341a of the top conductive line 341 may be increased from top to bottom to form a stepped or a positively sloped side surface.

In some implementations, a corner or a side surface of a conductive line having a stepped or sloped side surface may be rounded (e.g., having an ROC larger than 1 micron) to further reduce the magnitude of the electric field near the conductive line.

FIGS. 8A-8D illustrate portions (e.g., left side) of cross-sections of conductive lines having stepped or sloped side surfaces.

Figure 8A:
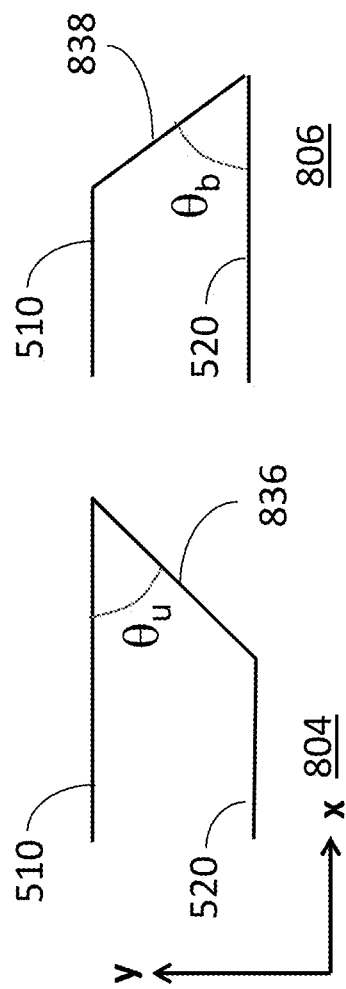
FIG. 8A illustrates a cross-section of a conductive line having a flat side surface with undercut (stepped side surface).

The conductive line 800 illustrated in FIG. 8A has a stepped side surface comprising a single step between a top vertical section having a thickness $d_1$ and a bottom vertical section having a thickness $d_2$. The width of the bottom vertical section can be smaller than that of the top vertical section. The stepped side surface of the conductive line 800 comprises a first side surface section 832 and a second side surface section 830 laterally displaced with respect to the first side surface. The side surface sections 832, 830 may comprise flat or nearly surfaces substantially perpendicular to the bottom surface 520 of the conductive line 800 (e.g., +/−0.1 to +/−5 degrees relative to a nominally 90 degree angle with the bottom surface 520). A lateral distance L (along x-axis) between the first and the second side surface sections 832, 830 can be from 1 micron to 2 microns, 2 to 3 microns, or 3 to 5 microns. In some cases, $d_2$ may be referred to as an "undercut thickness" and L may be referred to as "undercut length" of the conductive line 800.

Figure 8B:
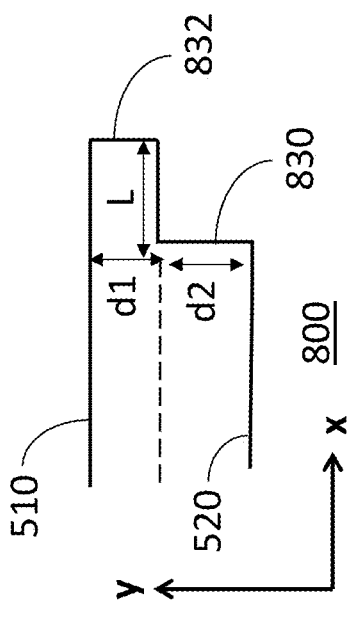
FIG. 8B illustrates a cross-section of conductive line having curved side surface with undercut (curved and stepped side surface).

In some embodiments, a side surface section (e.g., the first side surface section) of a stepped side surface can be a curved side surface section. Advantageously, having a curved side surface section may further reduce the maximum magnitude of the electric field in the vicinity of the stepped side surface. The conductive line 802 in FIG. 8B is an example of a conductive line that comprises a stepped side surface having a curved side surface section. In this example, the first side surface section 834 of the stepped side surface is curved, and the second side surface section is a substantially flat surface 830 substantially perpendicular to the bottom surface 520 (e.g., +/−0.1 to +/−5 degrees relative to a nominally 90 degree angle with the bottom surface 520). The resulting structure may be referred to herein as having a "mushroom" structure.

Figure 8C:
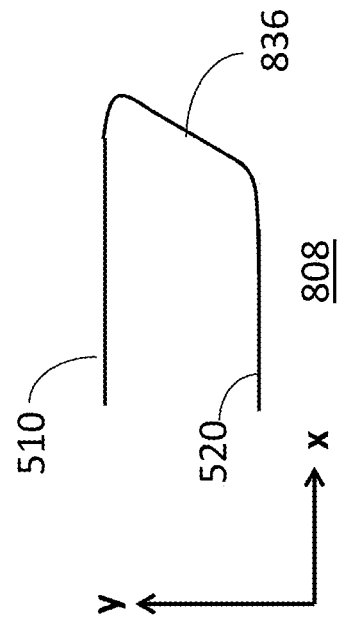
FIG. 8C illustrates cross-sections of two conductive lines having sloped side surfaces.

The conductive lines 804 and 806 illustrated in FIG. 8C have sloped side surfaces. The width of the conductive line 804 substantially linearly increases from the bottom surface 520 toward the top surface 510 forming a top corner angle ($\theta_u$) between the side surface 836 and the top surface 510 that is less than 90 degrees. The width of the conductive line 806 may linearly increase from the top surface 510 toward the bottom surface 510 forming a bottom corner angle ($\theta_b$) between the side surface 838 and the bottom surface 510 having an angle less than 90 degrees. In various implementations, $\theta_u$ and $\theta_b$ may be between 30 to 40 degrees, 40 to 50 degrees, 50 to 60 degrees, 60 to 70 degrees, 70 to 80 degrees, or any other angle less than 90 degrees and having a range defined by any of these values. An acute top corner angle may be described herein as having a negative slope and an acute bottom corner angle may be described herein as having a positive slope. As such, the side surfaces of the conductive lines 804 and 802 have negative and positive slopes, respectively.

Figure 8D:
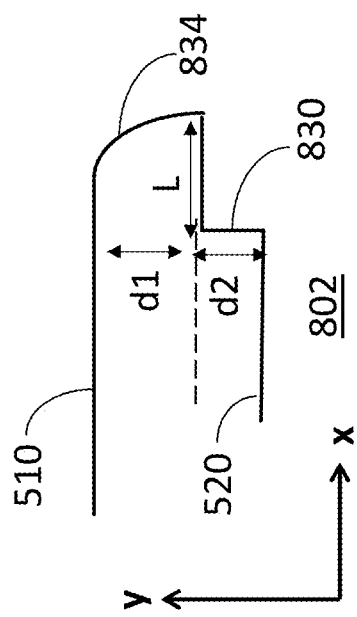
FIG. 8D illustrates a cross-section of conductive line having a sloped side surface with curved edges (curved and sloped side surfaces).

In some examples, one or more corners of a conductive line having a sloped side surface may be rounded corners. In some such cases, the rounded corner may have a radius of curvature (ROC) between 0.1 microns and 0.3 microns, 0.3 microns and 0.5 microns, 0.5 microns and 1 microns, or a value in a range defined by any of these values or larger. The conductive line 808 shown in FIG. 8D, is an example conductive line having a negatively sloped side surface with rounded top and bottom corners.

Figure 9A:
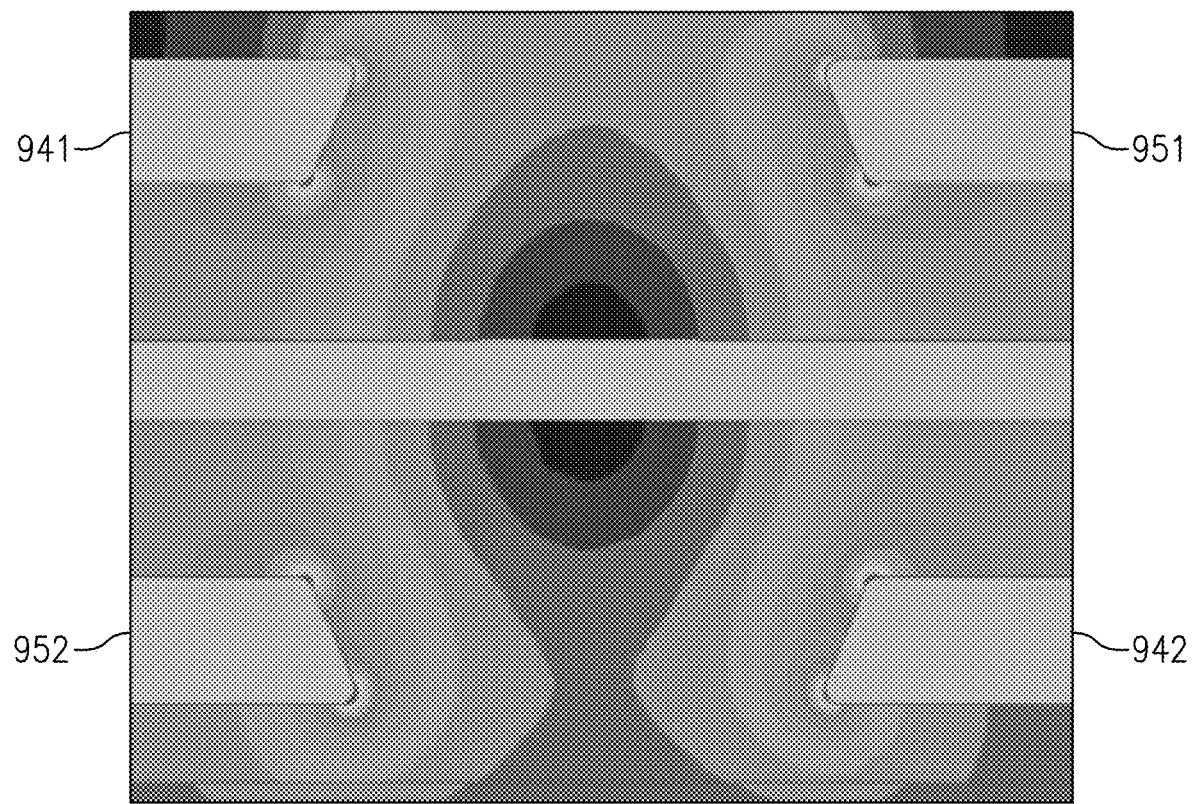
FIG. 9A illustrates electric field distribution over a cross-sectional plane of a transformer (similar to the transformer shown in FIG. 2B) having conductive lines with sloped side surfaces, where the cross-sectional plane is perpendicular to the main surface of the core layer and parallel to the winding axis of the transformer.

FIG. 9A illustrates a simulated electric field distribution over a cross-sectional plane of a transformer similar to the transformer 200 shown in FIGS. 2A and 2B, having top and bottom conductive lines with sloped side surfaces. The cross-sectional plane is perpendicular to the main surface of the core layer of the substrate. A top conductive line 941 and bottom conductive line 942 of the primary coil and a top conductive line 951 and a bottom conductive line 952 of the secondary coil are shown in FIG. 9A. In this example, the top conductive lines 951, 941 have sloped side surfaces having negative slopes, and the bottom conductive lines 952, 942 have sloped side surface having positive slopes. In some implementations, having negatively sloped top conductive lines and positively sloped bottom conductive lines may result in a smaller maximum E-field magnitude near a pair of top and bottom conductively lines, compared to pairs of sloped top and bottom conductive lines having other combinations of positive and negative slopes. In some cases, the top corner angle ($\theta_u$) of the top conductive lines 941/951 and the bottom corner angle ($\theta_b$) of the bottom conductive line 952/942 may be between 70 and 75 degrees. In some such cases, the maximum magnitude of the E-field in the E-field distribution between the illustrated conductive lines may be lower than that of the conductive lines having top and bottom corner angles less than 70 degrees or larger than 75 degrees.

In some example, the operating voltage of a transformer (e.g., a transformer similar to the transformer 200 (FIGS. 2A-2C) or 400 (FIGS. 4A-4B)), having top and conductive lines similar to those shown in FIG. 9A and having top and bottom corner angles between 70 and 75 degrees, may increase between 10% to 15% compared to other transformers fabricated based on conductive lines with vertical or nearly vertical flat side surfaces.

Figure 9B:
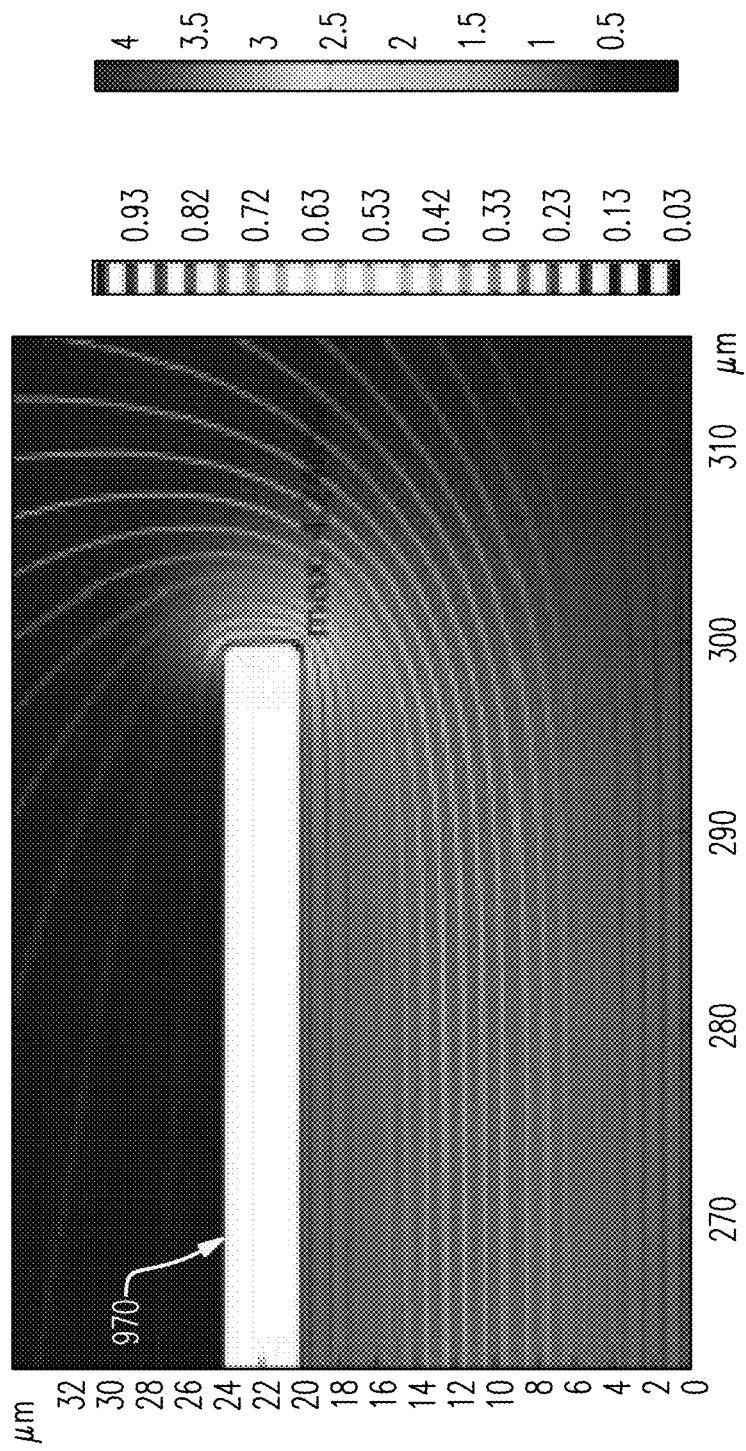
FIGS. 9B-9D illustrate electric field distributions over a cross-sectional plane of a conductive line having a sloped side surface. The cross-sectional plane is perpendicular to the main surface of the core layer and parallel to the winding axis of the transformer.
Figure 9C:
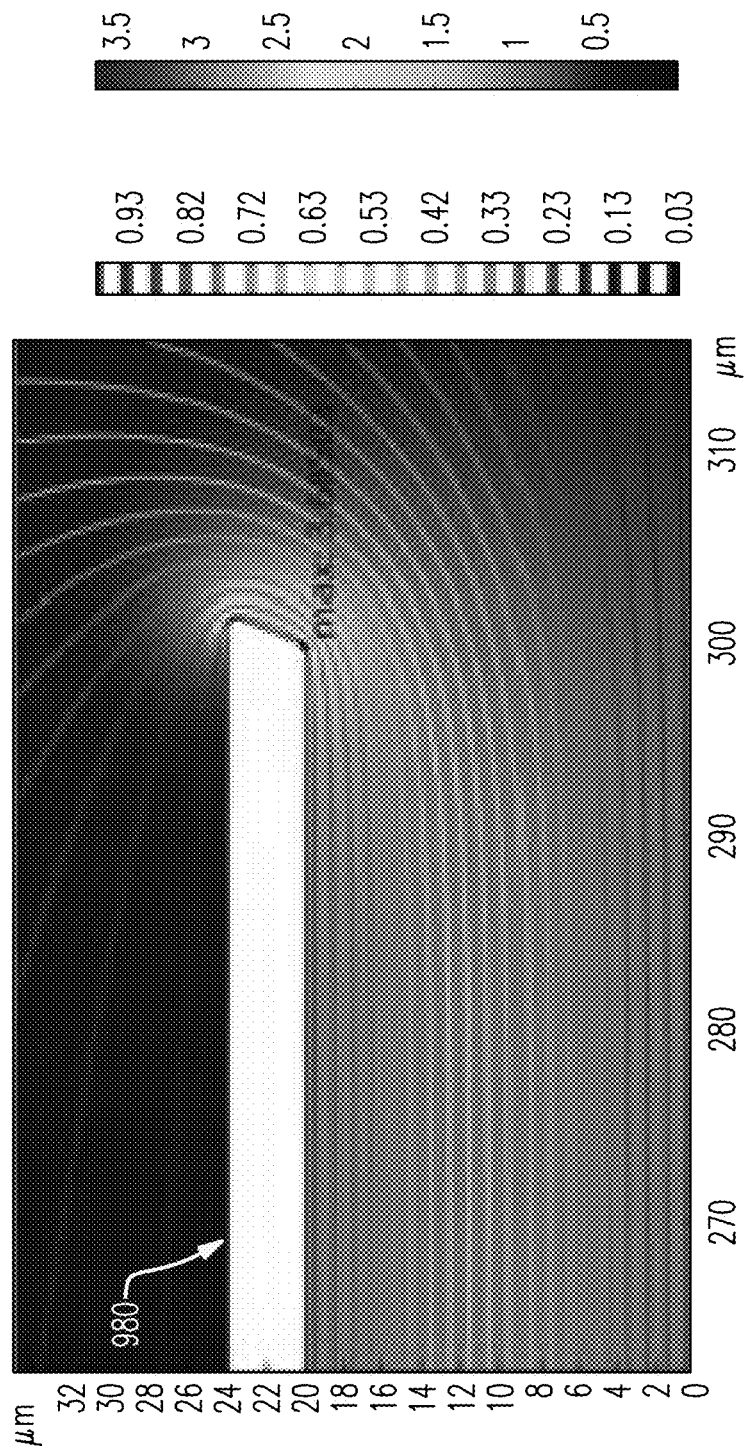
Figure 9D:
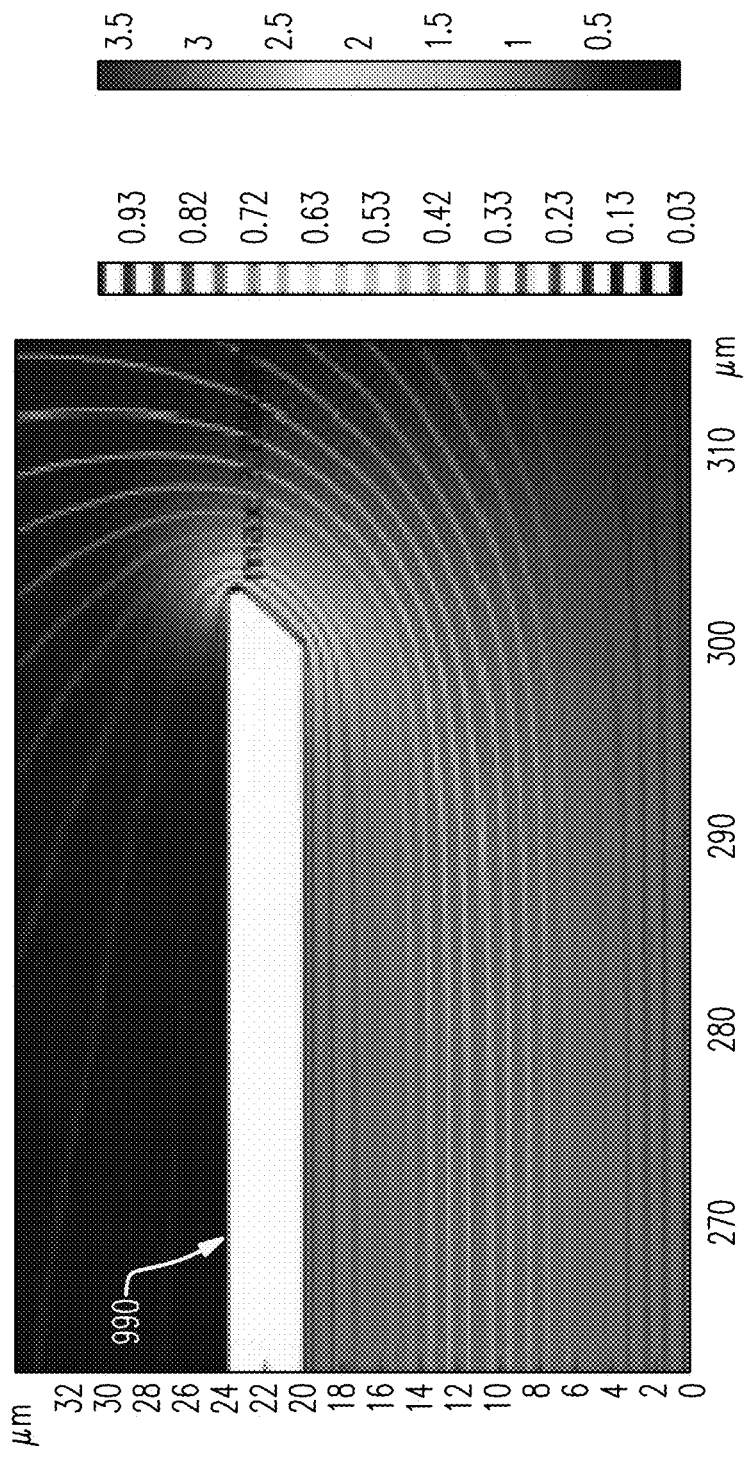

FIGS. 9B-9D illustrate calculated equipotential lines near three conductive lines 970/980/990 having side surfaces with different angles. The equipotential lines are calculated based on a voltage difference of 1 volt between each conductive line and a ground plane (not shown) below the respective conductive line. In the example shown, the ground plane is parallel to each conductive line and a distance between the bottom surface of each conductive line and a top surface of the ground plane along a direction perpendicular to bottom surface of the conductive line, is 20 microns. Conductive line 970 (FIG. 9B) has a flat vertical side surface. Conductive lines 980 (FIG. 9C) and 990 (FIG. 9D) have negatively sloped side surfaces (similar to the conductive line 804, FIG. 8C), having a top corner angle ($\theta_u$) of 65 degrees and 45 degrees respectively. The maximum electric field magnitude near the conductive lines 970, 980, and 990 are 4.24×0.05 V/micron, 3.68×0.05 V/micron, and 3.88××0.05 V/micron. The maximum electric field magnitudes are reported with respect to the capacitor plate field of 0.05 V/micron. The capacitor plate field can be the magnitude of a uniform electric field between a very large conductive surface and the top surface of a very large ground plane away from the edges of the both surfaces, assuming the conductive surface is parallel to the top surface of the ground plane and a vertical distance between the two surfaces is 20 microns. These results indicate that for a given voltage, maximum electric field magnitude near a conductive line having a sloped side surface may be smaller than the maximum electric field magnitude near a conductive line having a vertical side surface.

Figure 10:
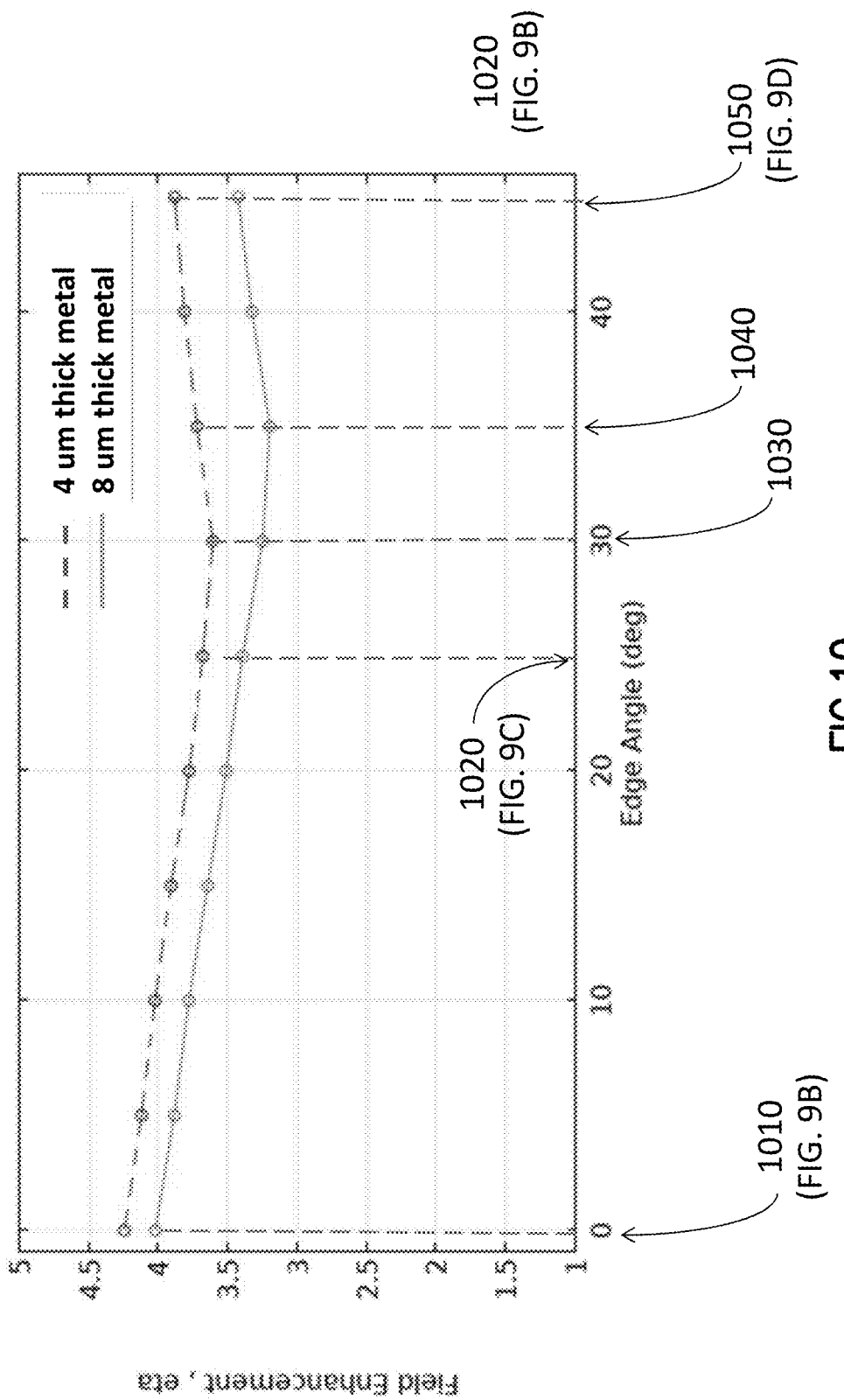
FIG. 10 illustrates a calculated electric field enhancement factor plotted against the edge angle (side surface angle) of a conductive line similar to the conductive line shown in FIG. 8D, for two values of the conductive line thickness.

FIG. 10 is a plot showing an E-field enhancement factor calculated for two conductive lines similar to the conductive line 808 (FIG. 8D), as a function of top edge angle. The E-field enhancement factor may be a factor by which the maximum magnitude of the E-field near a corner is larger than the capacitor plate field (described above). The top edge angle and the top corner angle ($\theta_u$) are complementary angles (i.e., to edge angle=90 degrees–$\theta_u$). The first conductive line (blue curve) has a thickness of 4 microns and the second conductive line (green curve) has a thickness of 8 microns. The data points on the blue curve calculated at edge angles 1010, 1020 and 1050, are associated with the E-field distributions for conductive lines 970, 980, and 990 (in FIGS. 9B, 9C, and 9D) respectively. As depicted by the plots, for each conductive line thickness, increasing the edge angle from 0 degrees 1010 to a minimum field angle (1040 for the green curve and 1030 for the blue curve) reduces the E-field enhancement factor, while further increasing the edge angle above the minimum field angle increases the E-field enhancement factor. As such, in order to obtain the smallest possible maximum E-field magnitude near a conductive line having a sloped angle, the corresponding edge angle may be selected to be equal to the minimum field angle where minimum field angle is determined at least in part based on the specific thickness. In some examples, the edge angle of a negatively sloped conductive line in a coil or a transformer may be designed to be equal or close to a calculated minimum field angle for the conductive line. In some such examples, the operating or working voltage of the transformer may increase by 5%, 10%, 15%, 20% or a larger ratios compare to a transformer having conductive lines with nearly vertical and nearly flat side surfaces.

FIG. 11A-11F illustrate calculated electric field distribution over a cross-sectional plane of six example conductive lines having a curved side surface or side surface section. The conductive line 1102 (FIG. 11A) is similar to the conductive line 512 (FIG. 5B), and conductive lines 1104, 1106, 1108. 1110, 1112 are mushroom structures similar to the conductive line 802 (FIG. 8B) with different values of undercut thickness ($d_2$) and undercut length (L) corresponding to different values of the ratio between $d_2$ and L ($d_2/L$). The impact of the different values of $d_2$, L, and different values of $d_2/L$, may be quantified by comparing the E-field magnitude at the two corners of each conductive line.

Figure 11A:
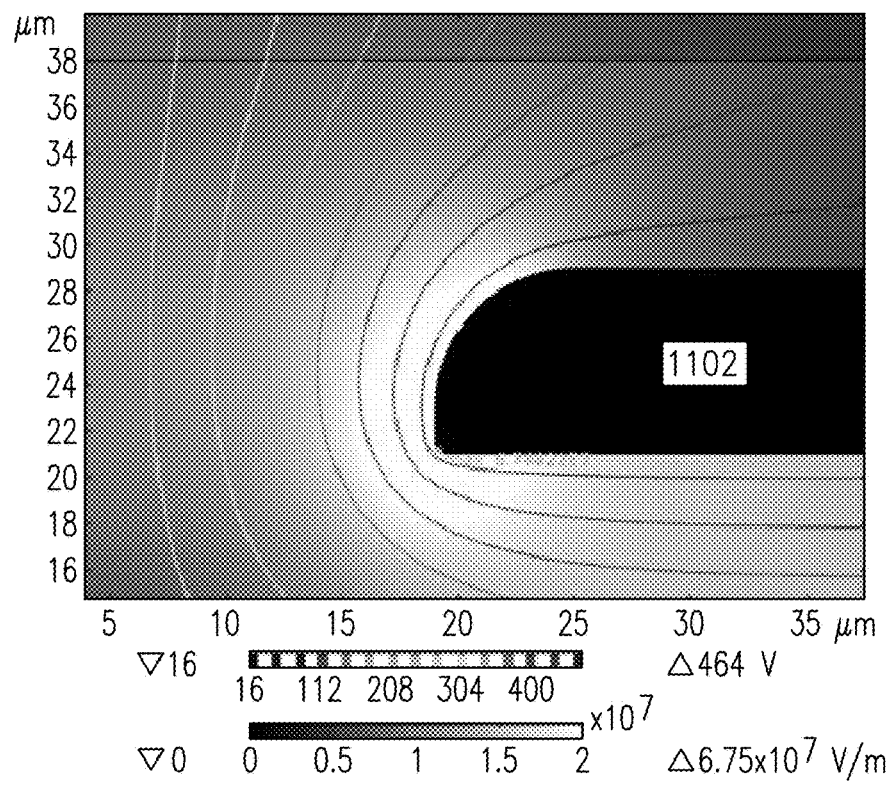
FIG. 11A illustrates electric field distribution over a cross-sectional plane of a conductive line having a curved surface. The cross-sectional plane is perpendicular to the main surface of the core layer and parallel to the winding axis of the transformer.
Figure 11B:
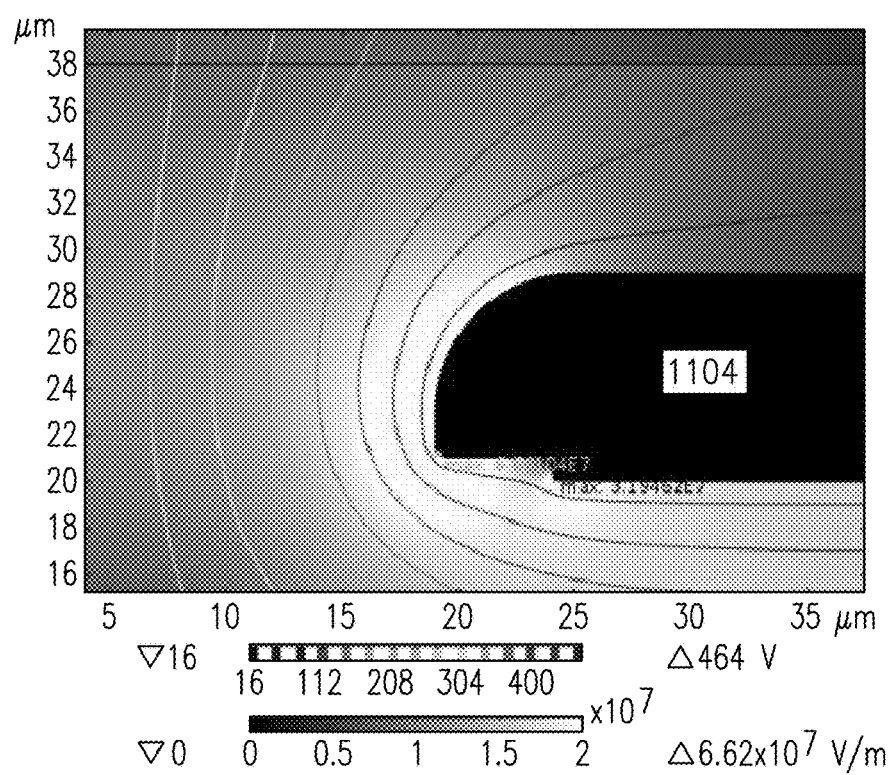
FIGS. 11B-11F illustrate electric field distributions over a cross-sectional plane of conductive lines having a stepped side surface with a curved portion and a flat portion. The cross-sectional plane is perpendicular to the main surface of the core layer and parallel to the winding axis of the transformer.
Figure 11C:
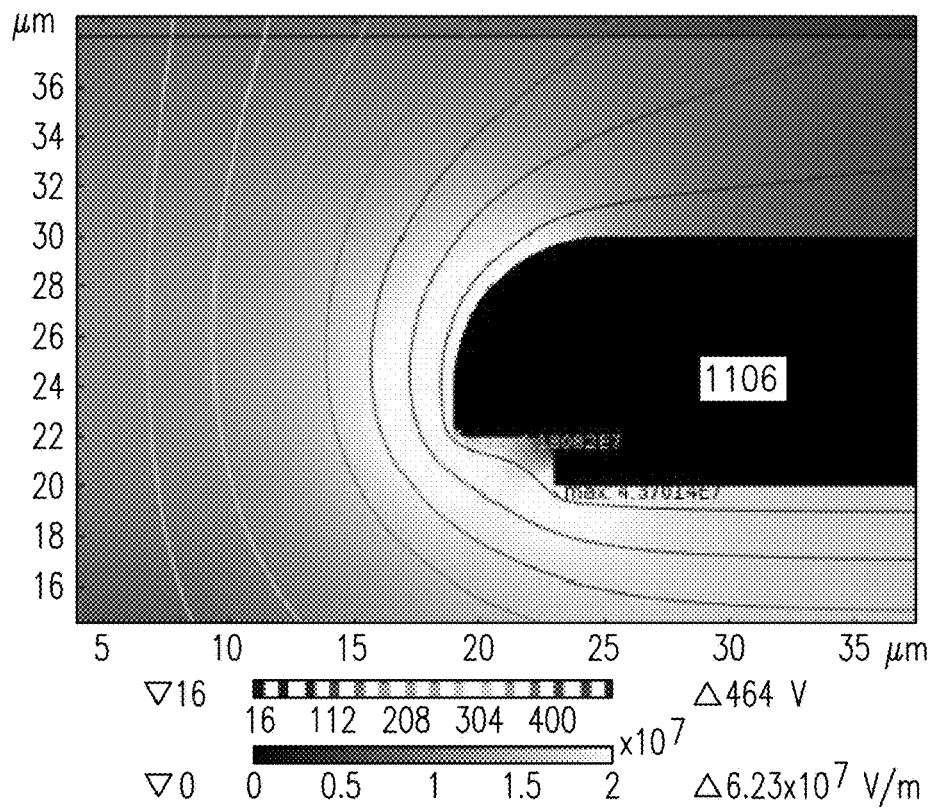
Figure 11D:
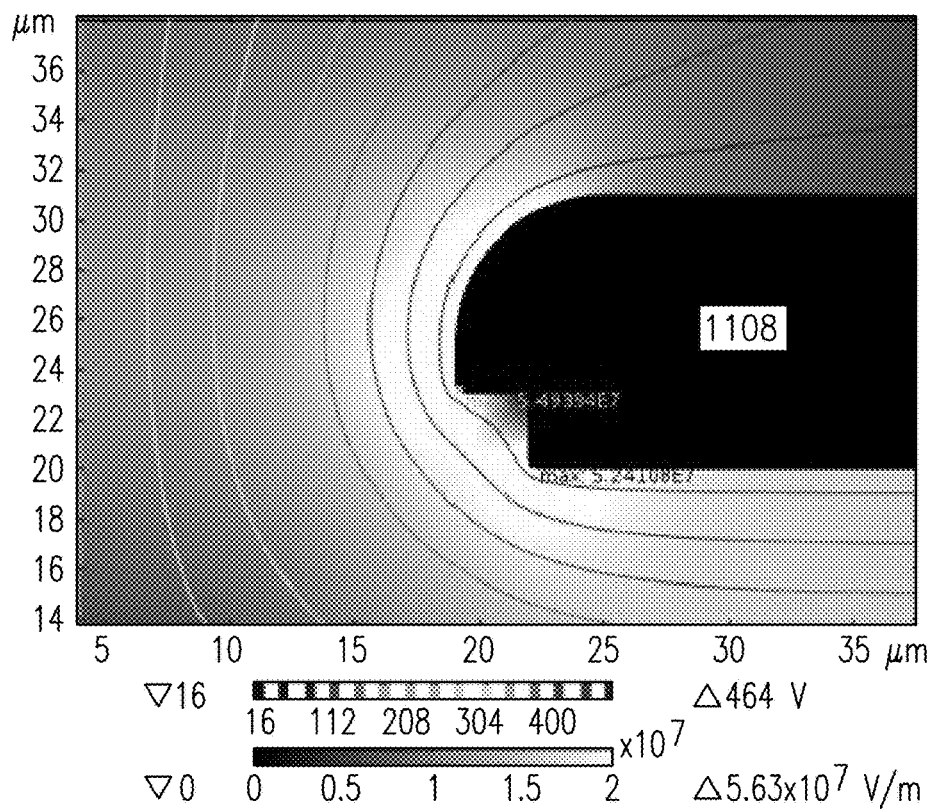
Figure 11E:
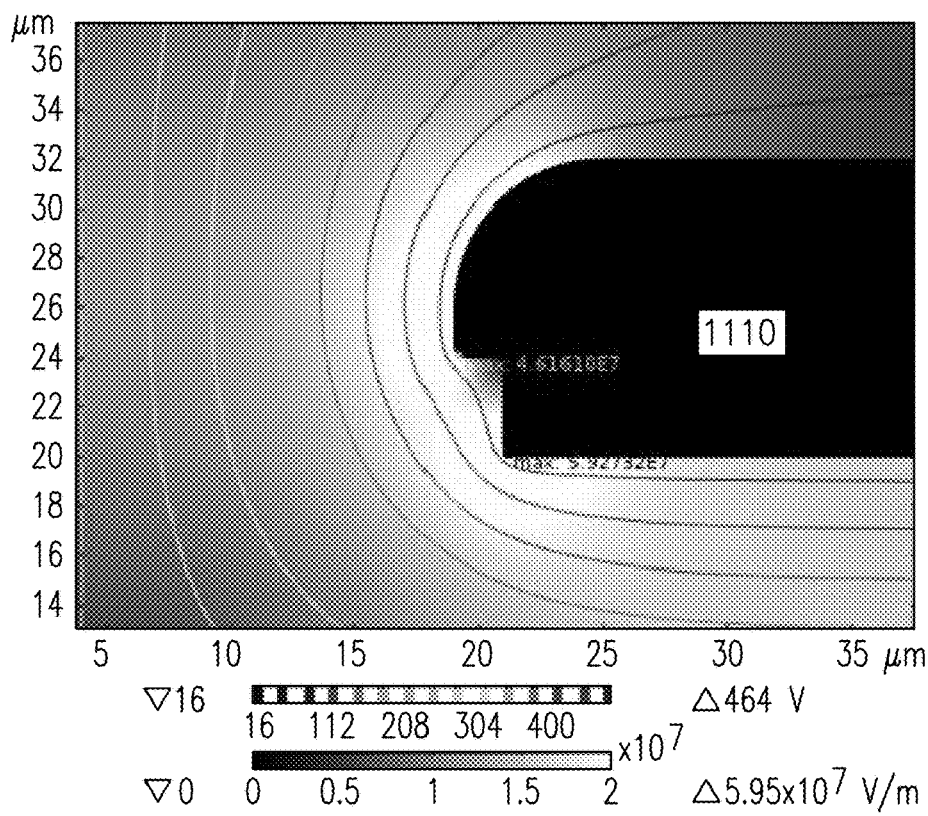
Figure 11F:
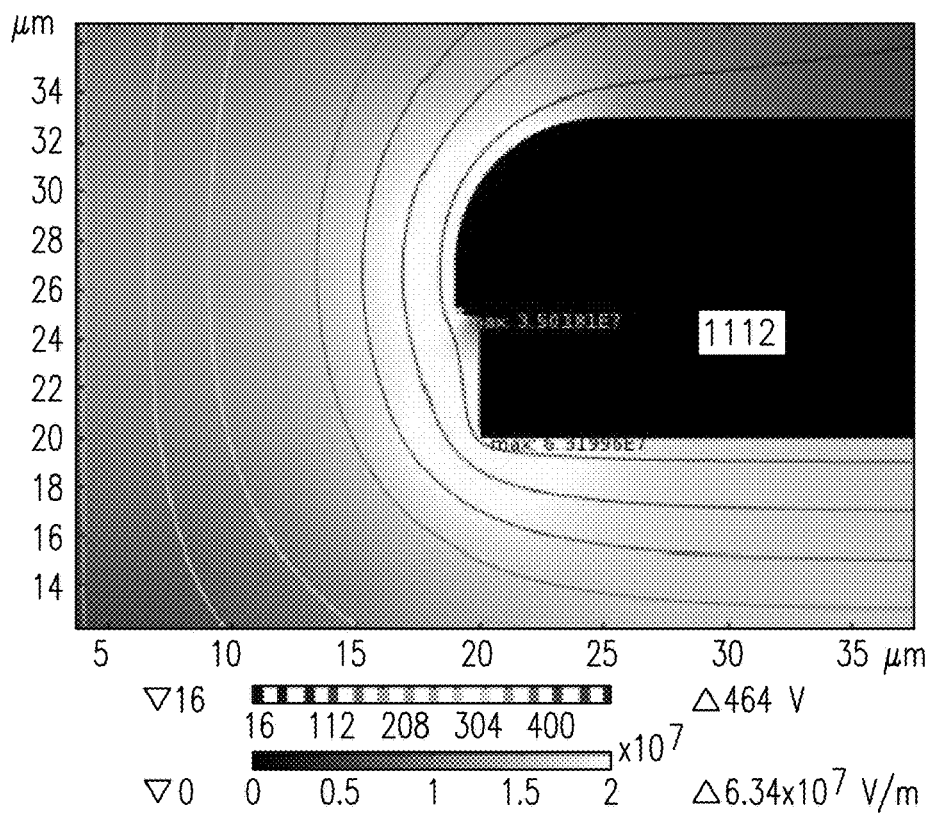
Figure 12A:
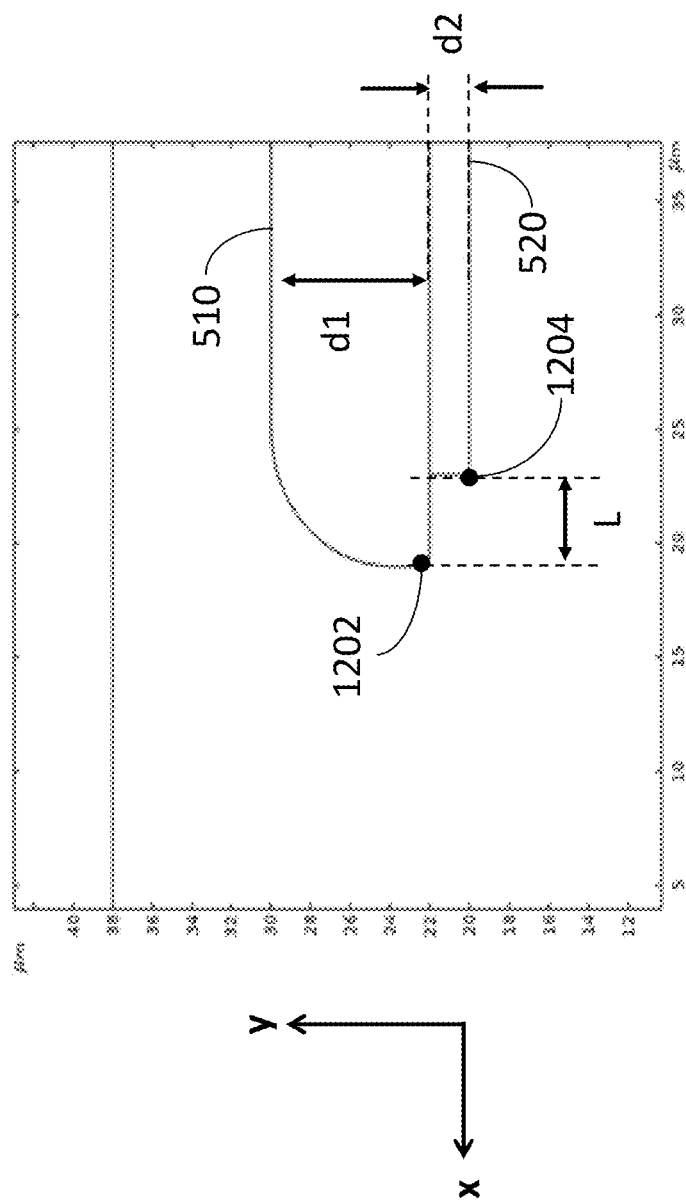
FIG. 12A illustrates a cross-section of the conductive line having a curved stepped side surface depicting a top corner and a bottom corner of the corresponding side surface.

FIG. 12A is a diagram representing a cross-section of the conductive lines 1102, 1104, 1106, 1108, 1110, 1112 (FIGS. 11A-11F), including a top corner 1202 corresponding to the curved side surface section and a bottom corner 1204 corresponding to the flat side section. Since for the conductive line 1102 $d_{2=0}$, the conductive line 1102 has only one corner 1202. The conductive lines 1104, 1106, 1108, 1110, and 1112 each comprise two sharp corners, one at an edge of the top vertical section and one at an edge of the bottom vertical section; as such, two local maximum magnitudes of E-field may exist near the side surface of each of these conductive lines. In order to increase the operating voltage of a device (e.g., a coil or a transformer), in which one or more conductive lines have a shape similar to that of the conductive line 802, the global maximum of the E-field magnitude may be lowered or minimized. As described below, $d_2/L$ may be used as a design parameter to find a geometry that supports an E-field distribution with the lowest value of global maximum E-field magnitude for a given electric potential applied on the conductive line.

Figure 12C:
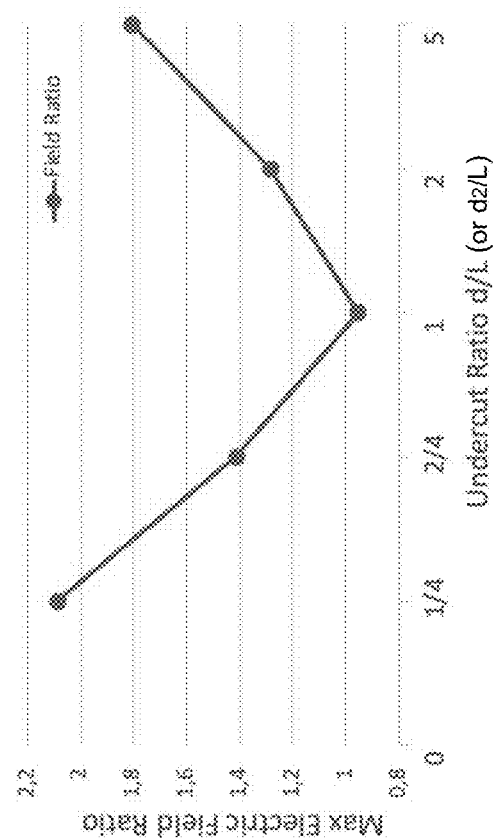
FIG. 12C illustrates the calculated ratio between the magnitude of the E-field at the top corner and magnitude of the E-field at the bottom corner of the conductive line shown in FIG. 12A plotted against the ratio between undercut thickness and undercut length ($d_2$/L).
Figure 12B:
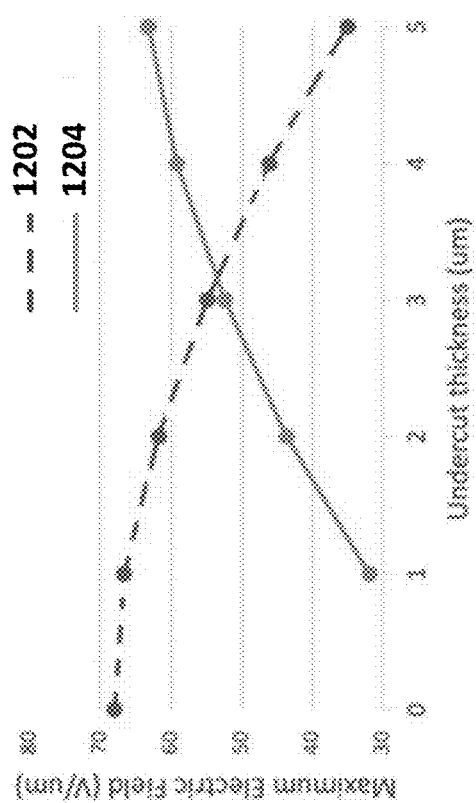
FIG. 12B illustrates the calculated magnitude of the E-field at the top corner and at the bottom corner of the conductive line shown in FIG. 12A.

FIG. 12B shows the calculated magnitude of the E-field at top corner 1202 (blue line) and at the bottom corner 1204 (orange line), plotted as a function of undercut thickness ($d_2$) for $d_2$=0 (conductive line 1102, FIG. 11A), $d_2$=1 micron (conductive line 1104, FIG. 11B), $d_2$=2 microns (conductive line 1106, FIG. 11C), $d_2$=3 microns (conductive line 1108, FIG. 11D), $d_2$=4 microns (conductive line 1110, FIG. 11E), and $d_2$=5 microns (conductive line 1112, FIG. 11F). The curves in FIG. 12B indicate that in the absence of the undercut or a step ($d_2$=0, similar to conductive line 512 or 1102), the maximum E-field (global maximum) near a conductive line having a rounded side surface is larger than the global maximum E-field near a conductive line having an additional stepped side surface section. As such, adding a stepped side surface section (e.g., having a flat surface substantially perpendicular to the bottom surface of the conductive line) to a rounded side surface apparently reduces the maximum E-field maximum near a conductive line.

As FIG. 12B further indicates, increasing $d_2$ decreases the E-field at the top corner 1202 and increases the E-field at the bottom corner 1204. FIG. 12C shows the ratio between calculated ratio between the magnitude of the E-field at top corner 1202 (Et) and magnitude of the E-field at the bottom corner 1024 ($E_b$), plotted as a function of the ratio between undercut thickness and undercut length ($d_2/L$) for $d_2/L$=1/4 (conductive line 1104, FIG. 11B), $d_2/L$=2/4 (conductive line 1106, FIG. 11C), $d_2/L$=1 (conductive line 1108, FIG. 11D), $d_2/L$=2 (conductive line 1110, FIG. 11E), and $d_2/L$=5 microns (conductive line 1112, FIG. 11F). The behavior of the E-field ratio ($E_t/E_b$) depicted in FIG. 12C shows that when $d_2/L$<1 the E-field ratio decreases and when $d_2/L$>1 the E-field increases by increasing $d_2/L$. At $d_2/L$=1, E-field ratio is minimized.

The calculated E-field values at the top corner 1202 and the bottom 1204 corner, and the corresponding values of L, $d_2$ and $d_2/L$, are shown in Table 1.

TABLE 1

| L (μm) | d (μm) | $E_{max}$ at 1202 (V/μm) | $E_{max}$ at 1204 (V/μm) |
| --- | --- | --- | --- |
| 0 | 0 | 67.9 | — |
| 1 | 5 | 66.6 | 31.9 |
| 2 | 4 | 61.8 | 43.7 |
| 3 | 3 | 54.9 | 52.4 |
| 4 | 2 | 46.1 | 59.2 |
| 5 | 1 | 35.0 | 63.2 |

These calculations indicate that for conductive lines having a cross-sectional shape similar to the conductive lie 802, the E-field magnitude and the E-field ratio ($E_t/E_b$) can be controlled by $d_2/L$ and at specific value of $d_2/L$ (e.g., $d_2/L=1$), $E_t$ becomes substantially equal to $E_b$. Given that variation rate of $E_t$ is opposite to the variation of $E_b$ with respect $d_2/L$, when $E_t=E_b$ (e.g., at $d_2/L$) the global maximum of E-field magnitude near in the corresponding side surface has its lowest value. As such, in some embodiments, $d_2/L=1$ may define one of the optimal geometries of a conductive line having a shape similar to conductive line 802 (FIG. 8B).

The behavior of the E-field distribution near the side surfaces described above suggest that shaping a conductive line to include stepped side surfaces may be used as an alternative or complementary design strategy for reducing the maximum E-field near a conductive line (e.g., in addition to rounding a side surface of the conductive line). In various embodiments, a conductive line of a coil or a transformer may have shape similar to conductive line 802 (FIG. 8B or 12A) having a $d_2/L$ ratio from 0.3 to 0.7, 0.7 to 0.9, 0.9 to 1, 1 to 1.1, 1.1. to 1.3, or any values in between these ranges, or larger or smaller.

In some cases, adding more steps to the side surface of the conductive line 800 or 802 may further decrease the maxim E-field in a E-field distribution around the conductive line. FIG. 13A illustrates a cross-sectional portion of an example conductive line 1300 having a stepped side surface. The illustrated configuration of the conductive line comprises three vertical sections: a top vertical section comprising a curved side surface 834, a middle vertical section comprising a first flat side surface 830, and a bottom vertical section comprising a second flat side surface 1340, where the first and second side surfaces 830, 1340 are substantially perpendicular to the bottom surface 520 of the conductive line (e.g., +/−0.1 degrees to +/−5 degrees relative to a nominally 90 degree angle with the bottom surface 520). In this example, an average width of the top vertical section is larger than a width of the middle vertical section, and the width of the middle vertical section is larger than a width of the bottom vertical section. The three vertical sections form a side surface having two steps. In some implementations, the maximum E-field near the conductive line 1300 may be smaller compared to that of the conductive line 802. The additional step in the side surface of the conductive line 1300 introduces two additional design parameters: the length of the second undercut (L2) and the thickness of the third vertical section ($d_3$). In some cases, $d_1$, $d_2$, $d_3$, L1, L2, and ratios between them may be used to find an optimal geometry that results in an E-field distribution near the conductive line with the smallest global maximum E-field. In some cases, the E-field distribution near the conductive line 1300 may comprise three local E-field maximums at the three edges in the side surface of the conductive line 1300.

In some examples, the ratios $d_2/L1$ and $d_3/L2$ can be from 0.3 to 0.7, 0.7 to 0.9, 0.9 to 1, 1 to 1.1, 1.1. to 1.3, or any values in between these ranges, or larger or smaller. In some such examples, tailoring the side surface geometry such that $d_2/L1$ is substantially equal to $d_3/L2$ and both ratios are between 0.8 and 0.9, 0.9 and 1, 1 and 1.1, or 1.1, to 1.2 or any values in between these ranges, may result in the lowest global maximum E-field (possibly lower than that of the E-field distribution around the conductive line 802). In some examples, a difference between $d_2/L1$ and $d_3/L2$ can be less than 5%, less than 3%, or less than 1%.

Figure 13B:
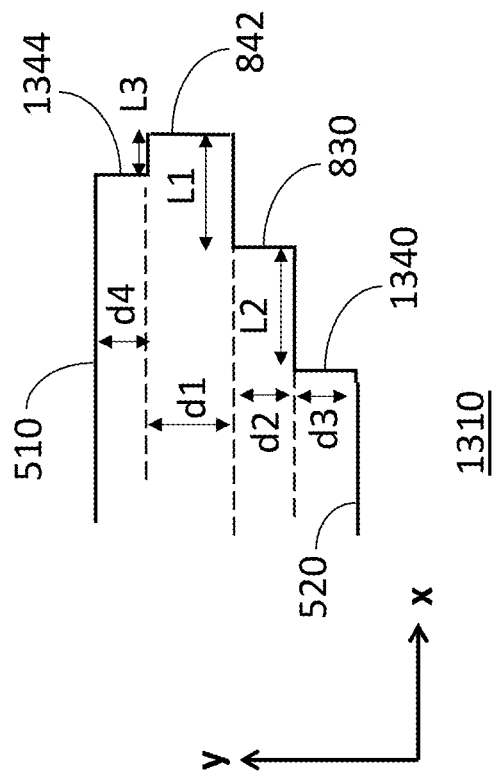
FIG. 13B illustrates a cross-sectional portion of an example conductive line having a stepped side surface with three steps and without any curved side section.
Figure 13A:
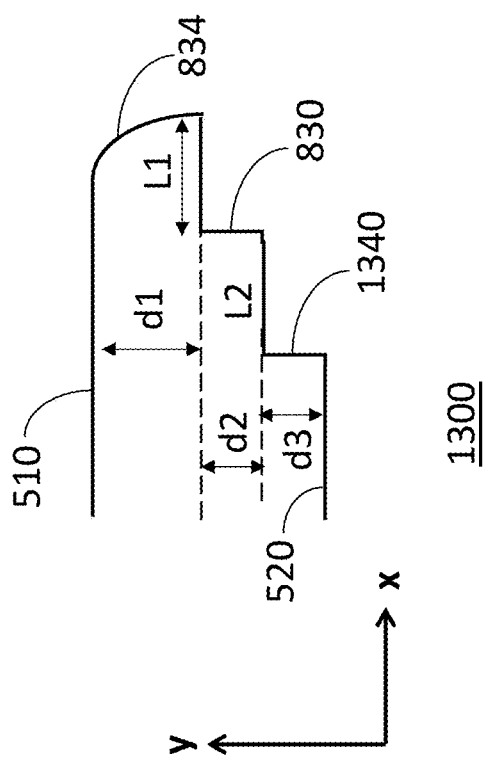
FIG. 13A illustrates a cross-sectional portion of an example conductive line having a curved and stepped side surface with two steps.

FIG. 13B illustrates a cross-sectional portion of another example of conductive line 1310 having a stepped side surface while omitting a curved side section. The conductive line 1310 line comprises four vertical sections: a top vertical section comprising a first flat side surface 1344, a first middle vertical section comprising a second flat side surface 842, a second middle vertical section comprising a second flat side surface 830, and a bottom vertical section comprising a third flat side surface 1340, where the flat side surfaces are all perpendicular to the bottom surface 520 of the conductive line (e.g., +/−0.1 degrees to +/−5 degrees relative to a nominally 90 degree angle with the bottom surface 520). In this example, a width of the top vertical section is smaller than a width of the first middle vertical section, and the width of the first middle vertical section is larger than a width of a width of the second middle vertical section, and the width of the second middle vertical section is larger than a width of the bottom vertical section. The four vertical sections form a side surface having three steps. In some implementations, the maximum E-field near the conductive line 1310 may be smaller compared to that of the conductive line 802 (FIG. 8B). The additional step in the side surface of the conductive line 1310 introduces two additional design parameters compared to those of the conductive line 1300: the length of the first step (L3) and the thickness of the first vertical section (d4). In some cases, d1, d2, d3, d4, L1, L2, L3 and the ratios between them may be used to find an optimal geometry that results in an E-field distribution near the conductive line 1310 with the smallest global maximum E-field. In some cases, the E-field distribution near the conductive line 1310 may comprise four local E-field maxima at the four edges in the side surface of the conductive line 1310. In some such examples, tailoring the side surface geometry such that d2/L1≅d3/L2≅d4/L3, d2/L1≅d3/L2, d2/L1≅d4/L3, or d3/L2≅d4/L3 may result in the lowest global maximum E-field (possibly lower than that of the E-field distribution around the conductive line 802 (FIG. 8B)).

In some cases, the number of steps (or vertical sections) and the widths of different vertical sections in the conductive line 1300 or conductive line 1310, may be used as design parameters to minimize the maximum magnitude of E-field near these conductive lines. For example, a conductive line may have curved top vertical section and or more steps.

In various implementations, one or more of the conductive lines used in an integrated transformer (e.g., transformer 200 or 400), may have a cross-sectional shape similar to the conductive line 1300 or the conductive line 1310.

Advantageously, a fabrication process of the conductive line 1310 (FIG. 13B) that results in all of its side surfaces being substantially flat and vertical may be simpler compared to the fabrication process for fabricating the conductive line 1300 (FIG. 13A). As such, the cross-sectional design of the conductive line 1310 may be used to increase the operating voltage of various integrated electronic devices by reducing the maximum E-field near the conductive lines serving as interconnects, coils, transformers or other passive electronic devices.

In various implementations, the cross-sectional designs described above with respect to FIG. 5A to FIG. 13B, may be implemented in the design of the conductive lines used to fabricate the transformer 200 (FIGS. 2A-2C), transformer 400 (FIGS. 4A-4B), or similar transformers used in isolators (e.g., galvanic isolators).

Fabrication Method of Metal Lines Having an Electric Field Reducing Structure

In the following, with respect to FIGS. 14A-14H, an example process of forming a monolithic transformer similar to transformer 200 (FIGS. 2A-2C) with the cross-sectional structure shown in FIG. 3D is described. While FIGS.

14A-14H illustrate an example method for fabricating one exemplary structure, it will be appreciated that other structures described herein can be fabricated using a similar or analogous process.

FIGS. 14A-14H illustrate intermediate structures 1400A-1400H, respectively, at various stages of fabrication of a transformer structure on a bottom layer or substrate 1410, according to some example processes.

Referring to the intermediate structure 1400A of FIG. 14A, in some cases, the transformer may be fabricated on a bottom layer 1410. A masking layer 1420 is formed (disposed) on the bottom layer 1410 to define a pattern (FIG. 14B) which exposes areas in which conductive lines (e.g., conductive lines 352 and 342) are subsequently electroplated (FIG. 14C). In some implementations, a seed layer (not shown) is formed on bottom layer 1410 (e.g., on the top surface of the bottom layer 1410) prior to forming the masking layer 1420. In some implementations, an adhesion layer (not shown) is formed on the bottom layer 1410, followed by formation of the seed layer. In some cases, the adhesion layer may comprise TiW (Titanium tungsten), or Ru and the seed layer may comprise Au, Cu, Al, Ru. The masking layer may comprise an organic resist material, e.g., a photosensitive resist.

In some cases, the bottom layer 1410 can be a substrate (e.g., substrate 220 in FIG. 3D). In some cases, the bottom layer 1410 may comprise one or more sub-layers. In some examples, the bottom layer 1400 may comprise a buffer layer disposed on a substrate. In some of such examples, the buffer layer may comprise two or more different dielectric layers. In some other cases, the bottom layer 1410 can be a layer in a multilayer integrated circuit.

Referring to the intermediate structure 1400B of FIG. 14B, the masking layer 1420 is patterned to form a patterned masking layer 1422 that includes one or more openings for forming the bottom conductive lines by electroplating. In the example shown, the patterned masking layer 1422 includes two openings 1424, 1426. In some cases, the openings 1424 and 1426 may have different geometries. In some implementations, the masking layer 1420 is patterned using lithography (e.g., e-beam lithography or photolithography). For example, the masking layer may be irradiated (e.g., exposed to ultraviolet light) using a mask and then developed to form the openings. In some cases, the openings may expose a seed layer disposed on the bottom layer 1410. In some cases, the openings may expose a region of the bottom layer 1410 and the seed layer, the barrier layer, and/or the adhesion layer may be disposed on the exposed region of the bottom layer 1410.

Referring to the intermediate structure 1400C of FIG. 14C, bottom conductive lines 352 and 342 may be formed by electroplating the openings 1424 and 1426 on the patterned masking layer 1422. In some cases, conductive lines 352 and 342 may be shaped in accordance with or conformity with the shapes of the openings 1424 and 1426 respectively (e.g., the shapes of or more sidewalls of the openings 1424 and 1426). The conductive lines 352 and 342 may include a suitable plated metal such as Au, Cu, Ni and Sn, to name a few. In some cases, the conductive lines 352 and 342 may be formed on a portion of the seed layer, or the barrier layer at the bottom of opening 1424 and 1426. In some such cases, the conductive lines 352 and 342 may comprise the portion of the seed layer on which they are electroplated.

Referring to the intermediate structure 1400D of FIG. 14D, the structured masking layer 1422 may be removed by dissolving, ashing, or other photoresist removal processes. In some cases, two or more photoresist removal processes may be used to completely remove the structured masking layer 1422 after forming the conductive lines. In some cases, after removing the structured making layer 1422, a portion of the seed layer, adhesion layer and/or the conductive barrier layer below the structured making layer 1422 may be removed by etching, e.g., by wet etching or dry etching.

Referring to the intermediate structure 1400E of FIG. 14E, after forming the bottom conductive lines 352 and 342 and structured masking layer 1422, a first interlayer dielectric (ILD) layer, e.g., the ILD-1 layer 370 is formed over bottom layer 1410.

In some cases, the masking layer 1420 may comprise a suitable photosensitive and electrically insulating material adapted to serve as a masking layer as well as a permanent ILD, e.g., photosensitive polyimide. In such cases, the photoresist removal may be skipped and the intermediate structure 1400E may be identical to the intermediate structure 1400C where the structured masking layer 1422 serves as the ILD-1 layer 370.

Referring to the intermediate structure 1400F of FIG. 14F, a second interlayer dielectric (ILD) layer, e.g., the ILD-2 layer 374 is formed over ILD-1 layer 370. In some cases, ILD-2 374 may comprise a photosensitive electrically insulating material adapted to serve as a masking layer as well as a permanent ILD.

Figure 14G:
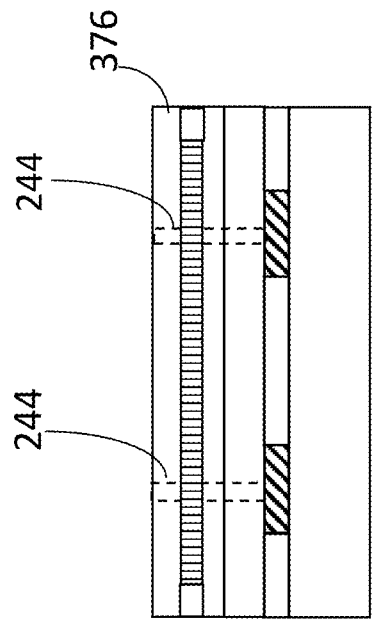

Referring to the intermediate structure 1400G of FIG. 14G, a third interlayer dielectric (ILD) layer, e.g., the ILD-3 layer 362 (middle core layer) is formed over ILD-2 layer 374. In some cases, ILD-3 362 may comprise a photosensitive electrically insulating material adapted to serve as a masking layer as well as a permanent ILD. In some implementations, an opening may be formed in the ILD-3 362 to form a core element 360 (e.g., a magnetic core element). In some cases, where the ILD-3 362 is a photosensitive material, the core element opening may be directly formed by patterning ILD-3 362. In some other cases, a patterned masking layer may be formed on ILD-3 362, to form the core element opening, and removed after forming the opening. In some examples, the core element 360 may be formed by sputtering a magnetic material (e.g., a ferromagnetic material) on the patterned ILD-3 362. The core element 360 may be shaped in accordance with or conformity with the shape of the opening in the dielectric layer ILD-3 362. In some cases, the core element 360 may be formed using electroplating or "pick and place" transfer lithography. In some other cases, other chemical or physical material deposition methods, may be used to form the core element 360 in the opening.

Figure 14H:
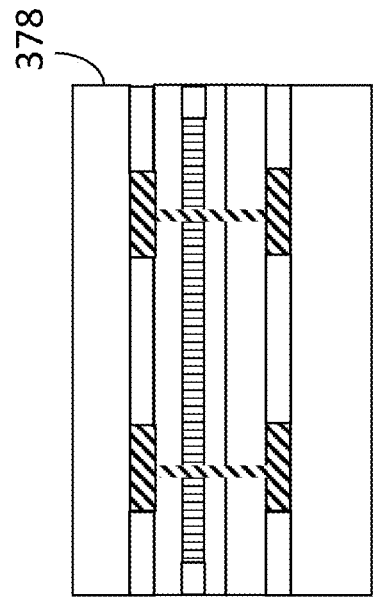

Referring to the intermediate structure 1400H of FIG. 14H, a fourth interlayer dielectric (ILD) layer, e.g., the ILD-4 layer 376 is formed over the ILD-3 layer 362. In some cases, ILD-4 may comprise a photosensitive electrically insulating material adapted to serve as a masking layer as well as a permanent ILD. In some implementations, an adhesion layer and/or an electrically conductive barrier layer are formed on the ILD-4 layer 376, followed by formation of the seed layer.

Figure 14I:
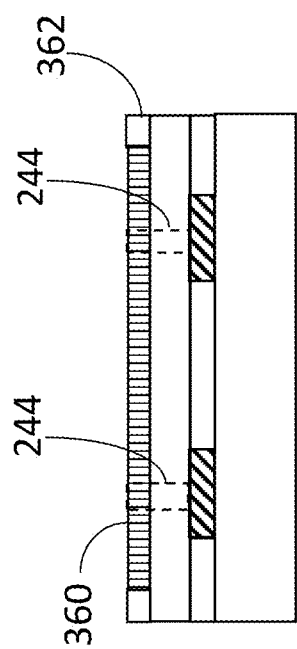

Referring to the intermediate structure 1400I of FIG. 14I, a fifth interlayer dielectric (ILD) layer, e.g., the ILD-5 layer 372 is formed over the ILD-4 layer 376. In some cases, ILD-5 372 may comprise a photosensitive electrically insulating material adapted to serve as a masking layer as well as a permanent ILD. In some implementations, one or more opening may be formed in the ILD-5 372 to form the top conductive lines. In some cases, where the ILD-5 372 is a photosensitive material, the openings may be directly formed by patterning ILD-5 372. In some other cases, a patterned masking layer may be formed on ILD-5 372, to form the openings, and removed after forming the openings. Subsequently the top conductive lines 341 and 351 may be formed by electroplating the opening formed in ILD-5 372. Similar to openings 1424 and 1426, the openings may have different geometries and the top conductive lines 341 and 351 may be shaped accordingly.

Figure 14J:
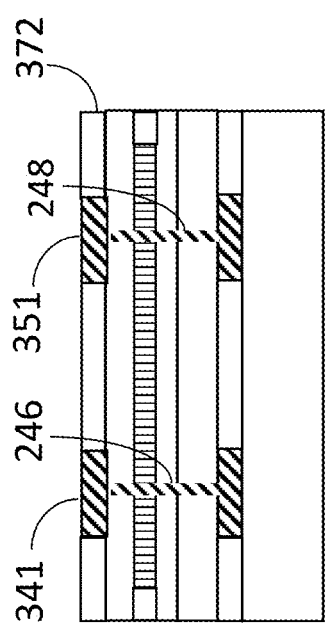

Referring to the intermediate structure 1400J of FIG. 14J, a sixth interlayer dielectric (ILD) layer, e.g., the ILD-6 layer 378 is formed over the ILD-5 layer 372.

In some cases, the intermediate structures 1400F, 1400G, and 1400H may include one or more openings 244 formed in the dielectric layers ILD-2 layer 374, ILD-3 layer 362, and ILD-4 layer 376 to expose the bottom conductive lines 352 and 342. In these cases, after forming ILD-4 376, conductive vias 246, 248 may be formed between the bottom conductive lines 352 and 342, and the top conductive lines 341 and 351, by electroplating in the openings 244. In some cases, each of the conductive vias 246, 248 may comprise at least a lower segment electroplated on the bottom conductive lines 352, 342. In some cases, each of the conductive vias 246, 248 may comprise at least an upper segment on which the top conductive lines 341, 351 are electroplated.

As described above, the conductive lines 352, 342, 341 and 351 may be shaped by shaping the masking layer or the ILD on which these conductive lines are formed by electroplating. In various implementations, the conductive lines 352, 342, 341 and 351 may have curved, sloped and/or stepped side surfaces similar to the conductive lines described above with respect to FIG. 1B, FIGS. 5B-5E, FIGS. 6A-6H, FIGS. 8A-8D, or FIGS. 13A-13B, or other shapes that may be formed by various combinations of these shapes.

FIGS. 15A-15B illustrate example intermediate structures 1500A/1500B comprising a conductive lines (e.g., conductive lines having single vertical sections), formed by electroplating an opening in a masking layer or ILD disposed on a layer 1502. In some cases, the layer 1502 may be a bottom layer (e.g., bottom layer 1410), or an ILD (e.g., ILD-4 376). In some cases, a shape of a side surfaces of conductive line may and a shape of the sidewall of an opening in which the conductive line is electroplated, may be complementary shapes. FIG. 15A illustrates a conductive line 1506 having concave side surfaces formed in an opening formed in the masking layer or ILD 1504 (e.g., ILD-1 370 or ILD-5 372), having convex sidewalls. FIG. 15B illustrates a conductive line 1510 having convex side surfaces formed in an opening formed in the masking layer or ILD 1508 (e.g., ILD-1 370 or ILD-5 372), having concave sidewalls.

FIG. 15C illustrates an intermediate structure 1500C that includes an example conductive line 1514 comprising a curved and stepped side surface. Similar to the conductive line 802 (FIG. 8B), the conductive line 1504 comprises a top vertical section 1514a and a bottom vertical section 1514b where the top section 1514a has a curved side surface section and the bottom vertical section 1514b has a flat vertical side surface. The top vertical section 1514a may have an average width larger than that of the bottom vertical section 1514b, such that a "mushroom" structure is formed.

In some implementations, the conductive line 1514 may be formed by electroplating an opening in a masking layer or ILD disposed on a layer 1502. For example, the conductive line 1514 may be formed by overplating the opening beyond a depth dr of the opening. As illustrated, overplating may result in the lateral growth of metal deposited above the opening depth dr, beyond the margin defined by the sidewall of the opening and over the masking layer or the ILD. Such phenomenon is sometimes referred to as "bread loafing." The portion of metal plated below the surface of the masking layer or ILD, may form the bottom section 1514b of the conductive line 1514, and the portion of metal overplated above the surface of the masking layer or ILD, may form the top vertical 1514a section of the conductive line 1514. In some cases, a side surface of the top vertical section 1514a may naturally become curved via the overplating process. In some cases, an ROC of the side surface of the top vertical section 1514a may be controlled by the controlling a thickness of the top vertical section 1514a. In some cases, the ROC of the side surface of the top vertical section 1514a may be controlled by a rate of plating. In some cases, the depth dr of the opening may be substantially equal to the thickness of the masking layer or the ILD.

In alternative implementations, the conductive line 1514 may be formed by a two-step electroplating process and using an additional masking layer or ILD. In these implementations, the bottom vertical section 1514b may be formed by the electroplating a first opening in the masking layer or ILD 1512 disposed on the layer 1502. Next, a second masking layer or second ILD may be disposed on the first masking layer or ILD 1512 and the bottom vertical section 1514b of the conductive line 1514. A second opening having a width larger than the first opening may be formed on the second masking layer or ILD to expose the bottom vertical section 1514b and a portion of the first masking layer or ILD 1512. In some cases, the sidewalls of the second masking layer or ILD may have a concave shape similar to the masking layer or ILD 1508 shown in the intermediate structure 1500B. Subsequently, the top vertical section 1514a may be formed by electroplating the second opening. A shape of side surface of the top vertical section 1514a may be controlled may by a shape of the sidewalls of the second masking layer or ILD.

Figure 15E:
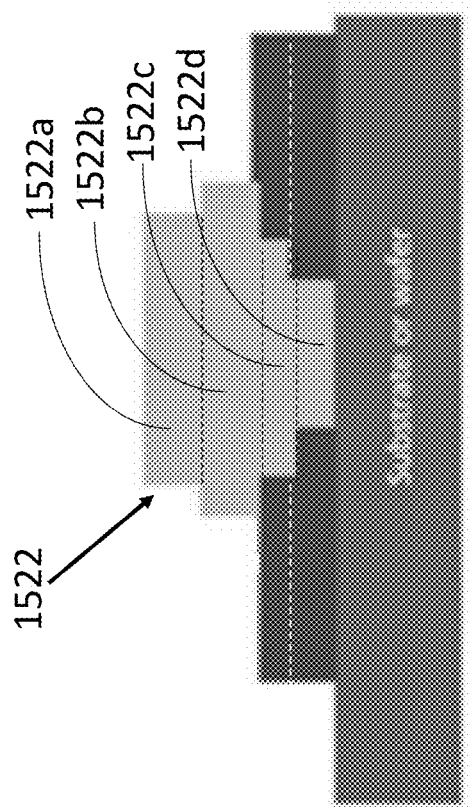
FIG. 15E illustrates an intermediate structure including an example conductive line having a stepped side surface with three steps formed by electroplating openings in multiple photoresist layers.
Figure 15D:
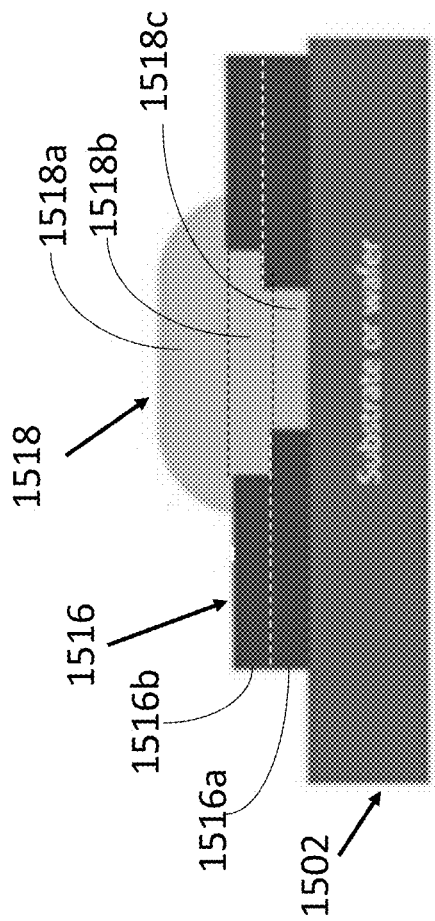
FIG. 15D illustrates an intermediate structure including an example conductive line having a curved and stepped side surface with two steps formed by electroplating openings in multiple photoresist layers.

FIG. 15D illustrates an intermediate structure 1500D that includes an example conductive line 1518 comprising a curved and stepped side surface having two steps. Similar to the conductive line 1300 (FIG. 13A), the conductive line 1518 comprises a top vertical section 1518a, a middle vertical section 1518b, and a bottom vertical section 1518c, where the top section 1518a has a curved side surface section, and the middle vertical section 1518b and the bottom 1518c vertical section have flat vertical side surfaces.

In some implementations, the bottom 1518c and middle 1518b vertical sections may be formed by a two-step electroplating process and using an additional masking layer or ILD. In these implementations, the bottom vertical section 1518c may be formed by the electroplating a first opening in the masking layer or ILD 1516a disposed on the layer 1502. Next, a second masking layer or second ILD 1516b may be disposed on the first masking layer or ILD 1516 and the bottom vertical section 1518c of the conductive line 1518. A second opening having a width larger than the first opening may be formed on the second masking layer or ILD 1516b to expose the bottom vertical section 1518c and a portion of the first masking layer or ILD 1516a. Subsequently, the middle vertical section 1518b may be formed by electroplating the second opening. In some examples, the third vertical section 1518a may be formed on the middle vertical section 1518b, and the second masking layer or ILD 1516b by overplanting the opening formed on the second masking layer or ILD 1516b. In some examples, the third vertical section 1518a may be formed on the middle vertical section

1518*b*, and the second masking layer or ILD 1516*b* by overplanting the opening formed on the second masking layer or ILD 1516*b*.

In some implementations, the third vertical section 1518*a* may be formed by forming a third masking layer or second ILD on the second masking layer or ILD 1516*b* and the middle vertical section 1518*b* of the conductive line 1518. A third opening having a width larger than the second opening may be formed on the third masking layer or ILD to expose the middle vertical section 1518*b* and a portion of the second masking layer or ILD 1516*b*. In some cases, the sidewalls of the third masking layer or ILD may have a concave shape similar to the masking layer or ILD 1508 shown in the intermediate structure 1500B. Subsequently, the top vertical section 1518*a* may be formed by electroplating the third opening. A shape of side surface of the top vertical section 1518*a* may be controlled may by a shape of the sidewalls of the third masking layer or ILD.

FIG. 15E illustrates an intermediate structure 1500E that includes an example conductive line 1522 comprising a curved and stepped side surface having two three steps. Similar to the conductive line 1310, the conductive line 1522, comprises a top vertical section 1522*a*, a first middle vertical section 1522*b*, a second middle vertical section 1522*c*, and a bottom vertical section 1522*d* where all vertical sections have substantially flat vertical side surfaces.

In some implementations, the vertical sections 1522*a*, 1522*b*, 1522*c*, 1522*d* of the conductive line 1522 may be formed using electroplating openings on multiple masking layers or ILDs, similar to formation of the bottom 1518*c* and the middle 1518*b* vertical sections of the conductive line 1518.

In various implementations, the conductive lines 1506, 1510, 1514 and 1522 illustrated in FIGS. 15A-15E, respectively, and similar conductive lines may be the conductive lines of the transformer 200 (FIGS. 2A-2C) or transformer 400 (FIGS. 4A-4B). Accordingly, any of these configurations and related fabrication steps may be used when fabricating the masking layer or ILD 1422, 370, or 372 used in the fabrication process described above (FIG. 14A-14J), that may be used to fabricate the transformer 200, or a modified version of such fabrication process that may be used for fabricating the transformer 400, or a single coil in a monolithic electronic circuit to increase an operating voltage.

In various implementations, the sidewalls of the openings formed on a masking layer of an ILD can be shaped during a lithographic process by proper selection of the material (e.g., photosensitive) used as masking layer or ILD, controlling the thickness of the controlling an exposure time of the photosensitive material, controlling the dose of the radiation (e.g., ultraviolet radiation) or the electron beam provided during the exposure, controlling the duration and temperature of a pre/post-exposure baking process, proper selection of the developer or developer chemistry, controlling the developing time and temperature, or controlling other parameters. In some examples, any combination of these parameters may be used as controlled parameters for determining the shape of the sidewall and therefore the shape of the side surface in a resulting conductive line.

In some cases, a masking layer (or an ILD) may comprise a positive or negative photoresist. In some cases, using a negative photoresist may facilitate fabricating openings having sidewalls with certain shapes. For example, the inventors have discovered that a negative photoresist may be particularly suited for fabricating the masking layer (or ILD) 1508 having a concave sidewall.

In various implementations, the negative and/or positive photoresist may comprise any negative and/or positive photoresist commonly used in for micro/nanofabrication. In some cases, the negative and/or positive photoresist may comprise other negative and/or positive photoresists.

In some implementations, a masking layer (or an ILD) may comprise two or more different photoresist layers. In some cases, different photoresist layers may comprise different types of photoresists. In some such implementations, the material or composition of each photoresist layer of a masking layer may be selected according to a desired shape of a sidewall of an opening on the masking layer. For example, a masking layer may include a first layer comprising a positive photoresist and a second layer (disposed on the first layer comprising a negative photoresist. Different photoresist layers in a masking layer may have different thickness selected according to a desired sidewall shape. In some cases, a concentration or dilution of the photoresist may be tailored to facilitate the photoresist shaping (e.g., by controlling exposure or development times).

In some cases, the shape of the sidewalls in an opening may be determined by a thickness of the corresponding masking layer or ILD. In some such cases, a thickness of the conductive line may be determined by a desired shape of a side surface of the conductive line.

In some cases, the shape of a conductive line may be controlled at least in part by the electroplating process. For example, for an opening in a masking layer having a given sidewall shape, plating different amounts of metal (e.g., by controlling the plating time) may result in formation of conductive lines having different shapes. As such, in some implementations, a conductive line with a desired shape (e.g., a desired side surface shape) may be fabricated by tailoring the sidewalls of the opening in which the conductive line is formed, and controlling the electro-plating parameters such as plating time, plating rate, and the type of metal used to form the conductive line.

In various implementations, the conductive lines and vias may comprise a suitable electroplatable metal such as gold, silver, copper, tin and/or an alloy formed by these or other metals.

Figure 16A:
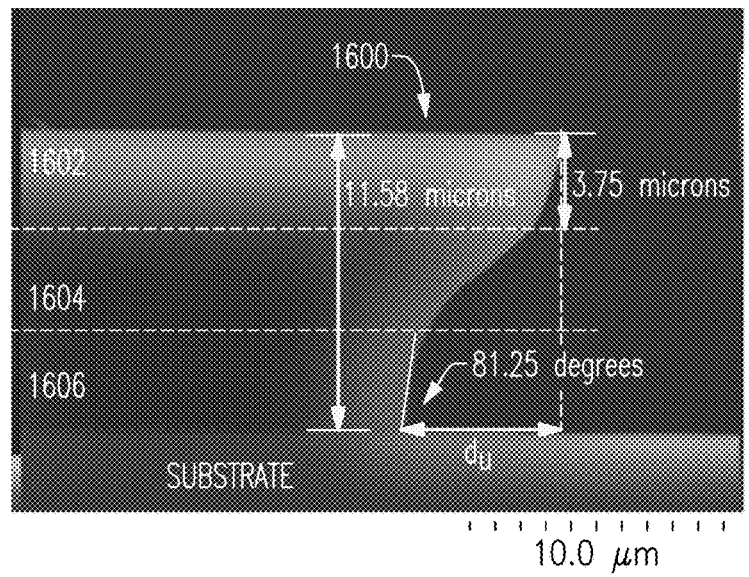
FIG. 16A illustrates a side cross-sectional SEM image of an example shaped photoresist layer having a curved side surface.

FIG. 16A illustrates a cross-sectional scanning electron microscope (SEM) image of an example shaped photoresist 1600 layer having a curved sidewall. In the example shown, the photoresist layer has a thickness of 11.58 microns and comprises three vertical sections having negatively sloped sidewalls. The negative slope of the middle section 1604 is smaller than that of the top section 1602, and the negative slope of the top section 1602 is smaller than that of the bottom section 1606 (that is approximately 81 degrees). In some cases, the sidewall of the top section 1602 may comprise a convex surface, and the sidewall of the middle section 1604 may comprise a concave surface.

In various embodiments, a curvature and an angle of the sidewalls of different vertical sections of the photoresist layer 1600 may be controlled independently during the fabrication process. For example, the profile curvature of the photoresist layer may be tailored by controlling the exposure dose and development time during fabrication process. In some cases, where the photoresist layer 1600 comprises two or more sublayers, its profile curvature may be controlled using a combination of positive and negative resist sublayers at different fabrication steps, controlling exposure dose for curing each resist layer, and controlling development time for each resist layer.

Figure 16B:
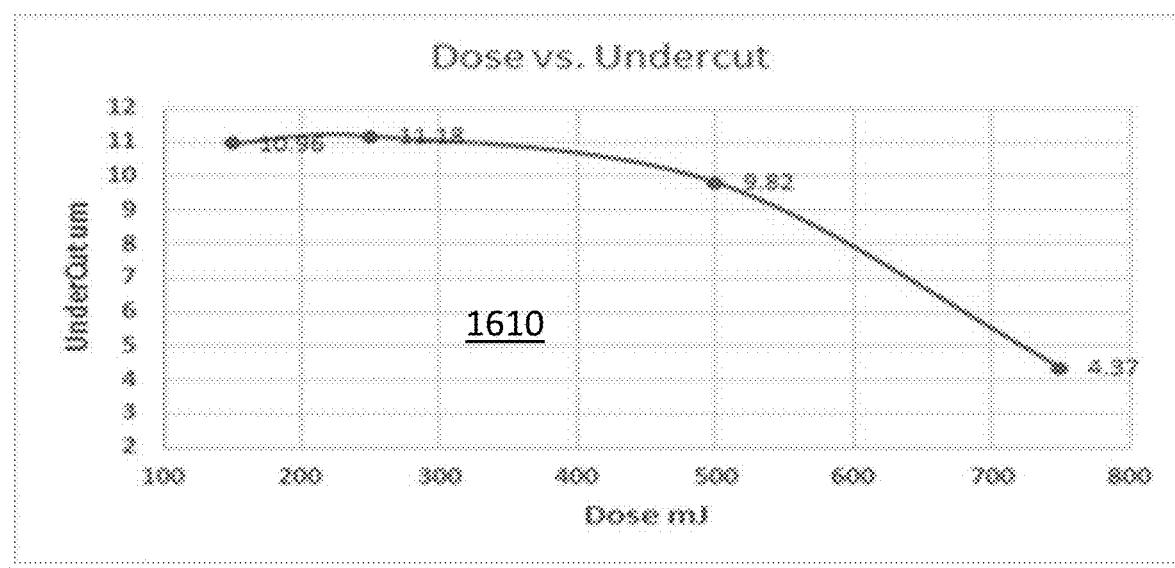
FIG. 16B illustrates a graph showing a trend of the size of undercut after developing the photoresist layer as a function of dose of radiation delivered to the photoresist layer during exposure.

In some cases, the length of the undercut $d_u$ provide under the photoresist layer 1600 (or the width of the bottom section 1606) may be controlled by the dose of radiation (total energy) delivered to the photoresist layer 1600 during exposure. FIG. 16B illustrates the size of undercut $d_u$ after developing the photoresist layer 1600 as a function of radiation dose delivered to the photoresist layer 1600. As depicted in the plot 1610, delivering more radiative energy during exposure may result in formation of larger undercuts.

Figure 16C:
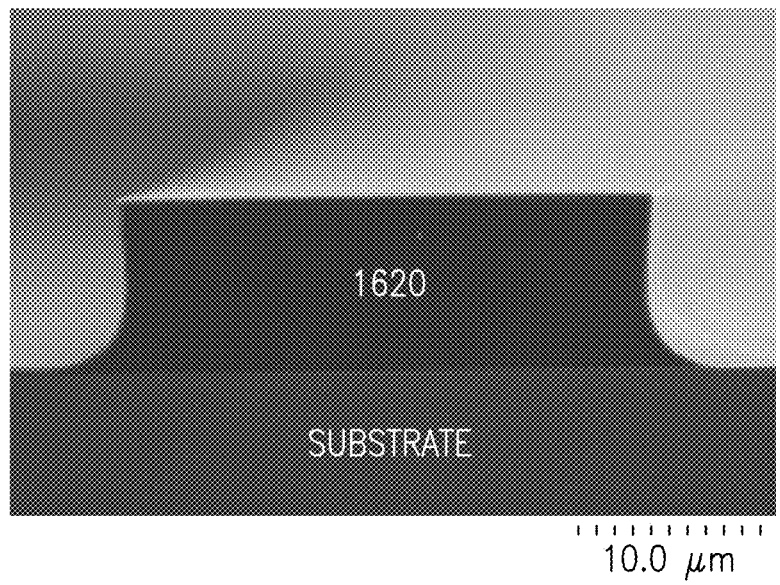
FIG. 16C a cross-sectional SEM image of another example shaped photoresist layer having a curved side surface.

FIG. 16C is a cross-sectional SEM image of another example shaped photoresist layer 1620 having a curved sidewall. The side surface of the shaped photoresist layer 1620 comprises a top flat portion substantially perpendicular to the substrate on which the photoresist layer 1620 is disposed, and a curved concave bottom portion. In some cases, the shape of the bottom portion can be controlled by controlling a development time of the photoresist layer 1620 during fabrication. In some cases, the shape of the bottom portion can be controlled by controlling an exposure time of the photoresist layer 1620 during fabrication.

In some cases, the photoresist layer 1600 and 1620 may comprise a negative photoresist, for reasons set forth above.

Figure 16D:
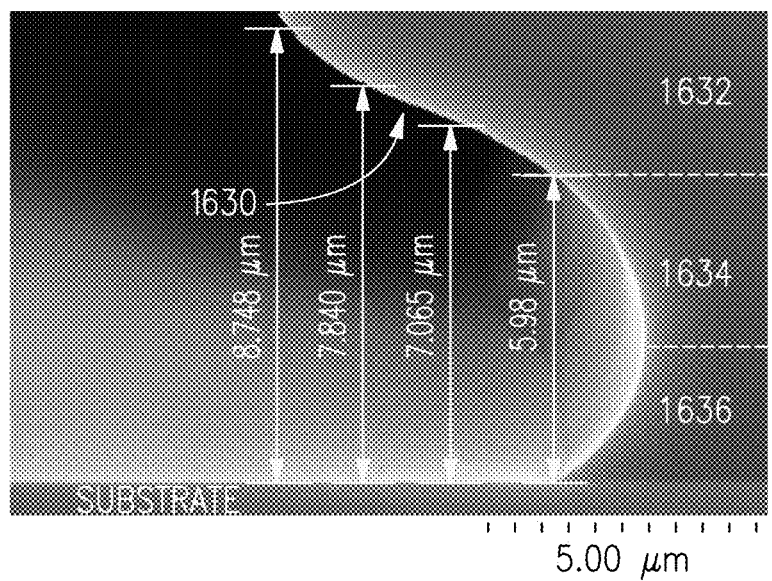
FIG. 16D a cross-sectional SEM image of another example shaped photoresist layer having a curved side surface.

FIG. 16D is a cross-sectional SEM image of another example shaped photoresist layer 1630 having a curved side surface. In the example shown, the photoresist layer comprises three vertical sections 1632, 1634, 1636, two of which (1632, 1634) have negatively sloped sidewalls, and one (1636) with positively sloped sidewall. The negative slope of the top section 1632 is smaller than that of the middle section 1634. The top section 1632 comprises a convex surface, while the middle 1634 and the bottom 1636 sections comprise concave surfaces. In some cases the photoresist layer may include a first sublayer (e.g., a thin sublayer) disposed on the substrate, and a second sublayer (e.g., a thick sublayer) disposed on the first sublayer. In some examples, the first sublayer may comprise a positive photoresist and the second sublayer may comprise a negative sublayer.

In various implementations, the slope of a sidewall section of the photoresist layer 1600 or 1630 with respect to substrate surface may be from less than 5 degrees to 90 degrees.

In various implementations, the ROC of a sidewall section of the photoresist layer 1600, 1620 or 1630 may be from 1 to 5 microns, from 5 to 10 microns, from 10 microns to 20 microns, or larger values.

Figure 17A:
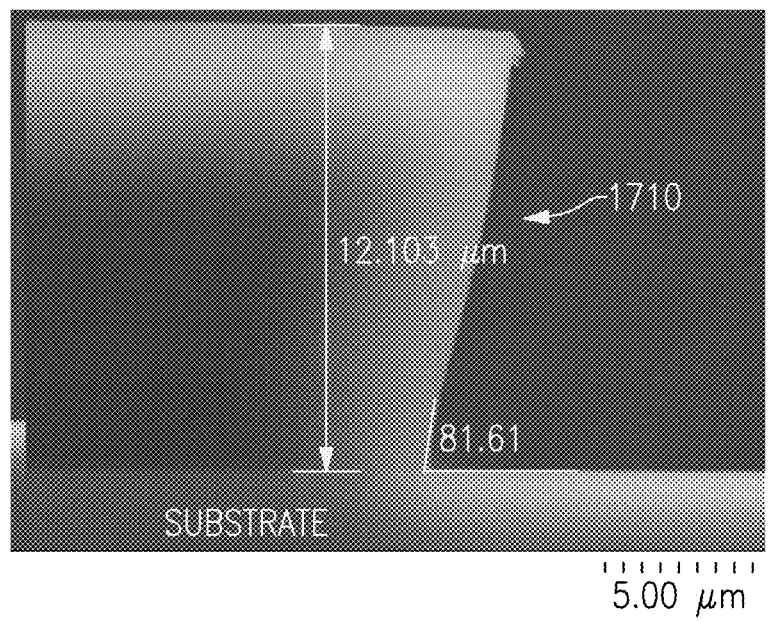
FIG. 17A shows a cross-sectional SEM image of an example shaped photoresist layer having a sloped side surface.
Figure 17B:
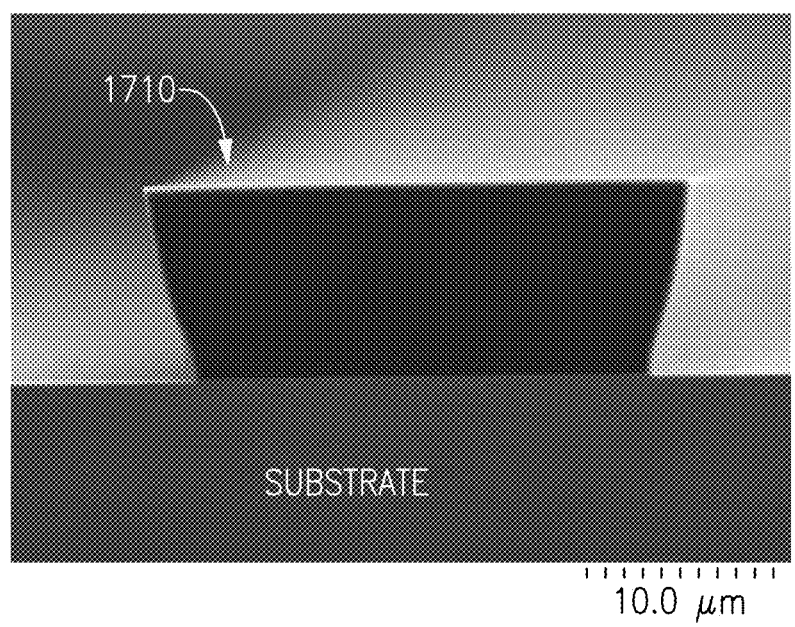
FIG. 17B shows a cross-sectional SEM image of the shaped photoresist layer shown in FIG. 17A.

FIG. 17A illustrates a cross-sectional SEM image of an example of a shaped photoresist layer 1710 having a negatively sloped sidewall. In the example shown, the photoresist layer has a thickness of 12 microns. FIG. 17B is a cross-sectional SEM image of the shaped photoresist layer 1710 shown in FIG. 17A. In various implementations, the slope of the photoresist layer 1710 with respect to the substrate may be from 70 degrees to 90 degrees.

In various implementations, the thickness of the photoresist layer 1600, 1620, 1630, or 1710 may be between 5 microns to 10 microns, 10 microns to 15 microns, or larger or smaller values.

Figure 18A:
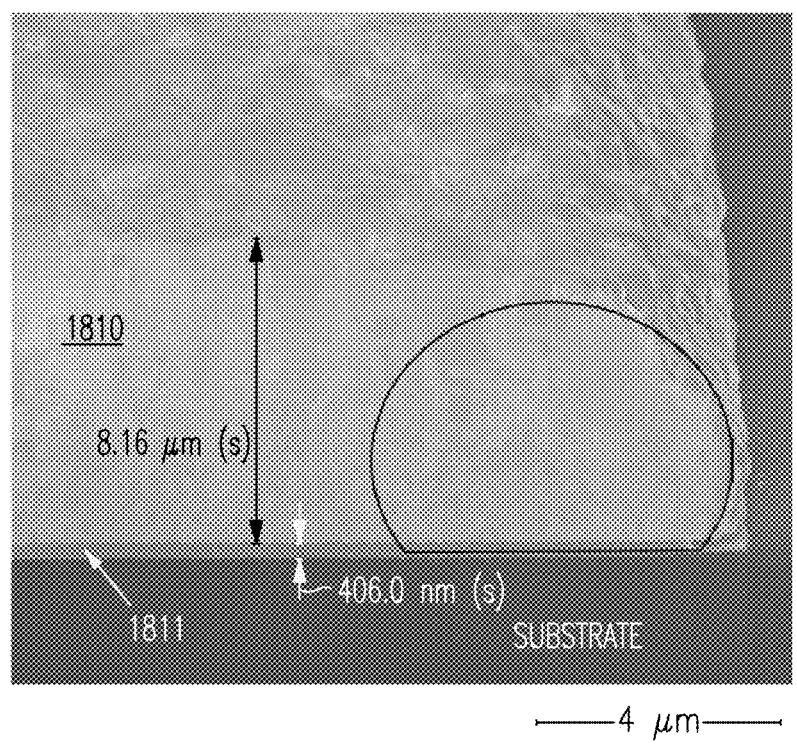
FIG. 18A shows a cross-sectional SEM image of an example conductive line with curved side surface.

FIG. 18A illustrates a cross-sectional SEM image of an example conductive line 1810 with curved side surface. In some examples, the conductive line 1810 may be fabricated using the process described with respect to conductive line 1500B in FIG. 15B.

Figure 5E:
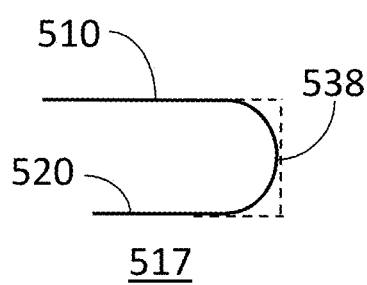
Figure 18B:
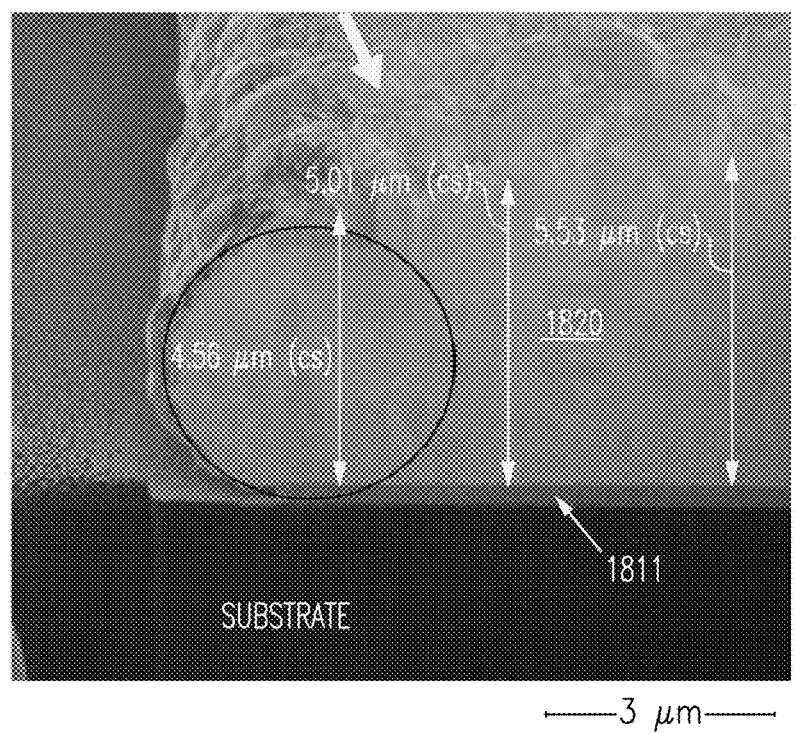
FIG. 18B shows a cross-sectional SEM image of another example conductive layer with curved side surface.

FIG. 18B illustrates a cross-sectional SEM image of another example conductive line with fully curved side surface (similar to conductive line 517 in FIG. 5E). In some implementations, the conductive line shown in FIG. 18B may be fabricated by forming a photoresist layer similar to the shaped photoresist layer 1630 shown in FIG. 16D.

The conductive lines shown in FIGS. 18A and 18B are disposed on seed layer 1811 that may have a thickness between 50-500 nm, or 500-1000 nm.

In various implementations, the shaped photoresist layers 1600 (FIG. 16A), 1620 (FIG. 16C), 1630 (FIG. 16D), 1710 (FIGS. 17A-17B), and similarly shaped photoresist layers may be masking layers or ILDs used for fabricating the conductive lines of the transformer 200 (FIGS. 2A-2C) or transformer 400 (FIGS. 4A-4B). For example, any of these shaped photoresist layers may be the structured masking layer or ILD 1422, 370, or 372 used in the fabrication process described above (FIG. 14A-14J), that may be used to fabricate the transformer 200, or a modified version of such fabrication process that may be used for fabricating the transformer 400, or a single coil in a monolithic electronic circuit to increase an operating voltage.

In various implementations, the ROC of the side surfaces or the conductive lines 1810/1820 shown in FIGS. 18A and 18B may be from 1 microns to 2 microns, from 2 microns to 3 microns, from 3 microns to 5 microns, or larger values.

In various implementations, the thickness of the conductive lines 1810/1820 shown in FIGS. 18A and 18B may be from 1 microns to 2 microns, from 2 microns to 3 microns, from 3 microns to 5 microns, from 5 microns to 10 microns or larger.

Figure 19A:
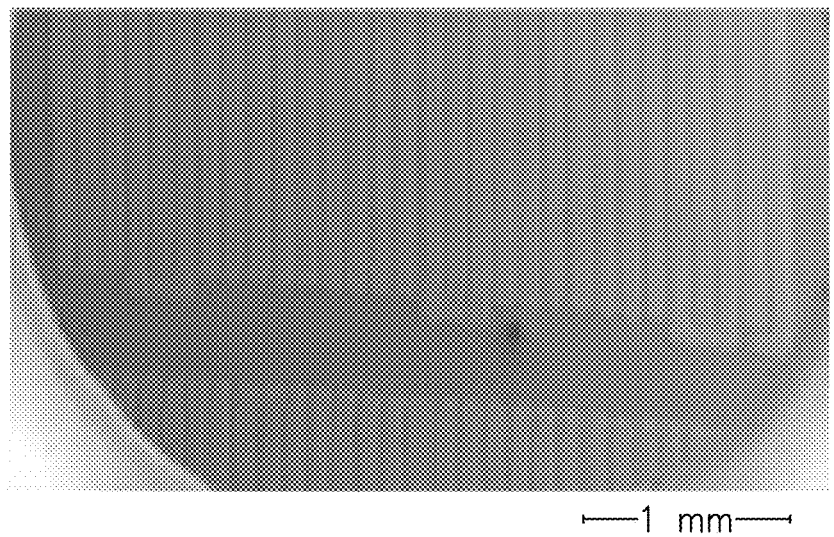
FIGS. 19A-19B are SEM images of example conductive lines having a curved and stepped side surface with an undercut.
Figure 19B:
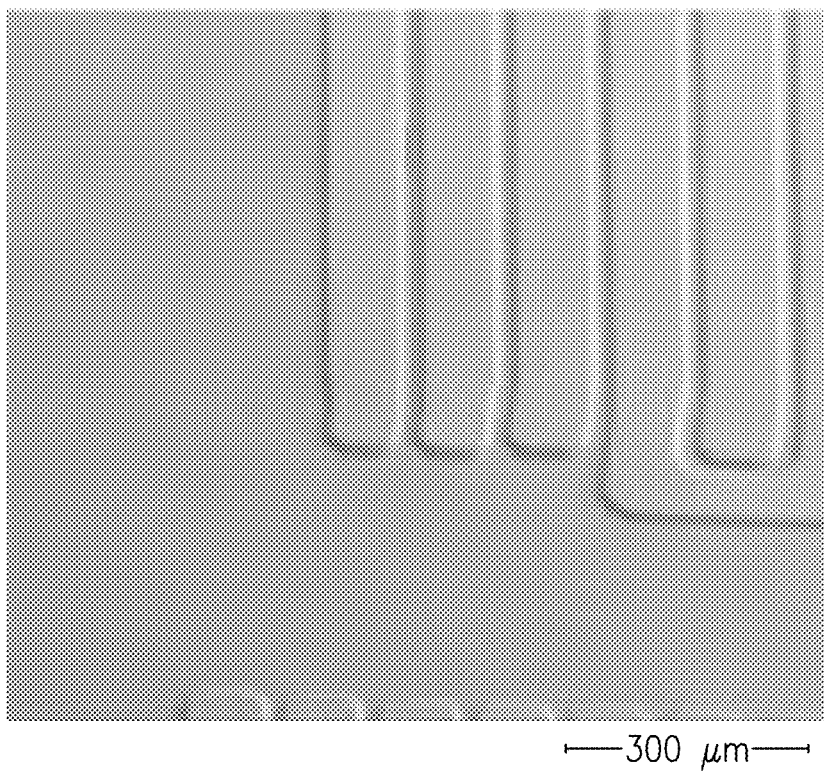

FIGS. 19A-19B are a SEM images of example conductive lines of a transformer (e.g., a transformer similar to transformer 200, FIGS. 2A-2C) having a curved and stepped side surface. FIG. 19A shows several conductive lines (e.g., top conductive lines) of the primary and the secondary coils of the transformer. FIG. 19B shows a close-up top view of six conductive lines (e.g., three conductive lines of the primary coil and three conductive line of the secondary transformer).

Figure 19C:
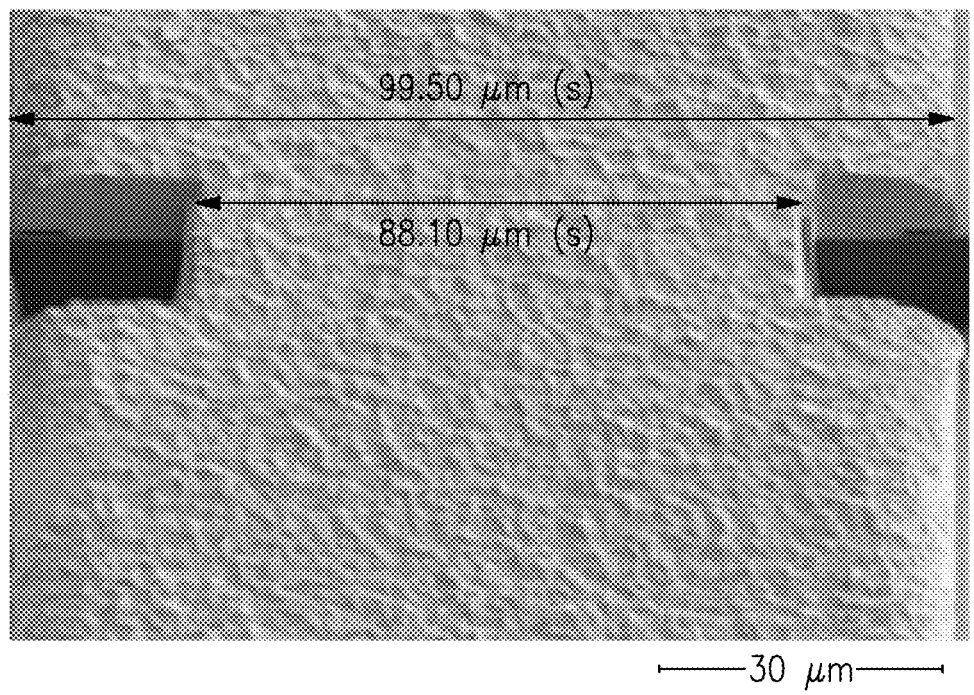
FIGS. 19C-19F are close-up SEM images of conductive lines shown in FIGS. 19A and 19B.

FIG. 19C is a close-up top down SEM image of one of the conductive lines shown in FIG. 19B.

Figure 19D:
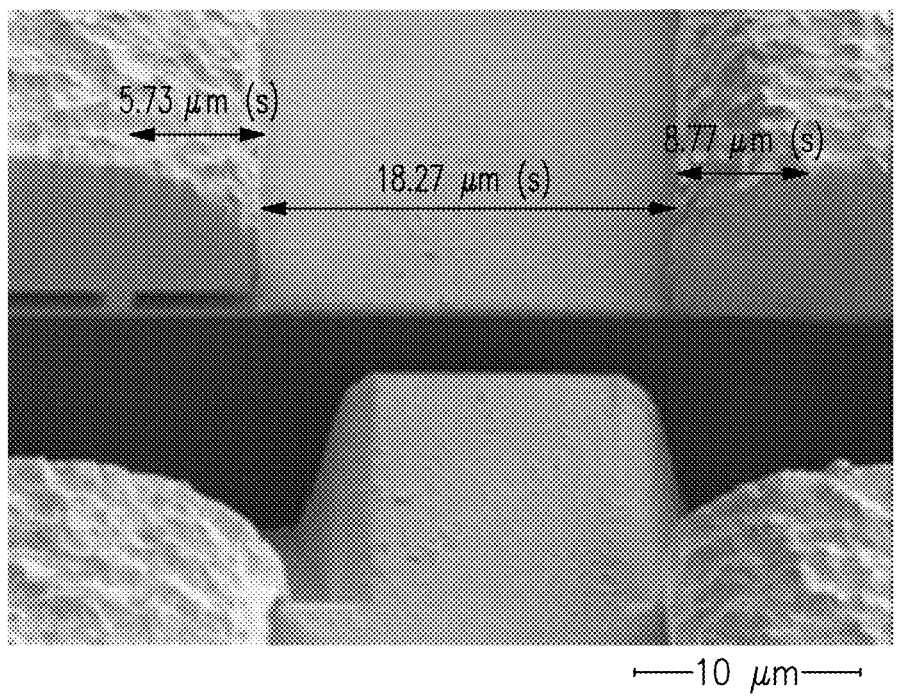

FIG. 19D is a close-up SEM image of two of the conductive lines shown in FIG. 19B that are spaced apart by 18.3 microns.

Figure 19E:
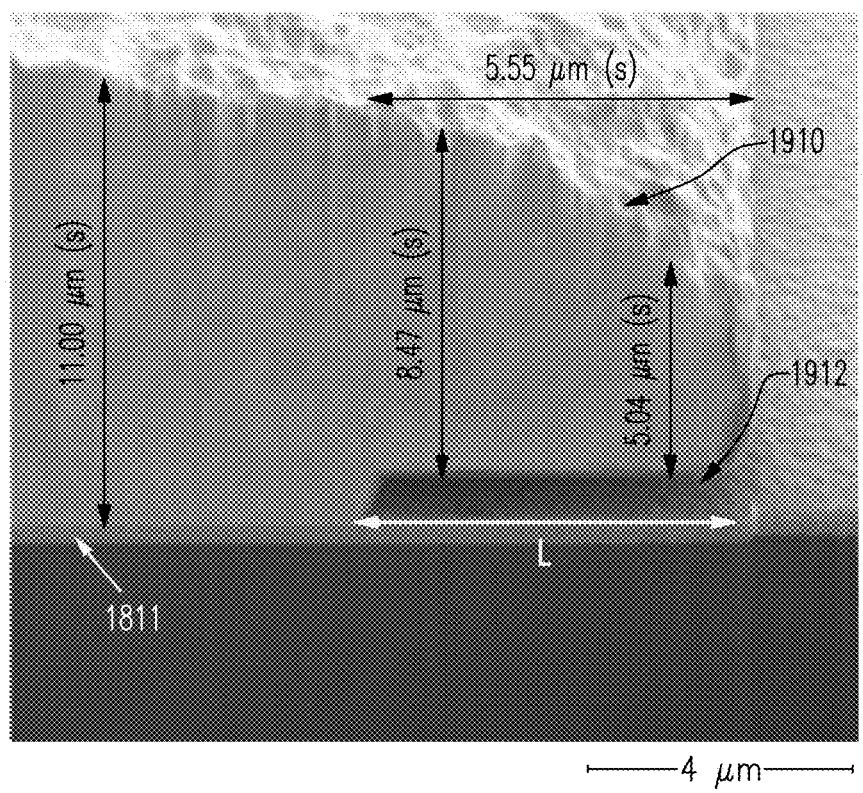
Figure 19F:
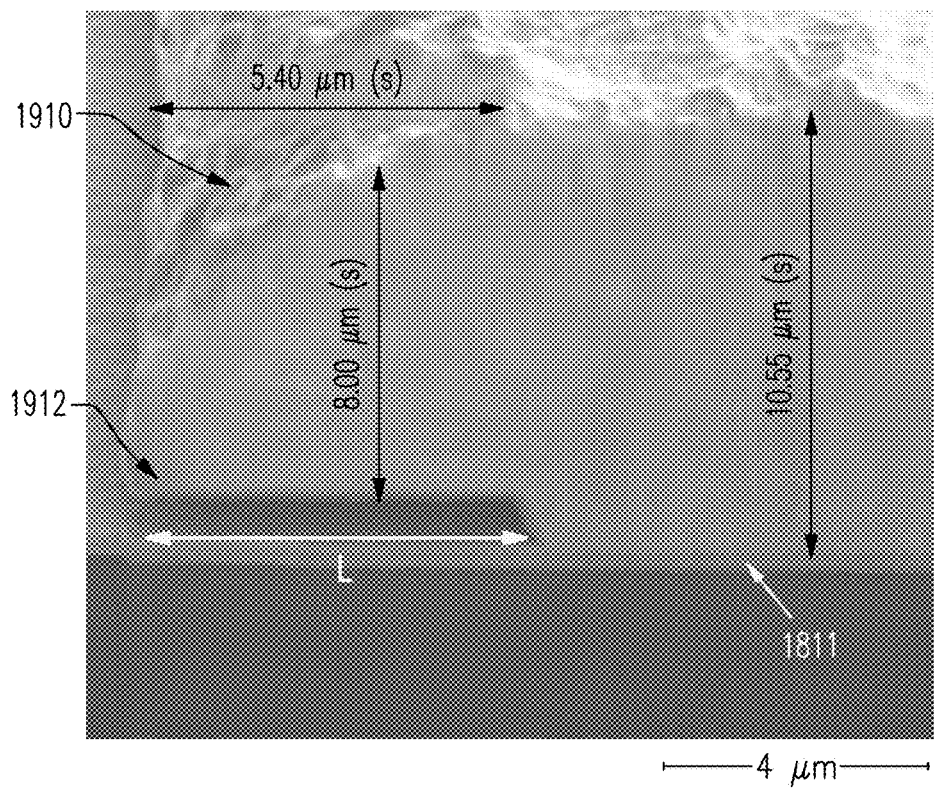

FIGS. 19E and 19F are close-up SEM images of the left and right conductive lines shown in FIG. 19B, respectively. In the examples shown, the ROC of the side surfaces 1910 is 6 microns, the ROC of the bottom corners 1912 is 0.5 microns, and the undercut length (L) is 5.5 microns. In some cases, these conductive lines may be disposed on a seed layer 1811.

In some cases, the distance between the two conductive lines in FIG. 19A-B may be from 10 to 20 microns, 20 to 30 microns, 30 to 40 microns, 40 to 50 microns or larger.

In some cases, the ROC of the side surface of the conductive lines shown in FIG. 19C-19F may be from to 2 to 5 microns.

In some cases, the length of the undercut below the conductive lines similar to those shown in FIG. 19C-19F may be from 1 micron to 7 microns.

In some cases, the thickness of the conductive lines similar to those shown in FIG. 19C-19F may be from 1 micron to 10 microns at a middle point between the two side curved surfaces where the top surface is substantially parallel to the substrate.

In various implementations described herein, the operating or working voltage of a transformer (e.g., a transformer similar to the transformer 200 (FIGS. 2A-2C) or 400 (FIGS. 4A-4B)) having top and conductive lines similar to those shown in FIGS. 1A-1B, 5B-5E, 6A-6H, 8A-8D, and 13A-13B, may be larger than that of the other transformers fabricated based on conductive lines with vertical or nearly vertical flat (or nearly flat) side surfaces, by 5%, 10%, 15%, 20%, or 30% or larger ratios. For example, a transformer (e.g., similar to the transformer 200) having conductive lines similar to those shown in FIG. 2E-2F may have a working voltage of 360 Volts while replacing the conductive lines with conductive lines similar to those shown in FIGS. 5D and 5E, may increase the working voltage to above 400 Volts or 500 Volts.

EXAMPLE EMBODIMENTS

Example embodiments described herein have several features, no single one of which is indispensable or solely responsible for their desirable attributes. A variety of example systems and methods are provided below.

Example 1: An integrated circuit device comprising:
a substrate having a main surface;
a core layer disposed over the substrate; and
a lithographically patterned primary coil, the primary coil comprising one or more windings wound around a winding axis parallel to the main surface, wherein each of the windings comprises:
  a top conductive line arranged over the core layer, the top conductive line having a first thickness along a vertical axis perpendicular to the main surface, wherein a cross-section of the top conductive line in a plane parallel to the winding axis and perpendicular to the main surface comprises a rounded convex portion of a side surface of the top conductive line, the rounded convex portion having a radius of curvature larger than 1 micron,
  a bottom conductive line arranged under the core layer, the bottom conductive line having a second thickness along the vertical axis, wherein a cross-section of the bottom conductive line in the plane comprises a rounded convex portion of a side surface of the bottom conductive line, the rounded convex portion having a radius of curvature larger than 1 micron,
  a first conductive via extended along the vertical axis electrically connecting the top and bottom conductive lines, and
  a second conductive via extended along the vertical axis electrically connecting one but not the other of the top and bottom conductive lines to a conductive line of another winding of the primary coil.

Example 2: The integrated circuit device of Example 1, wherein the rounded convex portion of the side surface of the top conductive line has a radius of curvature exceeding 15% of the first thickness.

Example 3: The integrated circuit device of Example 1, wherein the rounded convex portion of the side surface of the bottom conductive line has a radius of curvature exceeding 15% of the second thickness.

Example 4: The integrated circuit device of Example 1, wherein the bottom conductive line, and the top conductive line are formed at a bottom metallization layer, and an upper metallization layer, respectively, wherein the top, and bottom metallization layers are distinct metallization layers of the integrated circuit each comprising at least a metallized portion formed by electroplating and an intermetal dielectric portion embedding the metallized portion.

Example 5: The integrated circuit device of Example 4, wherein the bottom conductive line and the top conductive line are electroplated lines comprising a seed layer and an electroplated layer.

Example 6: The integrated circuit device of Example 4, wherein the first conductive via comprises at least a lower segment electroplated on the bottom conductive line and an upper segment on which the top conductive line is electroplated.

Example 7: The integrated circuit device of Example 1, wherein the side surface of top conductive line further comprises a stepped portion having one or more side surface sections, and wherein an individual side surface section is a flat surface substantially perpendicular to main surface.

Example 8: The integrated circuit device of Example 1, wherein the stepped portion comprises two or more steps.

Example 9: The integrated circuit device of Example 1 wherein the side surface of the top conductive line further comprises a stepped portion having one side surface section, and wherein the side surface section is a flat surface substantially perpendicular to main surface.

Example 10: The integrated circuit device of Example 9 wherein the top conductive line further comprises a top vertical section having a first thickness along the vertical axis and a bottom vertical section having a second thickness along the vertical axis, the top vertical section comprising the rounded portion of the side surface and the bottom vertical section comprising the stepped portion of the side surface, and wherein an average width of the top vertical section is larger than a width of the bottom vertical section.

Example 11: The integrated circuit device of Example 10, wherein a maximum width of the top vertical section is different from the width of the bottom vertical section by at least 1 microns.

Example 12: The integrated circuit device of Example 10, wherein the second thickness of the bottom vertical section is equal to half of a difference between the width of the bottom vertical section and a width of the top vertical section at an interface between the top vertical section and the bottom vertical section.

Example 13: The integrated circuit device of any of Examples above, wherein the radius of curvature of the rounded convex portion of the side surface of one or both of the top and bottom conductive lines is greater than 3 microns.

Example 14: The integrated circuit device of Example 1, further comprising a lithographically patterned secondary coil, the secondary coil comprising:
one or more windings wound around the winding axis, wherein each of the windings comprises:
  a second top conductive line arranged over the core layer, the second top conductive line having a third thickness along the vertical axis, wherein a cross-section of the second top conductive line in the plane comprises a rounded convex portion of a side surface of the second top conductive line, the rounded convex portion having a radius of curvature larger than 1 micron;
  a second bottom conductive line arranged under the core layer, the top conductive line having a fourth thickness along the vertical axis, wherein a cross-section of the second bottom conductive line in the plane comprises a rounded convex portion of a side surface of the second bottom conductive line, the rounded convex portion having a radius of curvature larger than 1 micron;
  a third first conductive via extended along the vertical axis electrically connecting the second top and second bottom conductive lines;
  a fourth conductive via extended along the vertical axis electrically connecting one but not the other of the second top and second bottom conductive lines to a conductive line of another winding of the secondary coil;

wherein the primary coil and the secondary coil are magnetically coupled.

Example 15: The integrated circuit device of Example 14, wherein the rounded convex portion of the side surface of the second top conductive line has a radius of curvature exceeding 15% of the first thickness.

Example 16: The integrated circuit device of Example 14, wherein the rounded convex portion of the side surface of the second bottom conductive line has a radius of curvature exceeding 15% of the second thickness.

Example 17: The integrated circuit device of Example 14, wherein the primary coil and the secondary coil are interlaced with each other and wound around the winding axis such that the windings of the primary coil alternate with the windings of the secondary coil along the winding axis.

Example 18: The integrated circuit device of Example 14, wherein a vertical distance between the top conductive line and the bottom conductive line is substantially equal to a vertical distance between the second top conductive line and the second bottom conductive line.

Example 19: The integrated circuit device of Example 14, wherein the top conductive line and the second top conductive line are lithographically co-patterned at the top metallization level.

Example 20: The integrated circuit device of Example 19, wherein the bottom conductive line and the second bottom conductive line are lithographically co-patterned at the bottom metallization level.

Example 21: The integrated circuit device of Example 14, wherein the top conductive line and the second top conductive line are formed by simultaneously electroplating such that the first thickness and the third thickness are substantially the same.

Example 22: The integrated circuit device of Example 21, wherein the bottom conductive line and the second bottom conductive line are formed by simultaneously electroplating such that the second thickness and the fourth thickness are substantially the same.

Example 23: The integrated circuit device of Example 14, wherein the rounded convex portions of the bottom and second bottom conductive lines are formed on one or both of top and bottom corner portions of the side surfaces of the bottom and second bottom conductive lines that directly face each other.

Example 24: The integrated circuit device of Example 14, wherein the rounded convex portions of the top and second top conductive lines are formed on one or both of top and bottom corner portions of the side surfaces of the top and second top conductive lines that directly face each other.

Example 25: The integrated circuit device of any of the Examples above, wherein the top and bottom conductive lines comprise gold, copper, or aluminum.

Example 26: The integrated circuit device of Example 1, wherein the core layer is electrically floating and comprises a ferromagnetic material.

Example 27: An integrated circuit device comprising:
a substrate having a main surface;
a core layer disposed over the substrate; and
a lithographically patterned primary coil, the primary coil comprising one or more windings wound around a winding axis parallel to the main surface, wherein each of the windings comprises:
a top conductive line arranged over the core layer, wherein an acute angle between a negatively sloped side surface and the top surface of the top conductive line is less than 75 degrees,
a bottom conductive line arranged under the core layer, wherein an acute angle between a positively sloped side surface and the bottom surface of the bottom conductive line is less than 75 degrees,
a first conductive via extended along a vertical axis perpendicular to the main surface and electrically connecting the top and the bottom conductive lines, and
a second conductive via extended along the vertical axis and electrically connecting the top or the bottom conductive lines to a conductive line of another winding of the primary coil.

Example 28: The integrated circuit device of Example 27, wherein the acute angle between the negatively sloped side surface and the top surface of the top conductive line, and the positively sloped side surface and the bottom surface of the bottom conductive line, are less than 70 degrees.

Example 29: The integrated circuit device of Example 27, wherein a width of the top conductive line along a lateral axis parallel to the main surface, decreases from a top surface to a bottom surface of the top conductive line along a vertical axis perpendicular to the main surface.

Example 30: The integrated circuit device of Example 29, wherein a width of the bottom conductive line along a lateral axis parallel to the main surface, increases from a top surface to a bottom surface of the bottom conductive line along the vertical axis.

Example 31: The integrated circuit device of any of Examples 27-30, wherein the top and bottom conductive lines comprise gold, copper, or aluminum.

Example 32: The integrated circuit device of Example 27, wherein the bottom conductive line, and the top conductive line are formed at a bottom metallization layer, and an upper metallization layer, respectively, wherein the top, and bottom metallization layers are distinct metallization layers of the integrated circuit each comprising at least a metallized portion formed by electroplating and an intermetal dielectric portion embedding the metallized portion.

Example 33: The integrated circuit device of Example 32, wherein the bottom conductive line and the top conductive line are electroplated lines comprising a seed layer and an electroplated layer.

Example 34: The integrated circuit device of Example 32, wherein the first conductive via comprises at least a lower segment electroplated on the bottom conductive line and an upper segment on which the top conductive line is electroplated.

Example 35: An integrated circuit device comprising:
a substrate having a main surface;
a core layer disposed over the substrate; and
a lithographically patterned primary coil, the primary coil comprising one or more windings wound around a winding axis parallel to the main surface, wherein each of the windings comprises:
a top conductive line arranged over the core layer, wherein a side surface of the top conductive line comprises a stepped portion having one or more side surface sections, and wherein individual ones of the side surface sections comprise a flat surface substantially perpendicular to main surface,
a bottom conductive line arranged under the core layer,
a first conductive via extended along a vertical axis perpendicular to the main surface and electrically connecting the top and bottom conductive lines, and a second conductive via extended along the vertical axis electrically connecting one but not the other of the top and bottom conductive lines to a conductive line of another winding of the primary coil.

Example 36: The integrated circuit device of Example 35, wherein a side surface of the bottom conductive line comprises a stepped portion having one or more side surface sections, and wherein an individual side surface section is a flat surface substantially perpendicular to main surface Example 37: The integrated circuit device of Example 35, wherein the top and bottom conductive lines comprise gold, copper, or aluminum.

Example 38: The integrated circuit device of Example 35, wherein the bottom conductive line, and the top conductive line are formed at a bottom metallization layer, and an upper metallization layer, respectively, wherein the top, and bottom metallization layers are distinct metallization layers of the integrated circuit each comprising at least a metallized portion formed by electroplating and an intermetal dielectric portion embedding the metallized portion.

Example 39: The integrated circuit device of Example 35, wherein the bottom conductive line and the top conductive line are electroplated lines comprising a seed layer and an electroplated layer.

Example 40: An integrated circuit device, comprising:
a semiconductor substrate having a main surface;
a primary coil and a secondary coil each wound around a winding axis parallel to the main surface, wherein the windings of the primary coil and the secondary coil are interlaced with each other such that the windings of the primary coil alternate with the windings of the secondary coil along the winding axis,
wherein each of the windings of the primary coil and the secondary coil comprises lithographically patterned and electroplated top and bottom conductive lines connected by a vertical conductive via connecting the top and bottom conductive lines,
wherein laterally adjacent ones of the top conductive lines of the primary coil and the secondary coil have side surfaces facing each other, and wherein laterally adjacent ones of the bottom conductive lines of the primary coil and the secondary coil have side surfaces facing each other,
wherein at least some of the side surfaces comprise an electric field reducing structure selected from the group consisting of a rounded side surface, a sloped side surface and stepped side surface.

Example 41: The integrated circuit device of Example 40, wherein side surfaces of at least one top conductive line of the primary coil and one top conductive line of the secondary coil that face each other, each comprise a convex rounded portion having a radius of curvature larger than 3 microns.

Example 42: The integrated circuit device of Example 40, wherein side surfaces of at least one bottom conductive line of the primary coil and one bottom conductive line of the secondary coil that face each other, each comprise a convex rounded portion having a radius of curvature larger than 3 microns.

Example 43: The integrated circuit device of any of Examples 41 and 42, wherein the side surfaces of at least one top conductive line of the primary coil and one top conductive line of the secondary coil that face each other, each further comprise a stepped portion having one or more flat side surface sections substantially perpendicular to main surface.

Example 44: The integrated circuit device of Example 40, wherein side surfaces of at least one top conductive line of the primary coil and one top conductive line of the secondary coil that face each other are negatively sloped side surfaces making an acute angle less than 75 degrees with the main surface.

Example 45: The integrated circuit device of Example 44, wherein side surfaces of at least one bottom conductive line of the primary coil and bottom conductive line of the secondary coil that face each other are positively sloped side surfaces making a negative acute angle less than 75 degrees with the main surface.

Example 46: A method of fabricating a conductive line, the method comprising:
forming a masking layer on a top surface of the substrate, the masking layer having a thickness along a vertical direction perpendicular to the top surface of the substrate;
forming an opening through the masking layer exposing a region on the top surface of the substrate, wherein at least a portion of a sidewall of the opening comprises a concave curved surface having a radius of curvature larger than 1 micron, and
electro plating a metal on the exposed region of top surface of the substrate.

Example 47: The method of Example 46, wherein the concave curved surface of the portion of the sidewall of the opening has a radius of curvature greater than 15% of the first thickness.

Example 48: The method of Example 46, wherein forming the opening through the masking layer comprises selecting a radiation dose during an exposure process based at least in part on a target radius of the curvature of the curved surface.

Example 49: The method of Example 46, wherein the masking layer comprises a negative photoresist.

Example 50: The method of Example 46, wherein forming the masking layer comprises forming a first masking layer on the substrate, and forming a second masking layer on the first masking layer, wherein the first and the second masking layers comprise different types of photoresist.

Example 51: The method of Example 50, wherein the first masking layer comprises a positive photoresist material, and the second masking layer comprises a negative photoresist.

Example 52: The method of any of Examples 46-51, wherein the substrate comprises a seed layer, and the top surface of the substrate comprises a top surface of the seed layer.

Example 53: The method of any of Examples 46-52, wherein the substrate is a layer in an integrated circuit device comprising a primarily coil and a secondary coil.

Example 54: A method of fabricating a conductive line, the method comprising:
forming a first masking layer on a top surface of the substrate, the first masking layer having a first thickness along a vertical direction perpendicular to the top surface of the substrate;
forming a first opening through the first masking layer exposing a region on the top surface of the substrate, the opening having a width along a lateral direction parallel to the main surface of the substrate;
plating a first metal on the first masking layer and the exposed region of the top surface of the substrate;
forming a second masking layer on the first masking layer, the second masking layer having a second thickness along a vertical direction perpendicular to the main surface of the substrate;

forming a second opening through the second masking layer exposing a region on the first metal and the first masking layer, the second opening having an maximum width along a lateral direction parallel to the main surface of the substrate, wherein at least one sidewall of the second opening comprises a concave curved surface having a radius of curvature larger 1 micron; and plating a second metal on the second masking layer, and the exposed region of the first metal and the first masking layer.

Example 55: The method of Example 54, wherein the at least one sidewall of the second opening comprises a concave curved surface having a radius of curvature larger than 15% of the second thickness.

Example 56: The method of Example 54, wherein the maximum width of the second masking layer is larger than the width of the first masking layer.

Example 57: The method of Example 54, wherein the thickness of the first masking layer is substantially equal to half of the difference between the maximum width of the second masking layer and the width of the first masking layer.

Example 58: The method of Example 54, wherein forming the second opening through the second masking layer comprises selecting a radiation dose during an exposure process based at least in part on a target radius of the curvature of the curved surface.

Example 59: The method of Example 54, wherein the first or second masking layer comprise a negative photoresist.

Example 60: The method of Example 54, wherein forming the second masking layer comprises forming a bottom masking layer on the first masking layer, and forming a top masking layer on the bottom masking layer, wherein the first and the second masking layers comprise different types of photoresist.

Example 61: The method of Example 60, wherein the bottom masking layer comprises a positive photoresist material, and the top masking layer comprises a negative photoresist.

Example 62: The method of any of Examples 54-61, wherein the substrate comprises a seed layer, and the top surface of the substrate comprises a top surface of the seed layer.

Example 63: The method of any of Examples 54-62, wherein the substrate is a layer in an integrated circuit device comprising a primarily coil and a secondary coil.

Terminology

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number, respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or whether these features, elements and/or states are included or are to be performed in any particular embodiment.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The various features and processes described above may be implemented independently of one another, or may be combined in various ways. All possible combinations and subcombinations of features of this disclosure are intended to fall within the scope of this disclosure.

What is claimed is:

1. An integrated circuit device comprising:
   a substrate having a main surface;
   a core layer disposed over the substrate; and
   a lithographically patterned primary coil, the primary coil comprising one or more windings wound around a winding axis parallel to the main surface, wherein each of the windings comprises:
   a top conductive line arranged over the core layer, the top conductive line having a first thickness along a vertical axis perpendicular to the main surface, wherein a cross-section of the top conductive line in a plane parallel to the winding axis and perpendicular to the main surface comprises a rounded convex portion of a side surface of the top conductive line, the rounded convex portion having a radius of curvature larger than 1 micron,
   a bottom conductive line arranged under the core layer, the bottom conductive line having a second thickness along the vertical axis, wherein a cross-section of the bottom conductive line in the plane comprises a rounded convex portion of a side surface of the bottom conductive line, the rounded convex portion having a radius of curvature larger than 1 micron,
   a first conductive via extended along the vertical axis electrically connecting the top and bottom conductive lines, and
   a second conductive via extended along the vertical axis electrically connecting one but not the other of the top and bottom conductive lines to a conductive line of another winding of the primary coil.

2. The integrated circuit device of claim 1, wherein the rounded convex portion of the side surface of the top conductive line has a radius of curvature exceeding 15% of the first thickness.

3. The integrated circuit device of claim 1, wherein the bottom conductive line and the top conductive line are formed at a bottom metallization layer and an upper metallization layer, respectively, wherein the upper and bottom metallization layers are distinct metallization layers of the integrated circuit device each comprising at least a metallized portion formed by electroplating and an intermetal dielectric portion embedding the metallized portion.

4. The integrated circuit device of claim 3, wherein the first conductive via comprises at least a lower segment electroplated on the bottom conductive line and an upper segment on which the top conductive line is electroplated.

5. The integrated circuit device of claim 1, wherein the side surface of top conductive line further comprises a stepped portion having one or more side surface sections, and wherein an individual side surface section is a flat surface substantially perpendicular to the main surface.

6. The integrated circuit device of claim 5, wherein the top conductive line further comprises a top vertical section having a third thickness along the vertical axis and a bottom vertical section having a fourth thickness along the vertical axis, the top vertical section comprising the rounded convex portion of the side surface and the bottom vertical section comprising the stepped portion of the side surface, and wherein an average width of the top vertical section is larger than a width of the bottom vertical section.

7. The integrated circuit device of claim 6, wherein the fourth thickness of the bottom vertical section is equal to half of a difference between the width of the bottom vertical section and a width of the top vertical section at an interface between the top vertical section and the bottom vertical section.

8. The integrated circuit device of claim 1, wherein the radius of curvature of the rounded convex portion of the side surface of one or both of the top and bottom conductive lines is greater than 3 microns.

9. The integrated circuit device of claim 1, further comprising a lithographically patterned secondary coil, the secondary coil comprising:
one or more windings wound around the winding axis, wherein each of the windings comprises:
a second top conductive line arranged over the core layer, the second top conductive line having a third thickness along the vertical axis, wherein a cross-section of the second top conductive line in the plane comprises a rounded convex portion of a side surface of the second top conductive line, the rounded convex portion having a radius of curvature larger than 1 micron,
a second bottom conductive line arranged under the core layer, the second bottom conductive line having a fourth thickness along the vertical axis, wherein a cross-section of the second bottom conductive line in the plane comprises a rounded convex portion of a side surface of the second bottom conductive line, the rounded convex portion having a radius of curvature larger than 1 micron,
a third first conductive via extended along the vertical axis electrically connecting the second top and second bottom conductive lines, and
a fourth conductive via extended along the vertical axis electrically connecting one but not the other of the second top and second bottom conductive lines to a conductive line of another winding of the secondary coil,
wherein the primary coil and the secondary coil are magnetically coupled.

10. The integrated circuit device of claim 9, wherein the rounded convex portion of the side surface of the second top conductive line has a radius of curvature exceeding 15% of the third thickness.

11. The integrated circuit device of claim 9, wherein the primary coil and the secondary coil are interlaced with each other and wound around the winding axis such that the windings of the primary coil alternate with the windings of the secondary coil along the winding axis.

12. The integrated circuit device of claim 9, wherein the top conductive line and the second top conductive line are lithographically co-patterned at a top metallization level.

13. The integrated circuit device of claim 9, wherein the rounded convex portions of the bottom and second bottom conductive lines are formed on one or both of top and bottom corner portions of the side surfaces of the bottom and second bottom conductive lines that directly face each other.

14. An integrated circuit device comprising:
a substrate having a main surface;
a core layer disposed over the substrate; and
a lithographically patterned primary coil, the primary coil comprising one or more windings wound around a winding axis parallel to the main surface, wherein each of the windings comprises:
a top conductive line arranged over the core layer, wherein an acute angle between a negatively sloped side surface and a top surface of the top conductive line is less than 75 degrees,
a bottom conductive line arranged under the core layer, wherein an acute angle between a positively sloped side surface and a bottom surface of the bottom conductive line is less than 75 degrees,
a first conductive via extended along a vertical axis perpendicular to the main surface and electrically connecting the top and the bottom conductive lines, and
a second conductive via extended along the vertical axis and electrically connecting the top or the bottom conductive lines to a conductive line of another winding of the primary coil.

15. The integrated circuit device of claim 14, wherein the acute angle between the negatively sloped side surface and the top surface of the top conductive line, and the acute angle between the positively sloped side surface and the bottom surface of the bottom conductive line, are less than 70 degrees.

16. The integrated circuit device of claim 14, wherein a width of the top conductive line, along a lateral axis parallel to the main surface, decreases from the top surface to a bottom surface of the top conductive line along a vertical axis perpendicular to the main surface.

17. The integrated circuit device of claim 16, wherein a width of the bottom conductive line along a lateral axis parallel to the main surface, increases from a top surface to the bottom surface of the bottom conductive line along the vertical axis.

18. The integrated circuit device of claim 14, wherein the bottom conductive line and the top conductive line are formed at a bottom metallization layer and an upper metallization layer, respectively, wherein the upper and bottom metallization layers are distinct metallization layers of the integrated circuit device each comprising at least a metallized portion formed by electroplating and an intermetal dielectric portion embedding the metallized portion.

* * * * *